(12) United States Patent
Gering

(10) Patent No.: US 9,625,532 B2
(45) Date of Patent: Apr. 18, 2017

(54) METHOD, SYSTEM, AND COMPUTER-READABLE MEDIUM FOR DETERMINING PERFORMANCE CHARACTERISTICS OF AN OBJECT UNDERGOING ONE OR MORE ARBITRARY AGING CONDITIONS

(75) Inventor: Kevin L. Gering, Idaho Falls, ID (US)

(73) Assignee: BATTELLE ENERGY ALLIANCE, LLC, Idaho Falls, ID (US)

( * ) Notice: Subject to any disclaimer, the term of this patent is extended or adjusted under 35 U.S.C. 154(b) by 951 days.

(21) Appl. No.: 13/598,290

(22) Filed: Aug. 29, 2012

(65) Prior Publication Data
US 2013/0090900 A1    Apr. 11, 2013

Related U.S. Application Data

(60) Provisional application No. 61/545,412, filed on Oct. 10, 2011.

(51) Int. Cl.
*G06F 17/50* (2006.01)
*G06F 7/60* (2006.01)
(Continued)

(52) U.S. Cl.
CPC ..... *G01R 31/3651* (2013.01); *G01R 31/3679* (2013.01)

(58) Field of Classification Search
CPC ....... G06F 17/5009; G06F 17/50; G06F 17/18
(Continued)

(56) References Cited

U.S. PATENT DOCUMENTS 5,321,626 A * 6/1994 Palladino ................... 702/63
5,872,443 A    2/1999 Williamson
(Continued)

FOREIGN PATENT DOCUMENTS

WO    2008/154956 A1    12/2008
WO    2009/091407 A2    7/2009

OTHER PUBLICATIONS

Jon P. Christophersen et al, Idaho National Laboratory Transportation Technology Department, "Advanced Technology Development Program for Lithium-Ion Batteries: Gen 2 Performance Evaluation Final Report", Jul. 2006.*

(Continued)

*Primary Examiner* — David Silver
(74) *Attorney, Agent, or Firm* — TraskBritt

(57) ABSTRACT

A method, system, and computer-readable medium are described for characterizing performance loss of an object undergoing an arbitrary aging condition. Baseline aging data may be collected from the object for at least one known baseline aging condition over time, determining baseline multiple sigmoid model parameters from the baseline data, and performance loss of the object may be determined over time through multiple sigmoid model parameters associated with the object undergoing the arbitrary aging condition using a differential deviation-from-baseline approach from the baseline multiple sigmoid model parameters. The system may include an object, monitoring hardware configured to sample performance characteristics of the object, and a processor coupled to the monitoring hardware. The processor is configured to determine performance loss for the arbitrary aging condition from a comparison of the performance characteristics of the object deviating from baseline performance characteristics associated with a baseline aging condition.

29 Claims, 22 Drawing Sheets

(51) Int. Cl.
 *G06F 17/10* (2006.01)
 *G01R 31/36* (2006.01)
(58) Field of Classification Search
 USPC .............................................. 703/13, 18, 2
 See application file for complete search history.

(56) References Cited

U.S. PATENT DOCUMENTS

| | | | |
|---|---|---|---|
| 6,480,003 | B1 | 11/2002 | Ugaji et al. |
| 7,147,071 | B2 | 12/2006 | Gering et al. |
| 7,315,789 | B2 | 1/2008 | Plett |
| 7,400,149 | B2 | 7/2008 | Köster et al. |
| 7,582,387 | B2 | 9/2009 | Howard et al. |
| 8,191,618 | B2 | 6/2012 | Gering et al. |
| 2001/0009371 | A1 | 7/2001 | Podrazhansky |
| 2001/0022518 | A1 | 9/2001 | Asakura et al. |
| 2003/0022032 | A1 | 1/2003 | Miller et al. |
| 2004/0220758 | A1 | 11/2004 | Barsoukov et al. |
| 2006/0181953 | A1 | 8/2006 | Rotenberg et al. |
| 2006/0186890 | A1 | 8/2006 | Iwane et al. |
| 2006/0284617 | A1 | 12/2006 | Kozlowski et al. |
| 2006/0284619 | A1 | 12/2006 | Quint et al. |
| 2007/0090844 | A1 | 4/2007 | Klang |
| 2007/0112475 | A1 | 5/2007 | Koebler et al. |
| 2007/0252601 | A1 | 11/2007 | Satoh et al. |
| 2008/0177345 | A1* | 7/2008 | Schmidt et al. ............... 607/29 |
| 2008/0315839 | A1* | 12/2008 | Hermann .................... 320/136 |
| 2009/0037145 | A1* | 2/2009 | Suzuki et al. ............... 702/183 |
| 2009/0106970 | A1 | 4/2009 | Fan et al. |
| 2009/0157369 | A1 | 6/2009 | Li et al. |
| 2010/0021776 | A1 | 1/2010 | Dougherty et al. |
| 2010/0023307 | A1 | 1/2010 | Lee et al. |
| 2010/0033132 | A1 | 2/2010 | Nishi et al. |
| 2011/0054816 | A1 | 3/2011 | Prada et al. |
| 2011/0060565 | A1 | 3/2011 | Sciarretta et al. |
| 2011/0077880 | A1 | 3/2011 | Gering |
| 2011/0264381 | A1 | 10/2011 | Gering |
| 2011/0288797 | A1 | 11/2011 | Schmidt |
| 2011/0301931 | A1 | 12/2011 | Gering |
| 2013/0009602 | A1* | 1/2013 | Hoff et al. ................... 320/126 |

OTHER PUBLICATIONS

Pankaj et al., "Capacity Fade Mechanisms and Side Reactions in Lithium-Ion Batteries," J. Electrochem. Soc., Oct. 1998, vol. 145, Issue 10, pp. 3647-3667.

Parthasarathy et al., "Mathematical modeling of lithium-ion and nickel battery systems," Journal of Power Sources, vol. 110, Issue 2, Aug. 22, 2002, pp. 267-284, ISSN 0378-7753.

PCT International Search Report and Written Opinion of the International Searching Authority for PCT/US2012/059394, dated Jun. 20, 2013, 11 pages.

Christophersen et al., "Advanced Technology Development Program for Lithium-Ion Batteries: Gen 2 Performance Evaluation Final Report," Idaho National Laboratory, Jul. 2006. [retrieved on 2010-20-21] Retrieved from the internet: <URL: http://www.inl.gov/technical/publications/Documents/3395031.pdf>.

Ding et al., "Diminution of Supercooling of Electrolytes by Carbon Particles," J. Electrochem. Soc., vol. 146 (11), pp. 3974-3980, (1999).

Gering, Kevin L., "Kinetic Performance of Li-ion cells during Short Pulses, with Emphasis on Low Temperature Behavior," Idaho National Laboratory, 2008, Retrieved from the Internet: <URL: http://web.archive.org/web/20081207132503/http://www.electrochem.org/meetings/scheduler/abstracts/214/1288.pdf> p. 1.

Gering et al. "Evaluation of Performance Change in Lithium-ion Cells Using a Multiple Sigmoid Model", 2003, The Electrochemical Society, Inc., 1 page.

PCT International Search Report and Written Opinion of the International Searching Authority for PCT/US2010/048708, dated Nov. 9, 2010, 9 pages.

PCT International Search Report and Written Opinion of the International Searching Authority for PCT/US2011/030862, dated Jun. 21, 2011, 12 pages.

PCT International Search Report and Written Opinion of the International Searching Authority for PCT/US2011/038078, dated Sep. 9, 2011, 9 pages.

Ratnakumar et al., "Lithium-Ion Rechargeable Batteries on Mars Rover," 2nd International Energy Conversion Engineering Conference, 2004, Retrieved from the Internet: <URL: http://trs-new.jpl.nasa.gov/dspace/handle/2014/38818> pp. 1-8.

Santana et al., "Electrochemical characterization and oxygen evolution at a heavily boron doped diamond electrode," Electrochem. Acta, vol. 50, pp. 2017-2027 (2005).

Wang et al., "Feasibility study for reductive destruction of carbon tetrachloride using bare and polymer coated nickel electrodes," J. Appl. Electrochemistry, vol. 35, pp. 243-248 (2005).

Domenico et al., "Lithium-Ion battery state of charge estimation with a Kalman Filter based on a electrochemical model," 2008, IEEE, pp. 702-707.

* cited by examiner

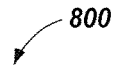

60% SOC:

| For 25°C: | For 35°C: | For 45°C: | For 55°C: |
|---|---|---|---|
| a = 0.07 | a = 0.2062 | a = 0.2914 | a = 0.4472 |
| b = 0.6 | b = 0.6 | b = 0.6 | b = 0.6 |
| c = 0.0241 | c = 0.0259 | c = 0.0299 | c = 0.0343 |
| d = 2.0 | d = 2.0 | d = 2.0 | d = 2.0 |
| M = 7.0 | M = 11.0 | M = 13.0 | M = 19.0 |
| N = 42.07 | N = 45.0 | N = 54.0 | N = 64.8 |
| ($R^2$ = 0.9984) | ($R^2$ = 0.9718) | ($R^2$ = 0.9921) | ($R^2$ = 0.9981) |
| report 3 | report 9 | report 15 | report 14 |

80% SOC:

| For 25°C: | For 35°C: | For 45°C: | For 55°C: |
|---|---|---|---|
| a = 0.0745 | a = 0.0540 | a = 0.0600 | a = 0.1065 |
| b = 0.6 | b = 0.6 | b = 0.6 | b = 0.6 |
| c = 0.0230 | c = 0.0267 | c = 0.0354 | c = 0.0627 |
| d = 2.0 | d = 2.0 | d = 2.0 | d = 2.0 |
| M = 10.0 | M = 27.0 | M = 33.0 | M = 48.0 |
| N = 52.2 | N = 41.0 | N = 42.0 | N = 38.0 |
| ($R^2$ = 0.9983) | ($R^2$ = 0.9779) | ($R^2$ = 0.9959) | ($R^2$ = 0.9956) |
| report 35 | report 36 | report 37 | report 39 |

100% SOC:

| For 25°C: | For 35°C: | For 45°C: | For 55°C: |
|---|---|---|---|
| a = 0.0270 | a = 0.0379 | a = 0.0499 | a = 0.0957 |
| b = 0.6 | b = 0.6 | b = 0.6 | b = 0.6 |
| c = 0.0332 | c = 0.0399 | c = 0.0742 | c = 0.1465 |
| d = 2.0 | d = 2.0 | d = 2.0 | d = 2.0 |
| M = 36.76 | M = 43.0 | M = 58.0 | M = 71.23 |
| N = 33.06 | N = 33.52 | N = 23.51 | N = 12.77 |
| ($R^2$ = 0.9987) | ($R^2$ = 0.9979) | ($R^2$ = 0.9987) | ($R^2$ = 0.9992) |
| report 32 | report 27 | report 22 | report 15 |

*FIG. 8*

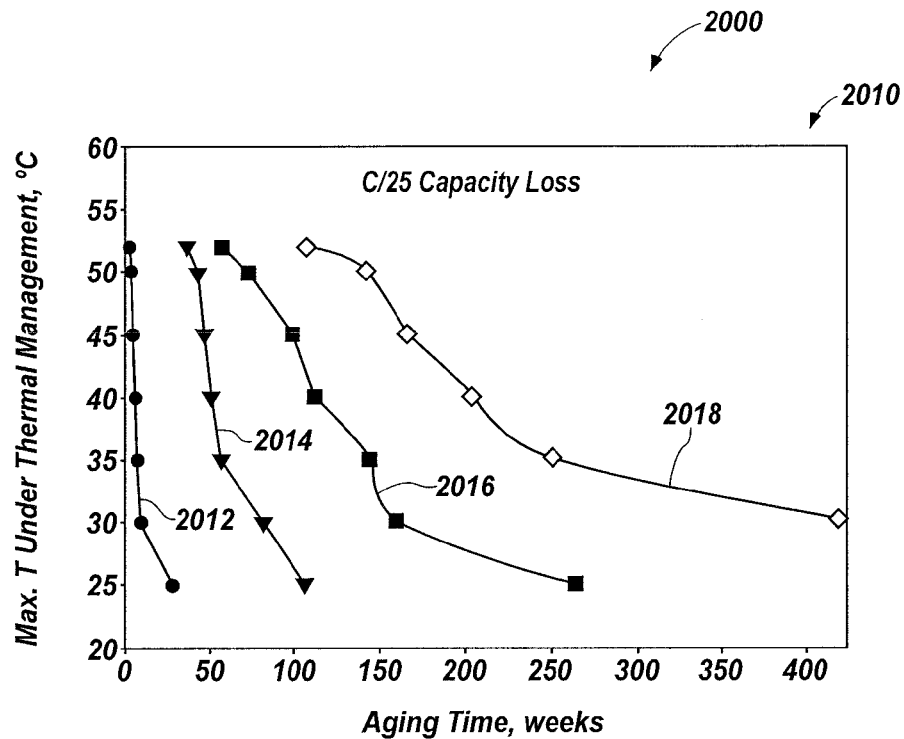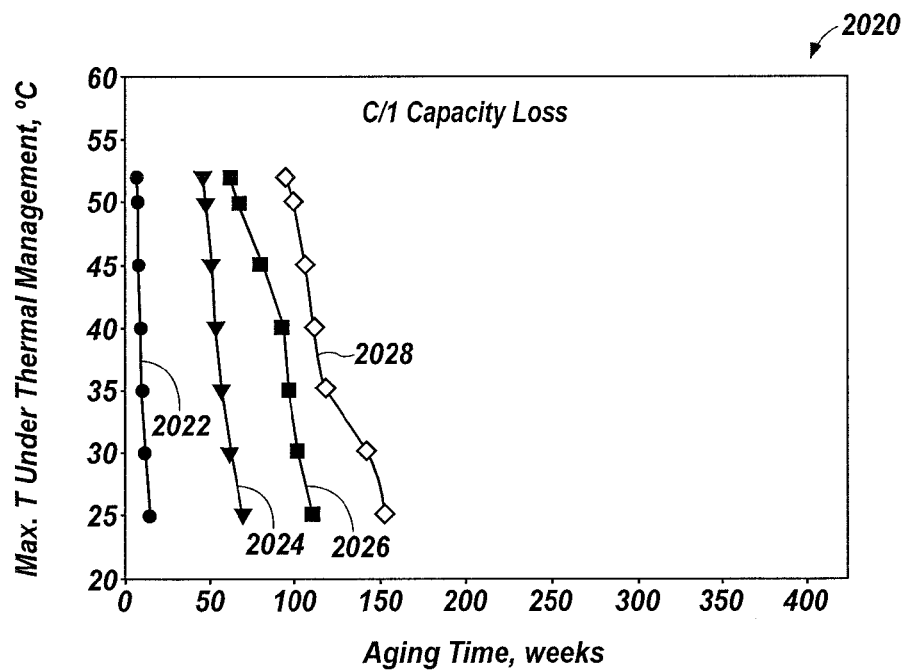
FIG. 20

METHOD, SYSTEM, AND COMPUTER-READABLE MEDIUM FOR DETERMINING PERFORMANCE CHARACTERISTICS OF AN OBJECT UNDERGOING ONE OR MORE ARBITRARY AGING CONDITIONS

CROSS-REFERENCE TO RELATED APPLICATIONS

This application claims the benefit of U.S. Provisional Patent Application Ser. No. 61/545,412, filed Oct. 10, 2011, entitled "Method, System, and Computer-Readable Medium for Estimating a Predicted Arbitrary Aging Condition of an Object," with its accompanying appendices, the disclosure of each of which is incorporated herein by this reference in its entirety.

This application is also related to U.S. patent application Ser. No. 12/571,253, entitled "Systems, Methods and Computer Readable Media for Estimating Capacity Fade in Rechargeable Electrochemical Cells," filed on Sep. 30, 2009; U.S. patent application Ser. No. 12/765,384, entitled "Systems, Methods and Computer-Readable Media to Model Kinetic Performance of Rechargeable Electrochemical Devices," filed on Apr. 22, 2010; and U.S. patent application Ser. No. 12/793,224, entitled "Systems, Methods and Computer Readable Media for Modeling Cell Performance Fade of Rechargeable Electrochemical Devices," filed on Jun. 3, 2010. The disclosure of each of the foregoing documents is hereby incorporated herein by reference in its entirety.

GOVERNMENT RIGHTS

This invention was made with government support under Contract Number DE-AC07-05ID14517 awarded by the United States Department of Energy. The government has certain rights in the invention.

TECHNICAL FIELD

Embodiments of the present disclosure relate to analyzing devices and systems that may undergo an aging process, and more particularly, to a method, an apparatus, and a computer-readable medium for estimating aging consequences of one or more arbitrary conditions for such a device or system.

BACKGROUND

A battery converts stored chemical energy to electrical energy, which may be conveyed as a voltage potential. As a battery ages, the storage capacity and conductance of the battery may decrease (i.e., fade) between a Beginning Of Life (BOL) and an End Of Life (EOL). Therefore, observations of battery parameters such as cycle rate (magnitude of current), cumulative cycling time, and storage capacity may be helpful in determining an overall State Of Health (SOH) of a battery over its service life.

Over the service life of the battery, certain performance characteristics may experience losses, such as capacity fade, power loss, among others. Such performance losses may be caused by degradation mechanisms, which may be initiated and accelerated by aging conditions that are imposed on the battery. Aging conditions may include environmental factors, characteristics of the battery itself, as well as usage conditions for the battery.

The inventor has appreciated a need for systems and methods that provide a modeling capability that more accurately determines, tracks, and diagnoses performance losses due to degradation mechanisms, and predicts arbitrary aging conditions of an object, such as electrochemical cells and batteries formed therefrom.

BRIEF DESCRIPTION OF THE DRAWINGS

FIG. 8 is a summary of MSM parameters for regression of ALT power loss data;

FIG. 20 is a set of graphs that shows capacity loss curves over time as a result of varying maximum temperature ($T_{MAX}$) of the battery;

DETAILED DESCRIPTION

Figure 1:
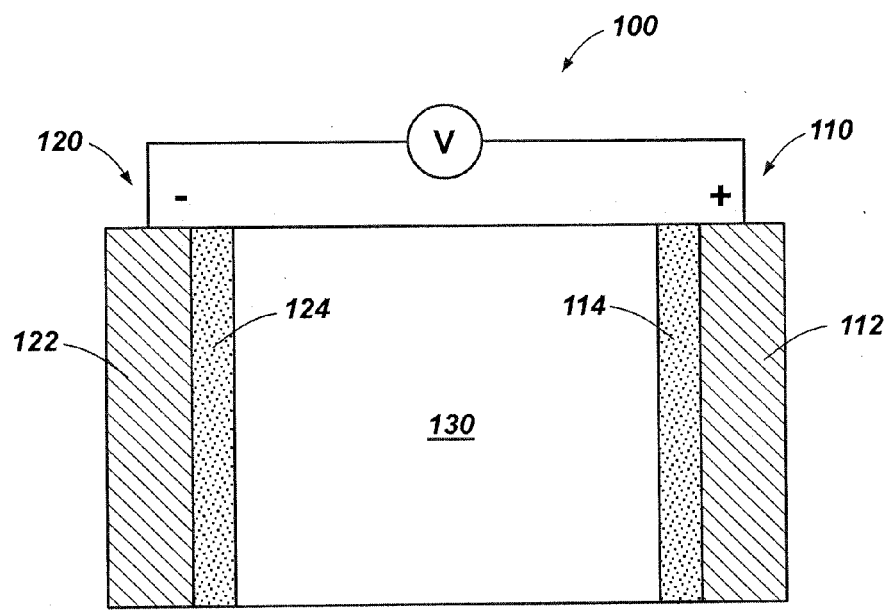
FIG. 1 is a simplified diagram of a rechargeable lithium-ion electrochemical cell.

In the following detailed description, reference is made to the accompanying drawings which form a part hereof and, in which are shown by way of illustration, specific embodiments of the disclosure that may be practiced. These embodiments are described in sufficient detail to enable those of ordinary skill in the art to practice the invention, and it is to be understood that other embodiments may be utilized, and that structural, logical, and electrical changes may be made within the scope of the disclosure.

In this description, specific implementations are shown and described only as examples and should not be construed as the only way to implement the present disclosure unless specified otherwise herein. It will be readily apparent to one of ordinary skill in the art that the various embodiments of the present disclosure may be practiced by numerous other partitioning solutions. For the most part, details concerning timing considerations and the like have been omitted where such details are not necessary to obtain a complete understanding of the present disclosure and are within the abilities of persons of ordinary skill in the relevant art.

Referring in general to the following description and accompanying drawings, various embodiments of the present disclosure are illustrated to show its structure and method of operation. Common elements of the illustrated embodiments may be designated with similar reference numerals. It should be understood that the figures presented are not meant to be illustrative of actual views of any particular portion of the actual structure or method, but are merely idealized representations employed to more clearly and fully depict the present invention defined by the claims below.

It should be appreciated and understood that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal for clarity of presentation and description. It will be understood by a person of ordinary skill in the art that the signal may represent a bus of signals, wherein the bus may have a variety of bit widths and the embodiments of the present disclosure may be implemented on any number of data signals including a single data signal.

It should be further appreciated and understood that the various illustrative logical blocks, modules, circuits, and algorithm acts described in connection with embodiments disclosed herein may be implemented as electronic hardware, computer software, or combinations of both. To clearly illustrate this interchangeability of hardware and software, various illustrative components, blocks, modules, circuits, and steps are described generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the embodiments of the disclosure described herein.

The various illustrative logical blocks, modules, and circuits described in connection with the embodiments disclosed herein may be implemented or performed with a general-purpose processor, a special-purpose processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A general-purpose processor may be a microprocessor, but in the alternative, the general-processor may be any conventional processor, controller, microcontroller, or state machine. A general-purpose processor may be considered a special-purpose processor while the general-purpose processor executes instructions (e.g., software code) stored on a computer-readable medium. A processor may also be implemented as a combination of computing devices, such as a combination of a DSP and a microprocessor, a plurality of microprocessors, one or more microprocessors in conjunction with a DSP core, or any other such configuration.

When executed as firmware or software, the instructions for performing the processes described herein may be stored on a computer-readable medium. A computer-readable medium includes, but is not limited to, non-transitory storage media, such as magnetic and optical storage devices such as disk drives, magnetic tape, CDs (compact discs), DVDs (digital versatile discs or digital video discs), and semiconductor devices such as RAM, DRAM, ROM, EPROM, and Flash memory.

It should be understood that any reference to an element herein using a designation such as "first," "second," and so forth does not limit the quantity or order of those elements, unless such limitation is explicitly stated. Rather, these designations may be used herein as a convenient method of distinguishing between two or more elements or instances of an element. Thus, a reference to first and second elements does not mean that only two elements may be employed there or that the first element must precede the second element in some manner. Also, unless stated otherwise a set of elements may comprise one or more elements.

An "aging condition" is a condition that is imposed upon an object that causes an adverse effect on the performance or lifespan of the object. In other words, an aging condition being imposed upon the object impacts the aging process of the object, and moves the object toward its end of life by causing performance losses in the object through degradation mechanisms of the object. Such an aging condition may include environmental aging conditions, operational aging conditions, and combinations thereof. An aging condition is denoted herein as "i." An arbitrary aging condition, denoted herein as "i*," is then a generalized statement of all aging conditions that may contribute to the overall aging of the object over a period of time. The arbitrary aging condition (i*) may include one or more aging conditions, and there may be many various and distinct arbitrary aging conditions (i*) throughout the life of an object. For purposes of this disclosure, aging condition (i) and arbitrary aging condition (i*) may be used interchangeably. The arbitrary aging condition (i*) may be include unknown aging conditions having unknown consequences. However, in many cases, the arbitrary aging condition (i*) may be include known aging conditions, the consequences of which may also be unknown. In other words, an arbitrary aging condition (i*) may include known or projected aging conditions that have unknown consequences.

Embodiments of the present disclosure may be used to predict such consequences. For example, in a real-time system, sampled performance characteristics (e.g., represented by aging data) of a battery may result through collection of data from the object undergoing an arbitrary aging condition (i*). The sampled performance characteristics may be compared with baseline performance characteristics from a battery having a similar configuration. In a stand-alone system, a computer simulation may generate simulated performance characteristics for comparison with the baseline performance characteristics. A "battery" includes at least one cell that produces electric energy. In some embodiments, a battery may include rechargeable cells, fuel cells, and other cells that use an electrochemical reaction to produce electric energy, and combinations thereof. In addition, although batteries having lithium ion cells are primarily discussed herein, other types of batteries may be used and analyzed according to embodiments of the present disclosure.

Aging conditions (i) may include environmental conditions, such as ambient temperature. Aging conditions (i) may also be characteristics relating to the use, condition, or other characteristic of the object itself. For batteries, aging conditions (i) may include temperature, the state of charge (SOC) of the battery (i.e., the actual charge of the battery as a percentage of its full charge), and the usage cycle (i.e., electrochemically charging and discharging the battery and the percentage of time at rest). Active cycling of a battery may be referred to herein as a "cycle-life condition," in that a substantial portion of the battery's life experiences active cycling. Non-active cycling of a battery is referred to herein as a "calendar-life condition," in that a substantial portion of the battery's life is spent in a non-active (e.g., rest) state. The aging conditions (i) may, at times, be variable over time. For example, a battery in a vehicle may experience seasonal changes in temperature over the course of the year. In some situations, a combination of a plurality of aging conditions (i) (e.g., a variable combination of usage and rest periods as well as seasonal changes) may be experienced by an object.

In view of the various aging conditions (i) that may be experienced by an object, at different times, and in different orders, defining an arbitrary aging condition (i*) over battery life may become complicated, if not unclear, and may be related to the path dependence of the aging process. Path dependence of the aging process of the object relates to the performance loss that is dependent upon specific aging conditions (i) and their sequence over the life of the object. Path dependence will be discussed further below with respect to FIG. 3.

A "degradation mechanism" is a characteristic of the object that affects the aging of the object when an aging condition is present. Degradation mechanisms may be denoted herein as "j." Degradation mechanisms (j) may exhibit rates that vary over time due to prevailing aging conditions (i) along the timeline of the system or object. The degradation mechanisms (j) may be independent from each other, interdependent, or combinations thereof. For batteries, a reaction pathway may be a degradation mechanism (j), which may include the consumption of lithium over the life of the battery. For example, the free ionic lithium within a battery may be prone to side reactions as the battery ages. Another degradation mechanism (j) in a battery may be the loss of active sites, which may become corrupted at the battery ages. The combination of an aging condition with a degradation mechanism (j) may contribute to performance losses, which in some cases may be irreversible. Performance losses of a battery may include metrics such as capacity fade (i.e., loss), conductance loss (inverse of impedance), power loss, among others. A "loss" may be defined in terms of fractional or percent reduction in each metric from a reference value.

Although the context of embodiments of the present disclosure is described as generally applying to a battery, and in particular, a lithium-ion battery, the present disclosure is not to be viewed as so limited. For example, it is contemplated that the methodology described herein may be used in estimating aging consequences of arbitrary aging conditions (i*) for objects (even those outside the field of electronics or electrochemistry).

An "object," as defined herein, includes devices, systems, living organisms, and other items that include an aging profile of interest, according to its own set of degradation mechanisms that are responsive to one or more known aging conditions (i). One or more known aging conditions (i) may be used to generate baseline aging characteristics, from which unknown consequences to arbitrary aging conditions (i*) may be estimated. For example, embodiments of the present disclosure may be employed to estimate aging consequences of arbitrary aging conditions (i*) for batteries, natural terrestrial systems, machines, biological systems, human health conditions, etc., that may undergo aging under defined degradation mechanisms (j).

1. Hardware Environment

FIG. 1 is a simplified diagram of a rechargeable lithium-ion electrochemical cell 100. The rechargeable lithium-ion electrochemical cell 100 includes three primary functional components: an anode 110, a cathode 120, and electrolyte 130. The anode 110 and the cathode 120 may be referred to herein as electrodes 110, 120. The rechargeable lithium-ion electrochemical cell 100 may also include a separator (e.g., a polymeric microporous material, not shown) provided between the cathode 120 and the anode 110. A battery may include one or more rechargeable lithium-ion electrochemical cells 100 to form a current and voltage capability based on the application for which the battery is used.

The anode 110 includes a positive current collector 112 and a positive active material 114. Thus, the anode 110 may be a positive electrode. The cathode 120 includes a negative current collector 122 and a negative active material 124. Thus, the cathode 120 may be a negative electrode. The positive active material 114 and the negative active material 124 may be referred to collectively as active materials 114, 124. Both the positive active material 114 and the negative active material 124 may be materials into which and from which lithium ions can migrate. The movement of lithium ions into the active materials 114, 124 is often referred to as intercalation or insertion, and the movement of lithium ions out of the active materials 114, 124 is referred to as deintercalation or extraction.

The negative active material 124 may be a carbonaceous material (e.g., graphite). The positive active material 114 may be a material, such as, for example, lithium cobalt oxide, lithium iron phosphate, or lithium manganese oxide. The positive current collector 112 and negative current collector 122 may be an electrically conductive material (e.g., aluminum, copper, etc.). The electrolyte 130 may be an organic electrolyte that acts as an ionic path between electrodes 110, 120.

In some embodiments, the electrodes 110, 120 may be provided as relatively flat (e.g., planar) plates, may be wrapped or wound in a spiral, or may be provided as some other configuration (e.g., an oval configuration, a folded configuration, etc.).

During charging and discharging of the rechargeable lithium-ion electrochemical cell 100, lithium ions move through the electrolyte 130 between the anode 110 and the cathode 120. For example, when the rechargeable lithium-ion electrochemical cell 100 is discharging, lithium ions flow from the cathode 120 to the anode 110. Conversely, when the rechargeable lithium-ion electrochemical cell 100 is charging, lithium ions flow from the anode 110 to the cathode 120.

A passivating layer, also referred to herein as solid electrolyte interphase (SEI), may develop between an electrode 110, 120 and the electrolyte 130 from the reductive decompositions of a small amount of organic electrolytes mostly during the first several cycles of a working cell.

Figure 2A:
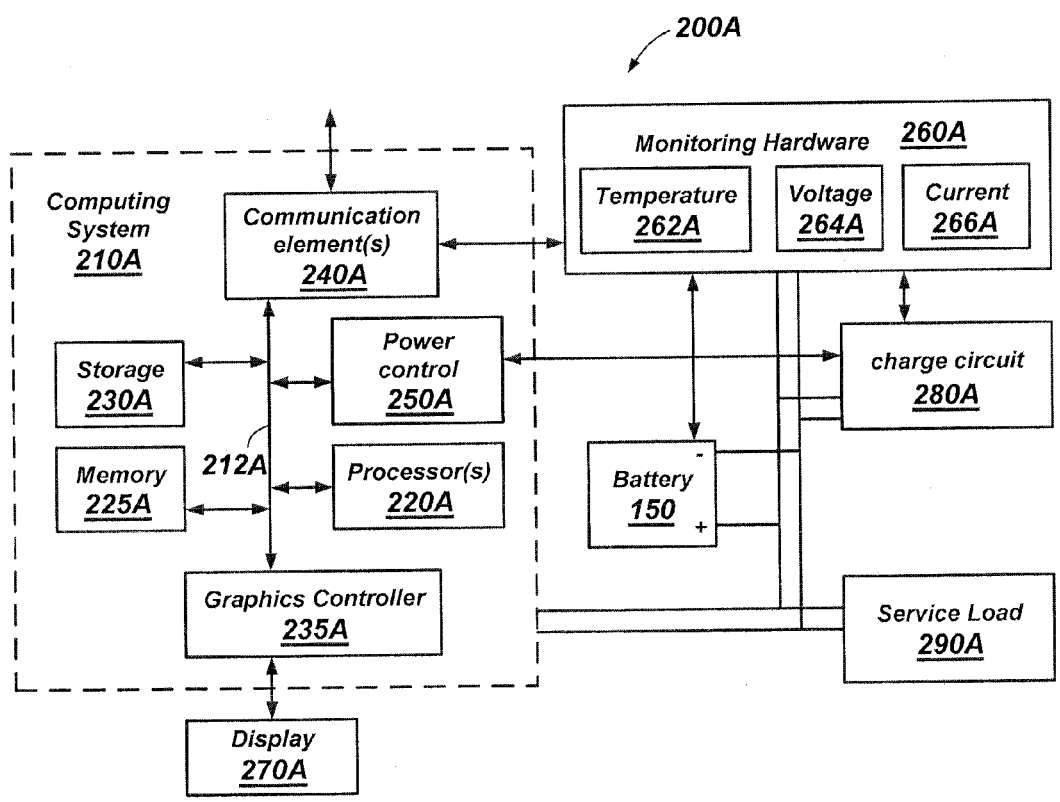
FIG. 2A is a simplified diagram of a system for analyzing, monitoring, and controlling a battery.

FIG. 2A is a simplified diagram of a system 200A for analyzing, monitoring, and controlling a battery 150. The system 200A includes a computing system 210A, monitoring hardware 260A, a display 270A, a charge circuit 280A, and a service load 290A.

The computing system 210A may be configured for executing software programs containing computing instructions, and may include one or more processors 220A, memory 225A, storage 230A, a graphics controller 235A, one or more communication elements 240A, and power control 250A coupled to a common bus 212A. The elements of the computing system 210A are illustrated, for simplicity, as communicating across the common bus 212A. However, those of ordinary skill in the art will recognize that the computing system may include many different busses for communication between the various elements.

The one or more processors 220A may be configured for executing a wide variety of operating systems and applications including the computing instructions for carrying out embodiments of the present disclosure.

The memory 225A may be used to hold computing instructions, data, and other information for performing a wide variety of tasks including performing embodiments of the present disclosure. By way of example and not limitation, the memory 225A may include Synchronous Random Access Memory (SRAM), Dynamic RAM (DRAM), Read-Only Memory (ROM), Flash memory, and the like.

The communication elements 240A may be configured for communicating with other devices or communication networks (not shown). As non-limiting examples, the communication elements 240A may interface with external hardware and software (e.g., for cell or battery charging through an external device or grid) or for downloading stored data to an external data logger, or computer. By way of example and not limitation, the communication elements 240A may include elements for communicating on wired and wireless communication media, such as for example, serial ports, parallel ports, Ethernet connections, universal serial bus (USB) connections IEEE 1394 ("firewire") connections, BLUETOOTH® wireless connections, 802.1a/b/g/n type wireless connections, and other suitable communication interfaces and protocols.

The storage 230A may be used for storing large amounts of non-volatile information for use in the computing system 210A and may be configured as one or more storage devices. By way of example and not limitation, these storage devices may but are not limited to magnetic and optical storage devices such as disk drives, magnetic tapes, CDs (compact discs), DVDs (digital versatile discs or digital video discs), and other equivalent storage devices.

By way of non-limiting example, computing instructions for performing the processes may be held on the storage 230A, transferred to the memory 225A for execution, and executed by the processor 220A. The processor 220A, when executing computing instructions configured for performing the processes, constitutes structure for performing the processes. In addition, some or all portions of the processes may be performed by hardware specifically configured for carrying out the processes.

The storage 230A and memory 225A may be coupled to the processor 220A such that the processor 220A can read information from, and write information thereto. In the alternative, the storage medium may be integral to the processor 220A. Furthermore, the processor 220A, memory 225A and storage 230A may reside, in various combinations, in an ASIC or FPGA.

The graphics controller 235A may be coupled to the processor 220A and to a display 270A, which may be configured to present information about the battery 150 and the processes described herein in the form of pictures, text, tables, graphs, and the like.

The monitoring hardware 260A may be configured for monitoring various cell characteristics, functions, and status of the battery 150. The monitoring hardware 260A may include monitors for monitoring various operating characteristics of the battery, such as a temperature monitor 262A, a voltage monitor 264A, and a current monitor 266A. The voltage monitor 264A and the current monitor 266A may be coupled to the battery 150 to monitor operational power characteristics of the battery 150. The temperature monitor 262A may be included to monitor overall temperature of the battery, temperature of individual cells in the battery, and combinations thereof. A timing monitor (not shown) may be included as monitoring hardware 260A or may be performed by the computing system 210A. The timing monitor may be configured to track cycling of the battery 150 including times associated with charging and discharging the battery 150. The monitoring hardware 260A may be controlled and queried by the computing system 210A through general purpose or dedicated communication channels from the communication elements 240A.

The charge circuit 280A may be configured to control charging and discharging of the battery 150. The charge circuit 280A may provide information related to timing and electrical power characteristics of the battery 150 to the monitoring hardware 260A. The charge circuit 280A may be controlled by the dedicated power control module 250A on the computing system 210A. In some embodiments, the computing system 210A may control the charge circuit 280A through general-purpose or dedicated communication channels from the communication elements 240A.

The service load 290A generally represents other elements (not shown) within the system 200A that may draw power from the battery 150.

Functionally, the processes described herein may be considered to be controlled by a diagnostic center software process. The software process may include test protocols defined for cell interrogation using elements for data acquisition of cell characteristics such as current, voltage, and temperature over time and charge cycling. Diagnostic analysis algorithms may be defined as discussed below. Data regression algorithms may be implemented to define and refine various models and model parameters. Software modules may be included to store data in various raw and processed forms as may be needed by other processes and a data logger may be included to collect and store a performance history of the battery 150.

Thus, the system 200A may be configured to periodically sample cell characteristics of an electrochemical cell (e.g., a battery 150) and determine electrochemical cell information from the sampled characteristics. From the electrochemical cell information degradation characteristics of the battery 150 may be determined and incorporated into one or more sigmoid expressions, which may be combined to form a multiple-sigmoid model. As will be explained below, some of the degradation characteristics for lithium-ion cell capacity may include loss of active host sites, loss of free lithium population, reversible losses, and irreversible losses.

Figure 2B:
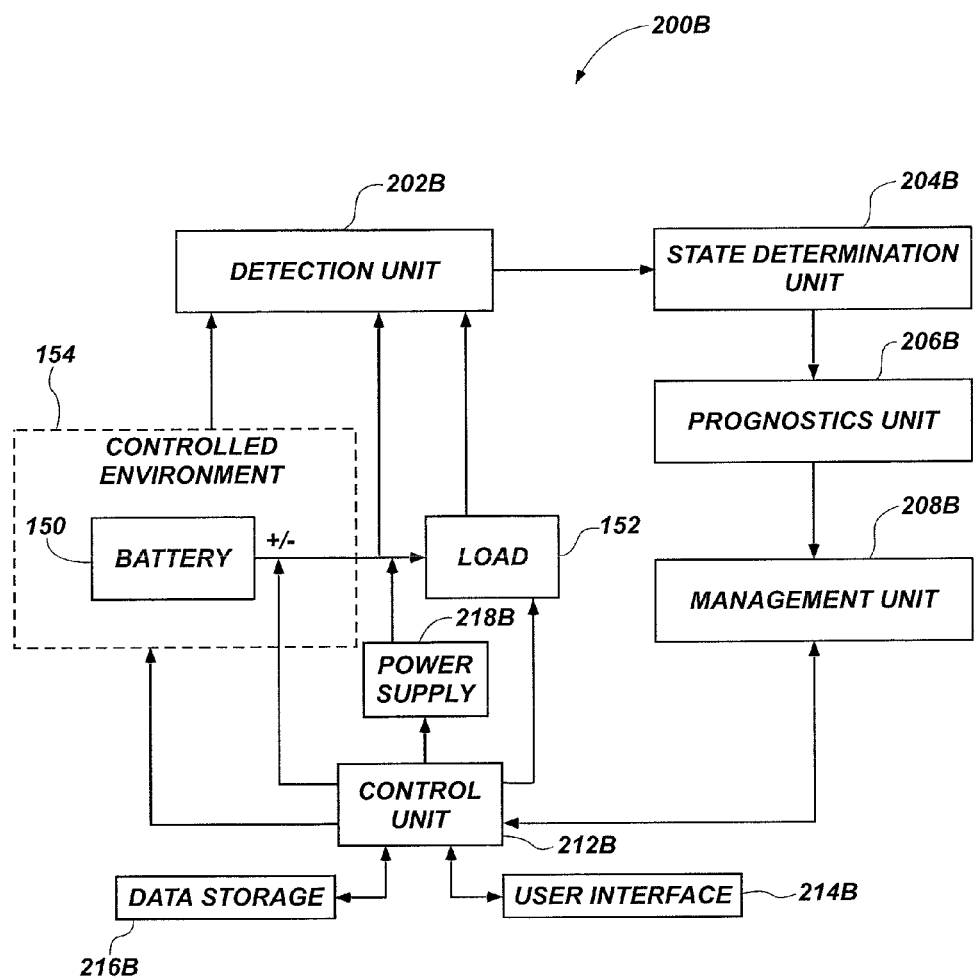
FIG. 2B is a simplified diagram of a system for analyzing, monitoring, and controlling a battery.

FIG. 2B is a simplified diagram of a system 200B for analyzing, monitoring, and controlling a battery 150 powering a load 152. The system 200B may include a detection unit 202B, a state determination unit 204B, a prognostics unit 206B, a management unit 208B, and a control unit 212B that may be operably coupled to each other and the battery 150 in order to collect and analyze data therefrom. Such data may include metrics such as the state of charge, temperature, capacity, and impedance of the battery 150. The system 200B further includes a user interface 214B, data storage 216B and a power supply 218B operably coupled with the control unit 212B.

The detection unit 202B may include sensors and other hardware configured to collect raw data from the battery 150. The state determination unit 204B may include hardware and/or software that may receive the raw data from the detection unit 202B and be configured to calculate numerical values representing metrics such as state of charge, capacity, impedance, etc. The numerical data from the state determination unit 204B may be received by the prognostics unit 206B that may predict future performance of the battery 150 based on the numerical data. For example, as will be described in more detail below, the prognostics unit 206B may compare numerical data relating to the performance characteristics with baseline data using a deviation-from-baseline approach. As a result, the unknown consequences of the battery 150 being exposed to an arbitrary aging condition (i*) that is off-matrix from the baseline may be estimated.

The management unit 208B may include hardware and/or software that may compare actual data with predicted data against a differential threshold. If the differential threshold is exceeded, the management unit 208B may be configured to enable controls in the control unit 212B to hold the battery 150 within safe operating conditions. The control unit 212B may be configured to adjust one or more of a controlled environment 154 (e.g., temperature, pressure, etc.) around the battery 150, the voltage output from the battery 150, and a power supply 218B to the load 152, and the load 152 itself in order to alter operating conditions in response to the predictive and management features of the system 200B. Baseline aging conditions may be stored in the data storage 216B (e.g., memory) that may be on-board with the control unit 212B for the battery 150.

Embodiments of the present disclosure include systems, methods, and computer-readable media for evaluating the effects from an arbitrary aging condition (i*) that may vary over time. A set of matrices may be created having that standard aging information acting as baseline, which information may be recorded through real-time use of a battery. Once the baseline behavior for the battery has been established, the sensitivity of the battery may be simulated based on the arbitrary aging conditions (e.g., state of charge, temperature, etc.) of interest in order to determine aging consequences of an arbitrary aging condition (i*), as a deviation from the baseline matrix.

While estimating the aging consequences of an arbitrary aging condition (i*) for a period of time, a sigmoidal-based methodology may be used to calculate various time-dependent terms for performance losses ($\Psi$) (e.g., reversible and irreversible capacity fade in an electrochemical cell) that may be used to characterize the condition and lifespan of the battery. For example, multiple sigmoid model (MSM) methodologies and their resulting time-dependent terms characterizing different performance losses are described in U.S. patent application Ser. No. 12/571,253, entitled "Systems, Methods and Computer Readable Media for Estimating Capacity Fade in Rechargeable Electrochemical Cells," filed on Sep. 30, 2009; U.S. patent application Ser. No. 12/765,384, entitled "Systems, Methods and Computer-Readable Media to Model Kinetic Performance of Rechargeable Electrochemical Devices," filed on Apr. 22, 2010; and U.S. patent application Ser. No. 12/793,224, entitled "Systems, Methods and Computer Readable Media for Modeling Cell Performance Fade of Rechargeable Electrochemical Devices," filed on Jun. 3, 2010. As indicated above, the foregoing patent applications are incorporated by reference herein in their entirety.

Embodiments of the present disclosure may include obtaining and analyzing data for a plurality of different standard characterization conditions (SCCs). An SCC is a condition by which a state of an object (e.g., battery) may be assessed under a standardized protocol for diagnostic analysis. Example conditions for SCCs of a battery may include an assessment of a broad spectrum of device performance losses ($\Psi$) (e.g., capacity, conductance, power losses in batteries) for a given cycling rate of cycling the battery. Another example of an SCC may be to set a consistent temperature over the life of the object. Another example of an SCC may be to establish a standardized state of charge (SOC) for diagnostic analysis. SCCs may include a combination of SCCs. For example, a standardized state of charge and a standardized temperature may be set for a diagnostic analysis (e.g., impedance measurement) for assessing battery health.

Embodiments of the present disclosure may include defining a standard test matrix, relevant to an intended application, that enables early training of model parameters and general characterization of aging behavior under baseline conditions.

Embodiments of the present disclosure may be self-consistent based on thermodynamics, reaction kinetics, and mathematics. While sigmoidal expressions are used for reaction rate expressions, alternate rate expressions maybe used that also permit closed-form solutions to time derivatives and related terms.

Embodiments of the present disclosure may include MSM model parameters that have a physical basis and may readily be determined for arbitrary aging conditions (i*) through a differential deviation-from-baseline approach. Terms involving Gibbs free energy analysis and activation energies are employed to facilitate optimization of usage conditions to minimize aging rates.

Embodiments of the present disclosure may be used to predict aging under a given sequence of aging conditions so that the useful life remaining (ULR) may be calculated along a projected timeline for each SCC. This capability may be relevant to a Battery Diagnostic & Management Center (BDMC), or the like, residing and operating real-time within a given application, whether for an electric-drive vehicle, grid storage, UPS device, or other numerous consumer electronic devices. A BDMC may achieve adaptive control by enacting battery management protocol guided through inputs described in this disclosure regarding optimal conditions.

Embodiments of the present disclosure may be used to help design advanced thermal management systems by improving time-at-temperature conditions for a given battery chemistry in order to meet or exceed the targeted warranty period. In addition, the modeling approach described herein may permit a more logical approach toward setting appropriate boundaries for thermal management, while avoiding costly overdesign. For example, modeling aging conditions and predicting performance losses may consider life trends of a battery in relation to the geographic location and anticipated usage.

Embodiments of the present disclosure may be implemented for any device or system undergoing gradual aging processes. For example, a battery may experience aging processes over time. Thus, embodiments may include areas related to battery research and battery development, as well as other devices such as onboard monitoring of consumer electronics, battery power grid applications, and vehicle applications (e.g., electric vehicles (EV), hybrid electric vehicles (HEV), and plug-in hybrid electric vehicles (PHEV)).

In addition to predicting gradual aging, embodiments of the present disclosure may further be configured to predict when critical aging points have been reached (e.g., thresholds) that are indicative of possible sudden critical failure.

In order to have embodiments of the disclosure be more robust in diverse consumer applications, it may be desirable to define the various MSM expressions as adaptable to real-world aging conditions that batteries experience. This may be accomplished by having MSM parameters (a, b, M) that adapt to an arbitrary aging condition (i*), which adds to the diagnostic strength of the predictive methods herein, because the MSM parameters (a, b, M) represent physical quantities that are tied to chemical kinetics. The approach described herein considers the deviation of the data obtained during exposure to an arbitrary aging condition (i*) from the MSM parameters (a, b, M) associated with a baseline aging condition that is precisely and consistently defined for a given application. From this work, a library of aging behaviors are determined or estimated under a defined set of baseline aging conditions for a given battery chemistry, configuration, and its product application (along with a corresponding library of MSM parameters), making the methods more amenable to predicting the aging consequences when usage patterns change appreciably from the baseline.

Because variable usage conditions relate to variable aging rates for the individual and aggregate degradation mechanisms, the MSM protocol used may become more generalized and robust in terms of how the predicted aging behavior over time is sensitive to the regimes of temperature, SOC, pulse frequency (throughput), pulse severity, cycle-life conditions vs. calendar-life conditions, etc. As a result, the modeling protocol described herein may be predictive over time and conditional variability. The result may be a consistent, defensible approach to estimating how a plurality of different aging parameters may be combined to yield an effective or composite performance loss at an arbitrary aging condition (i*) for a given aging time. As a result, embodiments of the present disclosure may enable forecasting of performance loss ($\Psi$) over relatively complex, diverse, and realistic battery usage conditions, and allowing proper bounding and optimization of cell use protocol to avoid premature cell failure with regard to capacity or other performance measures.

2. Model Background and Basis

The MSM expressions indicate the rate of change of a given performance measure as a consequence of a set of aging conditions (i); hence the MSM expressions are essentially a set of chemical kinetics rate expressions that describe a performance decrease in terms of aging effects on key members of that performance measure. Thus, the MSM expressions and their parameters may reflect both the choice of characterization conditions and the aging conditions (i).

For demonstration purposes, in the description below it is implied that the development applies to each constituent degradation mechanism (j) that contributes to performance loss ($\Psi$). For example, for capacity fade of a battery, some of the applicable quantities include loss of free available lithium (Li$^+$), and loss of active host ingress/intercalation sites (i.e., active site loss ($\theta$)), as well as a net lithium source (negative loss) mechanism. The methodology described herein may enable diagnostic analyses to be obtained for constituent degradation mechanisms (j) at an arbitrary time-variable arbitrary aging condition (i*(t)). In addition, the relative proportions of the active sites and lithium contributions to a time-variable performance loss ($\Psi_{i*}(t)$) due to a given arbitrary aging condition (i*) may be compared to what they would be under a baseline (BL) aging condition (i)$_{BL}$.

At the end of a given unique aging period ($\Delta t_n$), for example, the n$^{th}$ period in the useful service life of a battery, the MSM expressions and their parameters may be used to determine the performance losses ($\Psi$) due to one or more degradation mechanism (j) of the battery. For example, the net irreversible and reversible capacity fade may be determined for available Li$^+$ and active host sites, as well as other performance losses ($\Psi$) regarding cell conductance, available power, etc.

SCCs for cell capacity may include the irreversible performance loss determined through a slow cycling rate analysis (e.g., $C_1/25$ rate), whereas the reversible performance loss is determined at an arbitrarily chosen higher rate (e.g., $C_1/1$ rate). A "C" rate is defined herein as the rated energy capacity (generally the discharge capacity) attainable in fully discharging a cell in one hour ($C_1/1$ or $C_1$ reference). Thus, a $C_1/25$ rate would represent a 25-hour discharge at a current $\frac{1}{25}^{th}$ that of the $C_1/1$ reference, while $3C_1$ would elapse in 20 minutes at a current three times that of the $C_1/1$ rate.

For SCCs, both measures for each rate may be determined for a standard temperature (e.g., 25° C.). Therefore, for evaluating cell capacity fade, a minimum set of MSM expressions for a SCC may include four expressions: two expressions for irreversible performance losses ($\Psi$) (e.g., Li$^+$ and $\theta$ losses) under a slower rate ($C_1/25$), and two expressions for net performance losses ($\Psi$) (e.g., reversible+irreversible) that may be due to the Li$^+$ and $\theta$ losses under a higher rate (e.g., $C_1/1$).

Thus, regardless of the aging conditions (i), during and at the end of each distinct unique aging period ($\Delta t_n$) (e.g., real or simulated) MSM evaluations may be applied at time intervals (e.g., hourly, daily, weekly, monthly, etc.) at the chosen characterization conditions, wherein the MSM evaluation is configured to invoke what may essentially be a simulated virtual reference performance test (VRPT). Model calculations may be regressive in nature, allowing detailed diagnostic analysis and failure determination based on existing data; additionally, the MSM evaluations may be used in predictive simulations that interpolate or extrapolate outside known performance data for a given battery. In particular, three MSM parameters (a, b, M) per degradation mechanism (j) are aging-specific and it may be determined how the MSM parameters may be correlatable within a multi-dimensioned aging matrix that covers aging conditions (i), such as temperature, SOC, calendar-life conditions, cycle-life conditions, etc.

Therefore, the overall approach calls for the MSM formalism to be applied over each distinct aging time period and the corresponding conditions therein for the duration of the simulated service life of the cell, battery, or battery pack. The effective performance loss existing at the beginning of a new (different) aging condition/period may be used to determine the beginning rate of aging over the new time period. This is due to the fact that aging rates over time are affected by the relative amount of aging already incurred by the cell. Thus, once the constituent and net performance losses are determined at the conclusion of an existing aging condition and period, those values may be used to determine where on the MSM timelines to start the clock and then use the new rates beginning at that point. The following diagram explains this general concept for a given degradation mechanism (j):

| Aging Period 1 | 2 | 3 | ... | n | (1) |
|---|---|---|---|---|---|
| $\Delta t_1$ | $\Delta t_2$ | $\Delta t_3$ | ... | $\Delta t_n$ | |
| $t_{start,1} = 0$ | $t_{start,2}$ per MSM | $t_{start,3}$ per MSM | ... | $t_{start,n}$ per MSM | |
| $\Psi_{j,1}$ over $\Delta t_1$ | $\Psi_{j,2}$ over $\Delta t_2$ | $\Psi_{j,3}$ over $\Delta t_3$ | ... | $\Psi_{j,n}$ over $\Delta t_n$ | |
| $\Psi_{net,1} = \Delta\Psi_{j,1}$ | $\Psi_{net,2} = \Psi_{net,1} + \Delta\Psi_{j,2}$ | $\Psi_{net,3} = \Psi_{net,2} + \Delta\Psi_{j,3}$ | ... | $\Psi_{net,n} = \Psi_{net,n-1} + \Delta\Psi_{j,n}$ | | where $\Psi_{j*}(t_n) = \Psi_{net,n}$ for each degradation mechanism (j) and collective degradation mechanisms.

Because characterization conditions are standardized much like a VRPT, the reversible and irreversible performance losses ($\Psi$) over time may be cumulative over all consecutive aging conditions (i) and their related time periods. Thus, the following equalities-of-state regarding the performance losses ($\Psi$) end-of-time period n−1 and the beginning of period n may be summarized as:

$$(\Psi_{net})_{start\ of\ n} = (\Psi_{net})_{end\ of\ n-1}$$

$$(\Psi_{\theta,irrev}, \Psi_{Li^+,irrev})_{start\ of\ n} = (\Psi_{\theta,irrev}, \Psi_{Li^+,irrev})_{end\ of\ n-1}$$

$$(\Psi_{\theta,rev}, \Psi_{Li^+,rev})_{start\ of\ n} = (\Psi_{\theta,rev}, \Psi_{Li^+,rev})_{end\ of\ n-1} \quad (2)$$

where $\Psi$ represents a performance loss, the subscript $Li^+$ represents the performance loss ($\Psi$) related to loss of lithium in the cell, and the subscript $\theta$ represents the performance loss ($\Psi$) related to the loss of active sites of the cell. The subscript "rev" indicates reversible performance loss ($\Psi$), while the subscript "irrev" indicates irreversible performance loss ($\Psi$). Therefore, from the equalities-of-state listed as equation (2), the cumulative performance loss ($\Psi$) at the beginning of the $n^{th}$ period has a known initial condition that is equal to the cumulative performance loss ($\Psi$) at the end of the n−1 period, and which can be used to establish MSM parameters (a, b, M) applicable during each unique aging period ($\Delta t_n$). These equalities-of-state relationships are shown graphically in FIG. 3.

Figure 3:
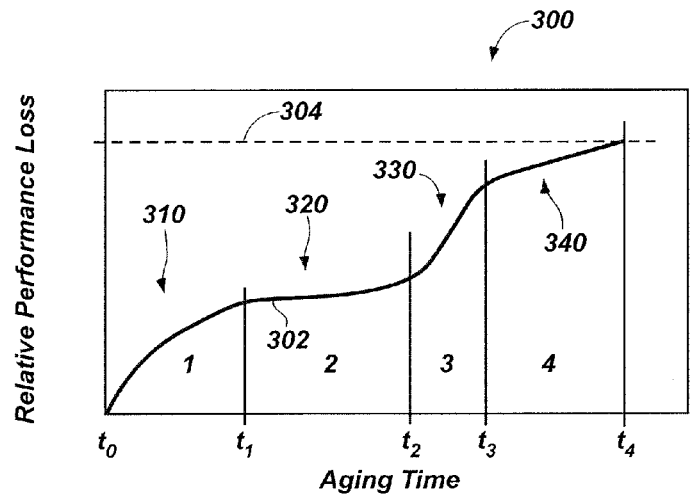
FIG. 3 is a generalized graph of a net performance loss over a time period for a battery that experiences a plurality of distinct periods of different aging conditions.

FIG. 3 is a generalized graph 300 of a net performance loss ($\Psi_{net}$) 302 over a time period (i.e., aging time) for a battery that experiences a plurality of distinct periods of different aging conditions (i). For example, during a first time period 310 (between $t_0$ and $t_1$), a battery may experience performance loss ($\Psi_{net}$) 302 according to a first aging condition (i). During a second time period 320 (between $t_1$ and $t_2$), the battery may experience performance loss ($\Psi_{net}$) 302 according to a second aging condition (i). During a third time period 330 (between $t_2$ and $t_3$), the battery may experience performance loss ($\Psi_{net}$) 302 according to a third aging condition (i). During a fourth time period 340 (between $t_3$ and $t_4$), the battery may experience performance loss ($\Psi_{net}$) 302 according to a fourth aging condition (i).

Each new set of aging conditions (i) has a starting net performance loss ($\Psi_{net}$) 302 that begins from where the previous set of aging conditions (i) left off. That is, the performance loss ($\Psi_{net}$) 302 builds on previous performance loss ($\Psi_{net}$) 302 history, considering both individual degradation mechanisms (j) and collective aging over all degradation mechanisms (j). This assumption satisfies the equalities given above and provides a continuous and cumulative increase in performance loss ($\Psi_{net}$) 302 over time. In so doing, kinetic continuity may be established for the individual and net aging processes.

At the end of the fourth time period 340, the performance loss ($\Psi_{net}$) 302 has some final level 304 indicated by a dashed line. The final level 304 for the performance loss ($\Psi_{net}$) 302 may be at least partially dependent on the path of the various aging conditions (i). Path dependence asserts that the sequence of aging conditions (i) (as well as the nature and magnitude of conditions) has a direct influence on the rate of aging and net aging along the timeline. In other words, the path dependence of the aging conditions (i) means that a randomized rearrangement of the aging conditions (i) may not reproduce the same final level 304 of the performance loss ($\Psi_{net}$) 302 at the end of the fourth period. Thus, depending on the order of experiencing the plurality of aging conditions (i), the battery may experience different levels of performance loss ($\Psi_{net}$) 302.

Given such knowledge, it may be desirable to ascertain a path that reduces the performance losses ($\Psi_{net}$) 302 from the effects of a plurality of different aging conditions (i), while meeting performance goals, which may result in extending the usable life of the battery. For example, such an optimal path may be understood in the context of reaction kinetics and thermodynamics, which collectively govern the extent and rate of degradation reactions that affect electrochemical cells and other reactive chemical systems. Based on the principles of reaction kinetics that proceed from an intermediate state and related thermodynamic constraints, the cumulative performance loss (i.e., final level 304 of the perform lance loss ($\Psi_{net}$) 302) may produce net aging that is different from any other rearrangement of a random rearrangement of different aging conditions (i).

In order to accomplish the analytical representation of aging behavior across the different unique aging periods ($\Delta t_n$) in FIG. 3, the appropriate starting times are determined for the constituent MSM expressions that each define the beginning of time period n that is needed to satisfy the above equalities in equation (2). As a result, it may be necessary to back-calculate the pseudo-starting point for a given MSM expression at time period n ($t_{start,n}$) by rearranging the basic MSM for a given degradation mechanism (j), using MSM parameters (a, b, M) determined for unique aging period ($\Delta t_n$):

$$\Psi_{j,n-1} = 2M_j \left[ \frac{1}{2} - \frac{1}{1 + \exp(a_j t^{b_j})} \right]_{i*} \quad (3)$$

which gives:

-continued $$t_{start,n,j} = \left[\frac{1}{a_j}\ln\left(\frac{2M_j}{M_j - \Psi_{j,n-1}} - 1\right)\right]^{\frac{1}{b_j}} \quad (4)$$

for every degradation mechanism (j) and each SCC.

The MSM expression for each degradation mechanism (j) may be applied over each unique aging period ($\Delta t_n$), starting at $t_{start,n,j}$. To solve for $t_{start,n,j}$ an appropriate set of MSM parameters (a, b, M)$_n$ is determined for each MSM expression that represents a constituent degradation mechanism (j) at each time period, for a given SCC. For example, this data may be stored in a library of MSM parameters (a, b, M)$_n$ for the basic aging conditions (i) for both calendar life and cycle life, for at least two cycling rates and at least two temperatures, which may result in as many as sixteen MSM expressions from $2^4$ conditions. The test matrix used to obtain the MSM parameters (a, b, M) may be based on a baseline aging condition (i) and supporting conditions that deviate from the baseline matrix by a physical parameter such as temperature, SOC, or others. Further discussion of the test matrix is provided below.

MSM parameters (a, b, M) may initially be estimated from like cell chemistries; however, MSM parameters (a, b, M) may be updated when real system data evolves over the life timeline of the device. One challenge in using a library of MSM parameters (a, b, M) to represent anticipated usage conditions is that, in reality, there may be innumerable possible conditions for which such a library may be asked to accommodate. Reliance on one or more test matrices outside the baseline matrix for MSM parameters (a, b, M) may be cumbersome, in that arbitrary aging conditions (i*) may not have a direct link back to a test matrix condition. Hence, the formalism discussed below enables direct determination of MSM parameters (a, b, M) at arbitrary, off-matrix conditions. Thus, a viable technique may be applied to adapt MSM parameters (a, b, M) and predictions to specific conditions of interest within a multi-dimensional matrix of aging conditions (i). It should be noted that depending on the adaptation technique, at a particular time-variable arbitrary aging condition (i*(t)) it might be incorrect to assume that a given MSM parameter (e.g., a, b, M) is linear in its impact on performance loss for a specific condition, for example, linear over temperature. Also, in some cases there may be interactions or interdependence between various pairs or triplets of aging conditions (i) that yield non-linear secondary or tertiary effects on performance degradation at an arbitrary aging condition (i*). These higher-order effects may be added to the modeling framework with coupled terms that include the relevant interactions. In practice, such interactions may not be known apriori, but may be determined after-the-fact from regression of test data.

3. Deviation from Baseline Aging Condition Approach

A baseline aging condition (i)$_{BL}$ may be used as the "reference state" for predicting aging of a battery, and related mathematical treatments may be developed accordingly. One issue to determine is how an arbitrary aging condition (i*) creates an aging trend that varies from that of the baseline. This issue may be considered for each unique aging period ($\Delta t_n$).

Looking at the dependent aging response (e.g., performance loss $\Psi_{j,i^*}$) representing the extent of degradation for a chosen aging metric (e.g., capacity fade, conductance loss, etc.) and a given degradation mechanism (j) of that aging metric, the following expression in equation (5) may be used to account for the deviation of the an arbitrary performance loss ($\Psi_{j,i^*}$) from the baseline performance loss ($\Psi_{j,BL}$). For example, the arbitrary performance loss ($\Psi_{j,i^*}$) may include terms from the various aging conditions (i) (i.e., stress factors) of interest, such as temperature (T), cell state of charge (SOC), and cycling condition or magnitude (cyc). Such an expression of the arbitrary performance loss ($\Psi_{j,i^*}$) may be written as:

$$\Psi_{j,i^*} = \Psi_{j,BL} + \quad (5)$$

$$\left[\begin{array}{l}\left(\frac{\partial\Psi_j}{\partial T}dT\right)_{SOC,cyc} + \left(\frac{\partial\Psi_j}{\partial SOC}dSOC\right)_{T,cyc} + \left(\frac{\partial\Psi_j}{\partial cyc}dcyc\right)_{SOC,T} + \ldots + \\ \left\{\left(\frac{\partial\Psi_j}{\partial SOC}\frac{\partial SOC}{\partial T}dT\right)_{cyc} + \left(\frac{\partial\Psi_j}{\partial cyc}\frac{\partial cyc}{\partial T}dT\right)_{SOC} + \ldots\right\} + \\ \{\text{higher order terms}\}\end{array}\right]_{i^*}$$

or $$\Psi_{j,i^*} = \Psi_{j,BL} + \left[\begin{array}{l}\Delta\Psi_{j,T} + \Delta\Psi_{j,SOC} + \Delta\Psi_{j,cyc} + \ldots + \\ \{\Delta\Psi_{j,SOC\square T} + \Delta\Psi_{j,cyc\square T} + \ldots\} + \\ \{\text{higher order terms}\}\end{array}\right]_{i^*} \quad (6)$$

and then:

$$\Psi_{i^*} = \sum_j^{n_j} \Psi_{j,i^*} \text{ for } n_j \text{ contributing mechanisms} \quad (7)$$

as referenced at a particular aging time. Equations (5), (6), and (7) recognize that one or more aging conditions (i) may be known or suspected to impact degradation mechanism (j). It is further noted that equations (5), (6), and (7) include the following regions of integration that may be defined in terms of the baseline condition:

$dT$ covers $(T_{i^*} - T_{BL})$ $dSOC$ covers $(SOC_{i^*} - SOC_{BL})$ $dcyc$ covers $(cyc_{i^*} - cyc_{BL})$, (8)

etc.

For the sake of numerical clarity, it is noted that for a given aging parameter (A):

$$\Delta\Psi_{j,i^*,A} \equiv \left(\frac{\partial\Psi_j}{\partial A}dA\right)_{i^*} \quad (9)$$

$$\approx \left(\frac{\Psi_{j,BL} - \Psi_{j,per\,\Delta A\,in\,test\,matrix}}{A_{BL} - A_{per\,test\,matrix}}\right)(A_{i^*} - A_{BL})$$

The delta tetras ($\Delta\Psi_{j,T}$, $\Delta\Psi_{j,SOC}$, $\Delta\Psi_{j,cyc}$ . . . ) are thus the isolated or independent responses of the performance losses ($\Psi$) for degradation mechanism (j) at arbitrary aging condition (i*), as determined from previous knowledge or data derived from a test matrix. Temperature effects may be estimated by assuming Arrhenius behavior of a particular degradation mechanism (j), if indeed the performance loss ($\Psi_j$) exhibits an Arrhenius trend. SOC effects are defined in the context of how cell performance (e.g., capacity) might be degraded relative to the nominal SOC chosen under arbitrary aging condition (i*).

The MSM parameter $M_j$ may represent the theoretical maximum limit of capacity fade under degradation mechanism (j) considering the finite thermodynamic limit of degradation under degradation mechanism (j) for a batch system. This convention may apply equally to other aging metrics (e.g., conductance loss, power fade, etc.), wherein $M_j$ represents the proportional maximum extent of reaction attributed to a degradation mechanism (j), considering all degradation mechanisms (j) viable within arbitrary aging condition (i*). The same general set of equations given above for the performance loss ($\Psi$) can be applied to the theoretical extent of completion of degradation mechanism (j) at arbitrary aging condition (i*), denoted $M_{j,i*}$, because this term is the upper boundary of arbitrary performance loss ($\Psi_{j,i*}$):

$$M_{j,i*} = \lim_{t \to \infty} \Psi_{j,i*} \text{ as a single independent response} \quad (10)$$

where $$M_{j,i*} = M_{j,BL} + \quad (11)$$

$$\left[ \left( \frac{\partial M_j}{\partial T} dT \right)_{SOC,cyc} + \left( \frac{\partial M_j}{\partial SOC} dSOC \right)_{T,cyc} + \left( \frac{\partial M_j}{\partial cyc} dcyc \right)_{SOC,T} + \ldots + \left\{ \left( \frac{\partial M_j}{\partial SOC} \frac{\partial SOC}{\partial T} dT \right)_{cyc} + \left( \frac{\partial M_j}{\partial cyc} \frac{\partial cyc}{\partial T} dT \right)_{SOC} + \ldots \right\} + \text{\{higher order terms\}} \right]_{i*}$$

or $$M_{j,i*} = M_{j,BL} + \begin{bmatrix} \Delta M_{j,T} + \Delta M_{j,SOC} + \Delta M_{j,cyc} + \ldots + \\ \{\Delta M_{j,SOC\square T} + \Delta M_{j,cyc\square T} + \ldots \} + \\ \text{\{higher order terms\}} \end{bmatrix}_{i*} \quad (12)$$

and then:

$$M_{i*} = \sum_{j}^{n} M_{j,i*} \text{ for } n \text{ contributing mechanisms} \quad (13)$$

insomuch as the degradation mechanisms (j) are independent and hence, additive. Similar to the performance loss ($\Psi$) terms, the delta terms ($\Delta M_{j,T}$, $\Delta M_{j,SOC}$, $\Delta M_{j,cyc}$ ... )) are the isolated or independent responses of MSM parameter M to (T, SOC, cyc) for degradation mechanism (j) at arbitrary aging condition (i*) determined via previous knowledge or a test matrix. As such, the $\Delta M$ terms represent how the true extent of reaction along degradation mechanism (j) under arbitrary aging condition (i*) is affected by a particular aging parameter, in deviation to the baseline extent for degradation mechanisms (j). For a given aging parameter (A), the numerical expression may be determined:

$$\Delta M_{j,i*,A} \equiv \left( \frac{\partial M_j}{\partial A} dA \right)_{i*} \quad (14)$$

$$\approx \left( \frac{M_{j,BL} - M_{j,per \, \Delta A \, in \, test \, matrix}}{A_{BL} - A_{per \, test \, matrix}} \right) (A_{i*} - A_{BL})$$

3. Formulation of Equilibrium Constants

In considering the equilibrium constant for a degradation process, a representative average or composite value for MSM parameter (M) at arbitrary aging condition (i*) may be defined by borrowing from the formalism developed under thermodynamic equilibrium of processes within a reactive system. If the $k^{th}$ aging parameter (stress factor) is considered as it pertains to degradation mechanism (j) (e.g., reaction pathway):

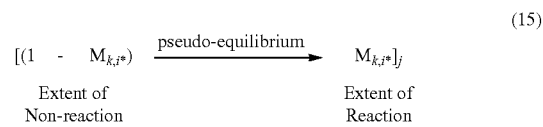

(15)

and for the net effect on degradation mechanism (j) from all combined stress factors within arbitrary aging condition (i*):

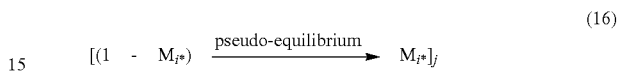

(16)

Explicit knowledge of $M_{k,i*}$ terms may not generally be feasible, but this limitation may be circumvented by writing such processes for all contributing parameters at arbitrary aging condition (i*), using the baseline reference condition:

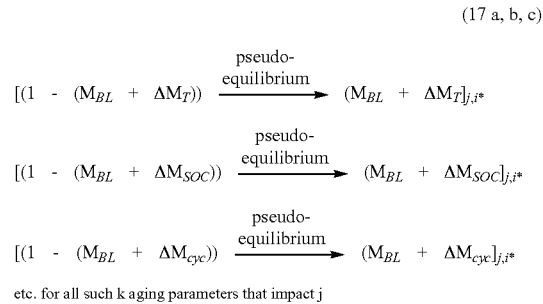

(17 a, b, c)

etc. for all such k aging parameters that impact j

With this formalism defined, the equilibrium constant terms may be addressed, and also defined in the context of the baseline reference, using the M terms that represent the extent of reaction. For a general equilibrium reaction process covering a degradation mechanism (j), the equilibrium constant is defined in terms of the ratio of products over reactants, which in this case is represented by the M extent terms:

$$\left( K_{eq} = \frac{M_{eq}}{1 - M_{eq}} \right) \quad (18)$$

for degradation mechanisms (j) that progress over time. If a distinct degradation mechanism (j) is considered at pseudo equilibrium an under arbitrary aging condition (i*) that is influenced by k distinct aging parameters:

$$\left( K_{j,i*} = \frac{M_{j,i*}}{1 - M_{j,i*}} \right) \quad (19)$$

Through equation (12), the baseline reference condition may be incorporated, whereby the equilibrium constant (K) is effectively evaluated regarding the deviation from the baseline value for degradation mechanism (j).

$$K_{j,i^*} = \frac{M_{j,i^*}}{1-M_{j,i^*}} = \frac{M_{j,BL} + \sum_{k=1}^{n_k} \Delta M_{j,i^*,k}}{1-\left(M_{j,BL} + \sum_{k=1}^{n_k} \Delta M_{j,i^*,k}\right)} \quad (20)$$

which reduces to the baseline value at baseline conditions (all $\Delta M_k=0$). Higher order terms are implied in the summation terms.

Finally, the net equilibrium constant ($K_{i^*,net}$) covering the degradation mechanisms (j) that effect the chosen aging response ($\Psi^*$) is:

$$K_{i^*,net} = \frac{M_{i^*}}{1-M_{i^*}} \quad (21)$$

$$= \frac{\sum_j^{n_j} M_{j,i^*}}{1-\sum_j^{n_j} M_{j,i^*}}$$

$$= \frac{\sum_j^{n_j}\left(M_{j,BL} + \sum_{k=1}^{n_k}\Delta M_{j,k}\right)}{1-\sum_j^{n_j}\left(M_{j,BL} + \sum_{k=1}^{n_k}\Delta M_{j,k}\right)}$$

where the k summations include higher order terms as needed.

Thus, the above expressions enable direct prediction of effective $M_{j,i^*}$ and $M_{i^*}$ terms (if needed) once the related equilibrium constants (K) are determined from the deviation from baseline approach:

$$M_{j,i^*} = \frac{K_{j,i^*}}{1+K_{j,i^*}}; \; M_{i^*} = \frac{K_{i^*,net}}{1+K_{i^*,net}} \quad (22)$$

The relative influence of aging conditions (i) on a given degradation mechanism (j) may be determined by comparing the sign and magnitude of $\Delta M_k$ terms, and the predominance of degradation mechanisms (j) may be assessed by comparing $M_{j,i^*}$. Based on such an analysis, the operating environment and duty cycle of batteries may be designed and controlled to minimize aging processes. Adaptive control of operating conditions may be performed over the service life of batteries to optimize their "health" and prolong their life. The modeling tools developed herein may be incorporated into a cycle life simulation, whereby conditions over battery life are optimized to maximize the lifetime within the constraints of the defined application (HEV, PHEV, EV, etc.).

For completeness, it is noted that:

$$K_{i^*} = \exp\left(\frac{-\Delta G_{i^*}}{RT}\right); \; K_{j,i^*} = \exp\left(\frac{-\Delta G_{j,i^*}}{RT}\right) \quad (23)$$

insomuch as the theoretical maximum extent of performance loss ($\Psi$) at an arbitrary aging condition (i*) may be assigned analogous Gibbs energy terms (G) for the forward progress of all affected degradation mechanisms (j). The $\Delta G$ terms are defined as the standard-state Gibbs free energy (G) change. Optimization of the usage conditions and duty sequence over battery life may be accomplished by maximizing the cumulative $\Delta G_{j,i^*}$ and $\Delta G_{i^*}$, as defined by a running average:

$$G_{ave,j,i^*}(t_{net}) = \frac{1}{t_{net}}\int_{t=0}^{t_{net}} G_{j,i^*}(t)\, dt_{i^*} = \frac{1}{t_{net}}\sum_{i^*=1}^{n_t} \Delta G_{j,i^*}\Delta t_{i^*} \quad (24a)$$

and $$G_{ave,i^*}(t_{net}) = \sum_{j=1}^{n_j} G_{ave,j,i^*}(t_{net}) \quad (24b)$$

which serves as a thermodynamic basis for the methodology described herein. Increasing the battery lifetime may occur by intelligent choice of aging conditions (i) and the sequence thereof (i.e., because of path dependence) within the intended application, which may result in improving the average Gibbs terms ($G_{ave}$) over time ($t_{net}$). Due to the mathematical convention of equation (23) as applied to minimization of aging processes, improvement of the Gibbs terms (G) occurs when the Gibbs terms (G) have larger positive values. Positive values of distinct or average Gibbs terms (G) denote that the related equilibrium constant is less that unity, which may indicate the presence of less products than reactants (i.e., a lower extent of reaction).

Another purpose behind evaluating the equilibrium constant terms (K) may be to isolate the contributions from the individual stress factors to the equilibrium constant (K) for each degradation mechanism (j) at arbitrary aging condition (i*). For example, given a battery operating at specified aging conditions defined at arbitrary aging condition (i*), it may be determined what fraction of a particular aging metric (e.g., $\Psi_{capacity\,fade}$) under a given degradation mechanism (j) is due to temperature, SOC, cycling protocol. Such information may reveal the sensitivity of the system to its environmental and operational conditions, and aid in finding relevant (service-applicable) conditions that minimally age the system. One challenge to this purpose is to derive meaningful terms that facilitate correct evaluations of thermodynamic quantities useful toward identification of the foremost aging parameters for each degradation mechanism (j) and overall aging minimization.

Various equilibrium constant-type expressions may be derived and used to isolate contributions from the various k stress factors, which involve assessing the deviation from the baseline condition for a term here denoted here as $\Delta K_{j,i^*,k}$:

$$(A) \; \Delta K_{j,i^*,k} = \frac{\Delta M_{j,i^*,k}}{1-M_{j,BL}} \quad (25a)$$

$$(B) \; \Delta K_{j,i^*,k} = \frac{\Delta M_{j,i^*,k}}{1-(M_{j,BL}+\Delta M_{j,i^*,k})} \quad (25b)$$

$$(C) \; \Delta K_{j,i^*,k} = \frac{\Delta M_{j,i^*,k}}{1-\left(M_{j,BL}+\sum_{k=1}^{n_k}\Delta M_{j,i^*,k}\right)} \quad (25c)$$

and the summation terms:

$$(D) \; \sum_k^{n_k} \Delta K_{j,i^*,k} = \frac{1}{1-M_{j,BL}}\sum_k^{n_k}\Delta M_{j,i^*,k} \quad (26a)$$

-continued $$\text{(E)} \sum_{k}^{n_k} \Delta K_{j,i^*,k} = \sum_{k}^{n_k} \frac{\Delta M_{j,i^*,k}}{1-(M_{j,BL}+\Delta M_{j,i^*,k})} \quad (26b)$$

$$\text{(F)} \sum_{k}^{n_k} \Delta K_{j,i^*,k} = \frac{1}{1-\left(M_{j,BL}+\sum_{k=1}^{n_k}\Delta M_{j,i^*,k}\right)} \sum_{k}^{n_k} \Delta M_{j,i^*,k} \quad (26c)$$

For fractional analysis $$\frac{A}{D} = \frac{C}{F} = \frac{\Delta M_{j,i^*,k}}{\sum_{k=1}^{n_k}\Delta M_{j,i^*,k}} \quad (27)$$

and yet:

$$\bar{X}_{j,i^*,k} \equiv \frac{B}{E} \quad (28)$$

$$= \frac{\Delta M_{j,i^*,k}}{1-(M_{j,BL}+\Delta M_{j,i^*,k})}\left[\sum_{k}^{n_k} \frac{\Delta M_{j,i^*,k}}{1-(M_{j,BL}+\Delta M_{j,i^*,k})}\right]^{-1}$$

In the development above, form (B) appears superior in isolating the k parameter deviation from the baseline regarding degradation mechanism (j), and thus equation (28) may serve as a basis for extracting the true relative influence of aging parameters on MSM parameter ($M_j$). This treatment may be performed for all such k values, degradation mechanisms (j), and arbitrary aging condition (i*). Thus, comparison of such terms may confirm the relative magnitude of influence (e.g., sensitivity analysis) of the various aging stress factors on degradation mechanism (j) at arbitrary aging condition (i*) compared to the baseline condition. An outcome of such a sensitivity analysis may be that it is unique to each successive arbitrary aging condition (i*), which may provide insights into how aging parameters differ in their influence over time.

4. Proportionalities of $M_j$ within $M_{i^*}$

The $M_j$ terms determined under MSM-based regression analysis are proportional within the 0 to 100% scale for total $M_{i^*}$, and so are defined within the "system" context of a battery, and not for the isolated reaction pathway they each represent. By practical definition, $M_j$ is the system-scaled extent of reaction for degradation mechanism (j) for all reactive mass that contributes to an aging metric affected by a degradation mechanism (j). In contrast, $M_j^o$ is the true total extent of reaction if degradation mechanism (j) were isolated as the system. For a batch reactor scenario such as an aging battery, all $M_j$ and $M_j^o$ are interconnected to some degree. The types of materials, their physical and chemical characteristics, and the environmental and operational conditions may interact to produce effective aging trends for the various degradation mechanisms. With these distinctions in place the following relationships may be defined:

$$M_{j,i^*} = \lim_{t\to\infty}\Psi_{j,i^*} = \frac{N_j(t_0)-N_j(t_\infty)}{\sum_j N_j(t_0)} \quad (29)$$

and $$M_{j,i^*}^o = \lim_{t\to\infty}\Psi_{j,i^*}^o = \frac{N_j(t_0)-N_j(t_\infty)}{N_j(t_0)} \quad (30)$$

where $N_j$ is the number of moles of reactive components (e.g., $Li^+$ and $\theta$) within the system directly involved in degradation mechanism (j). Thus, the context of $M_{j,i^*}$ is the entire batch reactor system, while $M_{j,i^*}^o$ applies to the isolated degradation mechanism (j) as the system. As such, $$\left(\sum_j^{n_j} M_j \leq 1\right) \text{ and } \left(\sum_j^{n_j} M_j^o \leq n_j\right)$$

for any single arbitrary aging condition (i*) condition or series of conditions. Due to the law of proportionality:

$$\left\{\begin{array}{l}\text{Fraction of overall performance}\\\text{loss due to mechanism } j\end{array}\right\} = \frac{M_{j,i^*}}{\sum_j M_{j,i^*}} \quad (31)$$

$$= \frac{N_j(t_0)M_{j,i^*}^o}{\sum_j N_j(t_0)M_{j,i^*}^o}$$

from which is obtained:

$$M_{j,i^*}^o = \frac{M_{j,i^*}\sum_j N_j(t_0)}{N_j(t_0)} = \frac{M_{j,i^*}}{x_j(t_0)}; \text{ Or,} \quad (32)$$

$$M_{j,i^*} = x_j(t_0)M_{j,i^*}^o$$

Mole fraction terms ($x_j$) can be substituted for mole values in equations (29), (30), and (31). In practice, the molar or mole fraction quantities may be estimated from electrochemical cell design specifications and then $M_j^o$ is determined directly from the equation (32) once $M_j$ is determined via MSM. Thus, for example, the intrinsic extent of reaction for loss of available lithium may be 20% ($M_j^o=0.2$), yet have the effective system-scaled extent be 10% or less ($x_j(t_0)\leq 0.5$).

It is further noted that:

$$\sum_j^{n_j} M_j \approx \sum_j^{n_j} x_j(t_0)M_j^o \quad (33)$$

$$K_j^o = \frac{M_j^o}{1-M_j^o}; K_j = \frac{x_j(t_0)M_j^o}{1-x_j(t_0)M_j^o} \quad (34)$$

and $$K_j^o = \exp\left(\frac{-\Delta G_j^o}{RT}\right) \quad (35)$$

These expressions of equations (33), (34), and (35) may be considered at each arbitrary aging condition (i*). The value of these relationships involving $M_j^o$ is that degradation mechanisms (j) may be isolated and distinctly treated under classical chemical kinetics approaches, enabling a more informed interpretation of performance degradation data that may lead to better cell design, better choice of materials, and so on.

The relationships above involving the $M_j$ terms may further lead to insights about the sensitivity of the system to particular degradation mechanisms (j). For example, later discussion covers datasets that show that $M_j$ may exceed 0.5, even though the corresponding mole fraction is approximately 0.5, yielding a $M_j^o$ value that exceeds unity. This brings up an issue of whether there is always a one-to-one correspondence between the amount of lithium loss or active site loss and true effective capacity fade. In practice, this correspondence may vary ± to 1.0, revealing a sensitivity of the system to either loss of lithium or insertion sites. For example, if MSM regression shows that $M_{sites}$=0.7 while $x_{sites}(t_0) \approx 0.5$, then we obtain $M_j^o$=0.7/0.5=1.4, indicating that loss of insertion sites determined under the SCCs have a multiplied effect on the overall capacity fade. This result essentially states that loss of active sites creates an equivalent ≥40% increase or enhancement of net capacity fade, and a tandem effect on conductance loss. Such a multiplicity effect on capacity fade should be expected in many cases due to the complex interplay between materials and dynamic conditions that produce transport limitations.

To reiterate the emphasis from the preceding, this overall development covers all individual and collective contributions (degradation mechanisms) to performance loss ($\Psi$) (e.g., loss of Li$^+$ and $\theta$, as well as a net lithium source regarding capacity fade), and may evaluate sensitivity of system aging to the prevailing aging parameters. Similar treatment of terms may apply to other performance measures prone to multiple degradation mechanisms (j), such as cell conductance or achievable power.

At each arbitrary aging condition (i*) one goal may be to obtain sufficient representative MSM expressions for the SCCs (e.g., Li$^+$ and $\theta$ losses determined at $C_1/25$ and $C_1/1$ with $T_{standard}$ assumed), because these may be the chosen metric or lens to analyze capacity aging processes over time. In addition, arbitrary MSM parameters ($a_{j*}$, $b_{j*}$, $M_{j*}$) may be determined for each of the standard MSM expressions for characterization (e.g., valid starting at each $t_{start,nj}$ attributable to each degradation mechanism (j)), considering all consecutive arbitrary aging condition (i*) in the aging path of a given battery. Application to other performance measures can be made by choosing the appropriate number of effective constituent MSM expressions for these other measures. For example, in some embodiments, cell conductance loss may require three or four MSM expressions per temperature, derived at the exchange current density, to cover the appropriate constituent terms.

A determination of arbitrary MSM parameters ($a_{j,i*}$, $b_{j,i*}$) is now considered. Arbitrary MSM parameters ($a_{j,i*}$, $b_{j,i*}$) may be the MSM parameters associated with the response of the battery to the arbitrary aging condition (i*). Considering $a_{j,i*}$, this parameter is the overall or effective rate constant for the forward degradation reaction involving a particular degradation mechanism (j) at arbitrary aging condition (i*), looking at the SCC of interest. To begin, the mathematical definition of $a_{j,i*}$, given $(k_f, k_r)_n$ as the forward and reverse rate constants for a given j$^{th}$ degradation mechanism is:

$$a_{j,i*} = (k_f - k_r)_{j,i*} \quad (36)$$

where it is assumed that the terms reference the same order of reaction and hence have identical units. As such, $a_{j,i*}$ may be related to the equilibrium constant $K_{j,i*}$ developed above by considering the thermodynamic consistency of rate expressions. If $b_{i*}$ is the reaction order for the net equilibrium process, then for degradation mechanism (j):

$$\frac{k_{f,j,k,i*}}{k_{r,j,k,i*}} = \frac{a_{j,k,i*} + k_{r,j,k,i*}}{k_{r,j,k,i*}} = (K_{j,k,i*})^{b_{j,k,i*}} \quad (37a, b)$$

for individual k parameters contributing to j $$\frac{k_{f,j,i*}}{k_{r,j,i*}} = \frac{a_{j,i*} + k_{r,j,i*}}{k_{r,j,i*}} = (K_{j,i*})^{b_{j,i*}}$$

for composite or average contribution to j with the purpose of determining $a_{j,i*}$ and $b_{j,i*}$ given a set of k aging parameters that influence the degradation mechanism (j) under arbitrary aging condition (i*). If $(a_{j,i*}, b_{j,i*})_k$ are available from MSM expressions developed for a particular aging scenario involving a specific parameter k, we can solve for k rate constant terms given k-wise MSM parameter values, and then obtain all LHS ratios for equation (37a) for all k. This aspect of maintaining a thermodynamic basis for kinetics is essential for producing a viable modeling approach for complex systems, because the objective here is essentially to arrive at sigmoidal-based rate expressions that represent the effective net degradation under each degradation mechanism (j), given multiple k parameters, at each arbitrary aging condition (i*) along the aging timeline.

It is desirable to have "a" in units that are universally consistent and thus amenable to comparison with each other. The basic MSM expression:

$$\Psi_{i*} = \sum_j \Psi_{j,i*} = \sum_j 2M_j \left[ \frac{1}{2} - \frac{1}{1 + \exp(a_j t^{b_j})} \right]_{i*} \quad (38)$$

for j contributing mechanisms can be reformatted to ensure 'a' always has units of time$^{-1}$ instead of fractional units of time:

$$\Psi_{i*} = \sum_j \Psi_{j,i*} = \sum_j 2M_j \left[ \frac{1}{2} - \frac{1}{1 + \exp((a'_j t)^{b_j})} \right]_{i*} \quad (39)$$

for j contributing mechanisms

The two expression in equations (38) and (39) are functionally equivalent, but the latter standardizes the units of "a." To ensure all $a_{j,i*}$ terms have consistent units of inverse time, the constituent terms in the $a_{j,i*}$ expression above may be converted beforehand to time$^{-1}$ if the $a_{j,i*}$ terms possess fractional units of time that differ according to the value of $b_{j,i*}$:

$$a'_{j,i*} = (a_{j,i*})^{\frac{1}{b_{j,i*}}} \quad (40)$$

And thus the distinction is given herein regarding $a_{j,i*}$ and $a'_{j,i*}$. To maintain proper units of rate constants 'a' throughout, MSM expression of the form in equation (39) should be used for data regression. Using this corrected scale for the rate constant, the appropriate start time for MSM under each degradation mechanism (j) is:

$$t_{start,n,j} = \frac{1}{a'_j} \left( \ln \left( \frac{2M_j}{M_j - \Psi_{j,n-1}} - 1 \right) \right)^{\frac{1}{b_j}} \quad (41)$$

for each contributing degradation mechanism (j) at arbitrary aging condition (i*) at time period n.

The composite value of $a'_{j,i*}$ for a degradation mechanism (j) can be estimated by a differential-based term covering all contributing k aging parameters (consistent with $M_{j,i*}$ derivation), maintaining relation to the baseline condition:

$$a'_{j,i*} = a'_{j,BL} + \begin{bmatrix} \Delta a'_{j,T} + \Delta a'_{j,SOC} + \Delta a'_{j,cyc} + \ldots + \\ \{\Delta a'_{j,SOC\square T} + \Delta a'_{j,cyc\square T} + \ldots \} + \\ \{\text{higher order terms}\} \end{bmatrix}_{i*} \quad (42)$$

and the reaction order parameter $b_{j,i*}$ should be determined through a similar approach:

$$b_{j,i*} = b_{j,BL} + \begin{bmatrix} \Delta b_{j,T} + \Delta b_{j,SOC} + \Delta b_{j,cyc} + \ldots + \\ \{\Delta b_{j,SOC\square T} + \Delta b_{j,cyc\square T} + \ldots \} + \\ \{\text{higher order terms}\} \end{bmatrix}_{i*} \quad (43)$$

for all such k parameters that impact a degradation mechanism (j) at arbitrary aging condition (i*). The terms $\Delta a'_k$ and $\Delta b_k$ are determined similarly as related $\Delta M$ terms discussed earlier; their numerical derivation and management are discussed later. As developed, the MSM parameters at arbitrary aging condition (i*) are derived using an identical differential approach, insuring a consistent basis for establishing these parameters at arbitrary aging conditions (i*). In practice, the MSM parameters for each degradation mechanism (j) may be assessed at each relevant point in time such as at the $t_{start,n}$ values mentioned above to ensure a consistent basis for assessing the effective parameters at each unique aging condition (i).

Therefore, with MSM parameters ($a'_{i*}$, $b_{i*}$, $M_{i*}$) estimated for all degradation mechanisms (j), $t_{start,n,j}$ can be directly determined for each degradation mechanism (j) at n using equation (41). Once done, all other MSM expressions requiring $t_{start,n,j}$ can be utilized, for example to determine performance degradation rates related to SCCs. Recall the rate of change in a general MSM expression for arbitrary aging condition (i*) is summed over all contributing degradation mechanisms (j):

$$\frac{d\Psi_{i*}}{dt} = r_{i*}^{MSM} \quad (44)$$

$$= \frac{d}{dt}(MSM)_{i*}$$

$$= \sum_j \left[ \frac{2M_j a_j b_j t^{b_j - 1} \exp(a_j t^{b_j})}{(1 + \exp(a_j t^{b_j}))^2} \right]_{i*}$$

or, using a' notation:

$$\frac{d\Psi_{i*}}{dt} = r_{i*}^{MSM} \quad (45)$$

$$= \frac{d}{dt}(MSM)_{i*}$$

$$= \sum_j \left[ \frac{2M_j a'^{b_j}_j b_j t^{b_j - 1} \exp((a'_j t)^{b_j})}{(1 + \exp((a'_j t)^{b_j}))^2} \right]_{i*}$$

and thus a change in MSM parameters (a, b, M) at a new (different) arbitrary aging condition (i*) may have a corresponding effect on the rate values.

A general comment is in order regarding the magnitudes of successive prevailing degradation mechanisms (j) and their upper limits. If $M_{n-1}$ and $M_n$ are the MSM upper limits of degradation for a given degradation mechanism (j) (e.g., $Li^+$ or $\theta$) predominant at time periods n−1 and n, respectively, then if $\{M_{n-1} < M_n\}$, growth may occur in performance losses ($\Psi_{net,n}$), yet if $\{M_{n-1} \geq M_n\}$ and $\{\Psi_{n-1} \geq \Psi_n\}$, essentially zero growth may occur in degradation at the beginning of the $n^{th}$ period, because it appears infeasible from a thermodynamics and kinetics viewpoint that continued performance degradation would occur because the extent(s) of reaction(s) has already progressed to a limiting level (at least under net growth). Thus, under the latter case performance loss ($\Psi$) may tend to plateau during part or all of the $n^{th}$ time period, or perhaps diminish slightly if there are reversible kinetic aspects to the degradation mechanisms (j). This artifact may be exploited to customize late-life cell usage protocols to extend cell life by avoiding accelerated degradation rate scenarios and focusing more on conditions that yield decelerated or near zero aging rates.

Barring extreme abusive cell conditions, it is generally held that most common cell aging conditions (i) follow the same basic degradation mechanisms (j) (e.g., for cell capacity: loss of free available lithium ($Li^+$) and loss of active host ingress/intercalation active sites ($\theta$)), and that it is the choice of aging conditions (i) that has a corresponding effect on the rate of performance degradation under these degradation mechanisms (j). Some arbitrary aging conditions (i*) may accelerate the aging rates of the basic degradation mechanisms relative to the baseline, while other arbitrary aging conditions (i*) may decelerate the rates. In a MSM modeling sense this may be tied to the emergent MSM parameters (a, b, M) for the degradation mechanisms (j) within each arbitrary aging condition (i*). In particular we desire to estimate how aging conditions at arbitrary aging condition (i*) drive the degradation mechanisms forward $(k_f \square k_r)_{j,i*}$ as manifest by a high degradation rate and a large magnitude of $K_{M_{i*}}$ at a given degradation mechanism (j). In general, large $K_{M_{i*}}$ may be seen when the MSM parameters (a, b, M) are relatively large. Behavior of MSM parameters (a, b, M) over arbitrary aging condition (i*) is due to net reaction kinetics of the effective degradation mechanisms (j), reactant availability, thermodynamic processes within the cell, cell chemistry effects, as well as particle design, and physics. These factors may change over time, making it more challenging to model these complex systems, thus underscoring the value and utility of the robust MSM methodology.

5. Test Matrix

A baseline aging condition may be chosen that contains representative values for all pertinent k parameters such as temperature, state of charge (SOC), cycling or pulse frequency and severity, etc., and the MSM parameters (a, b, M) may be determined at the baseline condition. For example, this baseline condition may be the cycle-life conditions for Gen2 Li-ion cells at 25° C., 60% SOC, and a $C_1/25$ cycling rate. For the sake of consistency, the baseline for performance loss will be denoted as $\Psi_i(t)$, as before (or alternately, $\Psi_{BL}(t)$). For a real system with arbitrary time-variable arbitrary aging condition (i*(t)), the true extent of performance loss ($\Psi_{i*}(t)$) at a given time may be expressed as a plus or minus variance ($\Delta\Psi$, per above) with the baseline. In this way, the conditions under which performance degradation kinetics are accelerated and decelerated relative to the baseline aging condition may be obtained. Also, the comparison of the various $\Delta\Psi$ terms may indicate what aging regimes affect performance loss most and least in relative terms. As a result, MSM expressions may be utilized or adapted within a baseline context.

One of the overall challenges of this approach is to accurately assign reaction rates, associated rate constants, and reaction orders for the various arbitrary aging condition (i*) regions along the timeline for the constituent performance loss ($\Psi$) from the degradation mechanisms (j). This may be particularly difficult due to combinatorial effects of different degradation mechanisms (j) as well as the relatively limited data at conditions that would lend themselves to meaningful interpolation. Having MSM parameters (a, b, M) be expressed as functions of an arbitrary aging condition (i*) (e.g., T, SOC, cycL/calL, etc.) is one possibility with the baseline as the default; however, a substantial amount of data may be needed to establish the correct analytical forms of these MSM parameters (a, b, M). As discussed above, adopting a baseline aging condition permits the setting of a frame of reference from which deviations may be determined, provided that the deviations are single-dimensioned from the baseline (e.g., aging at a condition identical to the baseline, but at a higher temperature).

The regimes under which MSM parameters (a, b, M) are to be derived may be defined in order to achieve modeling under the relevant arbitrary aging condition (i*). These should include various aging parameters (k) (stress factors) that exist and vary under battery usage. Examples of such aging parameters (k) may relate to aging conditions (i) such as temperature, SOC, calL (over T and SOC), cycL (over T and SOC) at some meaningful duty cycle that pertains to the intended application, some representation of how charging-rate variance may also affect the aging process, an estimate of how localized joule heating may accelerate the reaction rates (internal temperature profiles can have substantial hot spots wherein degradation will occur more rapidly, where the overall effect may be tied to power or pulse severity and may be more exaggerated at greater aging), and special case conditions anticipated under the application (e.g., daily thermal cycling).

In real-world situations, there is unlikely to be a single degradation mechanism (j), but rather, a multitude of reactions and physical and mechanical processes that may occur simultaneously, and in other cases only under narrowly defined conditions (e.g., charging too fast, repeated over-discharging, etc.). It would be difficult, if not infeasible, to model all individual reactions and their collective effect on performance loss ($\Psi$) within the complex spatially variant heterogeneous battery environment. Thus, the foremost contributions from the degradation mechanisms (j) for performance loss ($\Psi$) may be sought out and rendered in this approach. Degradation processes en masse will be evaluated, and then broken down into plausible net contributions to each specific group of degradation mechanisms (j) (e.g., reaction pathways) that affect for example available $Li^+$ and active site $\theta$ in capacity of Li-ion cells, ohmic and interfacial impedances, etc. By comparing the reaction rates, rate constants, and reaction orders of these constituent degradation mechanisms (j) may permit individual reactions or classes of reactions that underlie the aging process to be determined.

In light of the above discussion, the generation of a test matrix is described for aging conditions (i) that will facilitate MSM diagnostic analysis, sensitivity analysis of the various aging parameters (k), and will enable MSM-based predictions of performance loss ($\Psi$) for off-matrix or arbitrary aging conditions (i*). Such a test matrix may be desired because a minimum amount of performance may be cataloged over real-world conditions for each cell chemistry and configuration. Again, although the immediate application demonstrated herein is capacity fade in Li-ion cells over time, there are numerous other performance measures and applications that can benefit from the collective methodology treated herein. Table 1 should be tailored to accommodate the focus of such alternate measures and applications.

TABLE 1

Summary of aging conditions and related aging parameters (k) to populate a test matrix for MSM-based modeling and predictions. MSM parameters (a, b, M) for each degradation mechanism (j) and SCC would be assessed at the indicated conditions.

| Mode | Temperature | | SOC | | Power or Pulse Level, or energy throughput rate** | | Special (charging rates) | |
|---|---|---|---|---|---|---|---|---|
| | $T_1$ | $T_2$ | $SOC_1$ | $SOC_2$ | $PL_1$ | $PL_2$ | $C_{ch,1}$ | $C_{ch,2}$ |
| calL* | $T_{BL}$ | $(T_2)$ | $SOC_{BL}$ | $(SOC_2)$ | | | | |
| cycL | $T_{BL}$ | $T_2$ | $SOC_{BL}$ | $(SOC_2)$ | $PL_{BL}$ | $PL_2$ | $C_{ch,BL}$ | $C_{ch,2}$ |
| Baseline (BL), cycL | $T_{BL}$ | | $SOC_{BL}$ | | $PL_{BL}$ | | $C_{ch,BL}$ | |

*pulse-per-day recommended, with top-off charge to recommended storage SOC. Conditions in parentheses may be optional.
**or, duty cycle and frequency thereof.
Total conditions (minus optional conditions): Baseline, cycL (1) + calL (1) + cycL ($BL/T_2$ + $BL/PL_2$ + $BL/C_{ch,2}$) = 5
Total conditions (with optional conditions): 5 + calL ($BL/T_2$ + $BL/SOC_2$) + cycL ($BL/SOC_2$) = 8

The indicated baseline and non-baseline conditions represent or at least partially bracket anticipated aging conditions (i) to be experienced by batteries in their intended application. The aging conditions (i) in Table 1 represent single-parameter deviation from the baseline, so that the effect from each parameter on the aging rate may be isolated, and their impact on path dependence may be discerned. Combinatorial effects are not represented directly, but could be included by looking at the pair-wise interaction effect of the foremost aging factors, such as temperature and pulse level, such as, for example, the condition of cycL BL/($T_2$ and $PL_2$). As such, at this point there are at least nine sets of aging conditions (i) identified that may age batteries, which in turn may yield sufficient information to train the MSM to perform modeling and predictions for arbitrary aging conditions (i*) in line with the anticipated product application and usage. For capacity fade, a total of thirty-six MSM expressions (and related sets of parameters) may be determined through regression analysis of these nine sets of aging conditions (i), given that the two foremost degradation mechanisms (j) and two SCCs are primarily considered. Lastly, having a two-value-per-parameter basis assumes linear behavior between parameter and the response. If higher resolution is sought, it may be desirable to use more than two values for a particular parameter (e.g., three temperatures).

In addition, for the purpose of model validation there may be a dedicated population of batteries that undergo a prescribed variable aging regimen (e.g., mock aging conditions (i*)) at conditions relatable to those listed in Table 1. That is, some batteries may experience PD-based aging to compare model predictions for the PD profile (as inferred from Table 1 cell data) to actual PD aging data. For example, a basic PD study for this type of a demonstration may involve ten groups of batteries.

The batteries undergoing the above testing may be subjected to a periodic, such as a monthly, reference performance test (RPT) that includes the SCCs mentioned earlier. It may be desired to perform RPTs more frequently if the aging conditions (i) are severe enough to greatly accelerate the rate of performance fade. The data from the RPTs is used within a regression scheme to determine the MSM parameters (a, b, M) that will be particular to a given aging condition (i). Thus, the above matrix yields MSM parameters (a, b, M) for all performance losses from degradation mechanisms (j) for each SCC under each test condition (for capacity fade this is generally four MSMs per condition), enabling an evaluation of how the MSM parameters (a, b, M) vary with those of the baseline MSM matrix. MSM parameters (a, b, M) at an arbitrary aging condition (i*) may be inferred for each MSM analysis under each SCC, and determinations may be made regarding deviation from the baseline MSM parameters and related aging rates. As mentioned, the baseline provides a standard point of reference that is used to judge the relative contributions of the various test parameters to the overall aging process. In other words, implementation of a baseline-based matrix may permit the determination of how the aging process is sensitive to a given parameter or set of parameters.

6. Derivation of MSM Parameters at Arbitrary Aging Condition (i*)

The numerical treatment of differential terms may be considered in light of expressions such as equations (9) and (14). For time-variable performance loss ($\Psi(t)$) data for single k-type aging parameters (or "stress factors") A, B, C, . . . on degradation mechanism (j), as in Table 1, single-parameter deviations from the baseline for a given degradation mechanism (j) are:

$$\Delta\Psi_A = \Psi_{BL} - \Psi_A$$

$$\Delta\Psi_B = \Psi_{BL} - \Psi_B \quad (46)$$

etc.

and the differential terms:

$$\frac{d\Psi_{net}}{dA} \cong \frac{\Delta\Psi_A}{A_{BL} - A} \quad (47)$$

$$\frac{d\Psi_{net}}{dB} \cong \frac{\Delta\Psi_B}{B_{BL} - B}$$

etc.

which are further evaluated at distinct aging times. At an arbitrary aging condition (i*) for A under arbitrary aging condition (i*), denoted A*:

$$\frac{d\Psi}{dA} \cong \frac{\Delta\Psi_A}{A_{BL} - A} \quad (48), (49)$$

$$\frac{\Psi_{BL} - \Psi_{A^*}}{A_{BL} - A^*} \stackrel{!}{=} \left(\frac{d\Psi}{dA} \cong \frac{\Delta\Psi_A}{A_{BL} - A}\right)$$

and thus the linear interpolation $$\Psi_{A^*} \cong \Psi_{BL} - (\Psi_{BL} - \Psi_A)\left(\frac{A_{BL} - A^*}{A_{BL} - A}\right)$$

and likewise for all remaining aging parameters for degradation mechanism (j). The following expression agrees with the previous result, allowing for slight differences in notation:

$$\Delta\Psi_{J,i^*,A} \equiv \left(\frac{\partial\Psi_j}{\partial A}dA\right)_{i^*} \approx \left(\frac{\Psi_{BL} - \Psi_{per\Delta A \text{ in test matrix}}}{A_{BL} - A_{per \text{ test matrix}}}\right)(A_{i^*} - A_{BL}) \quad (50)$$

The resultant numerical expressions may be more accurate for smaller deviations of A from $A_{BL}$. While these results are informative, the performance loss ($\Psi$) terms may be time-dependent, and as such are evaluated at each point in time.

The deviation from baseline may also be reflected in the MSM parameters (a, b, M):

$$\Delta a'_A = a'_{BL} - a'_A; \Delta b_A = b_{BL} - b_A; \Delta M_A = M_{BL} - M_A$$

$$\Delta a'_{A^*} = a'_{BL} - a'_{A^*}; \Delta b_{A^*} = b_{BL} - b_{A^*}; \Delta M_{A^*} = M_{BL} - M_{A^*} \quad (51)$$

etc. for all relevant aging parameters.

Note that these $\Delta$ terms for MSM parameters (a, b, M) may not change over time within their applicable $\Delta t_n$ period. The $\Delta$ terms and differential terms above may have positive or negative values. The differential terms for MSM parameters (a, b, M) with respect to aging parameters may be evaluated similar to that of the performance losses ($\Psi$). For example, regarding the change of MSM parameter "a" over aging parameter "A"

$$\frac{da'}{dA} \cong \frac{\Delta a'_A}{A_{BL} - A} \quad (52), (53)$$

$$\frac{a'_{BL} - a'_{A^*}}{A_{BL} - A^*} \stackrel{!}{=} \left(\frac{da'}{dA} \cong \frac{\Delta a'_A}{A_{BL} - A}\right)$$

and thus $$a'_{A^*} \cong a'_{BL} - (a'_{BL} - a'_A)\left(\frac{A_{BL} - A^*}{A_{BL} - A}\right)$$

and so forth for all remaining aging parameters. Or, expressing in another way:

$$\Delta a'_{j,i^*,A} \equiv \left(\frac{\partial a'_j}{\partial A}dA\right)_{i^*} \approx \left(\frac{a'_{BL} - a'_{per\Delta A \text{ in test matrix}}}{A_{BL} - A_{per \text{ test matrix}}}\right)(A_{i^*} - A_{BL}) \quad (54)$$

A similar evaluation may be performed for MSM parameters "b" and "M." Once the relevant single aging factors have been evaluated for conditions that constitute an arbitrary aging condition (i*), the composite values may be determined via the previous development based on kinetic rate terms, which may yield effective MSM parameters (a, b, M)$_{j,i^*}$ for each SCC. Whether a linear response is justified over a given range of "A" may be reviewed case-by-case, especially regarding temperature.

The supporting baseline approach and test matrix in Table 1 may aid in establishing relationships between aging parameters and MSM parameters (a, b, M). Once the MSM parameters (a, b, M) are estimated per the above methods, $t_{start}$ may be assessed via equation (41) for each degradation mechanism (j), per each SCC, at the beginning of each new arbitrary aging condition period.

7. Evaluation of Error Terms

Experimental data may contain some element of "error," whether the error is based on measurement error such as bit limitations, cell-to-cell variability, experimental variability of conditions, etc. The MSM formalism may be expressed by adding the assemblage of error terms to the true response term:

$$\Psi_{i^*} = \left(\sum_{j}^{n_j} \Psi_{j,i^*}\right)_{true} + \sum_{m=1}^{n_e} e_m(t) \quad (55)$$

where $$\sum_{m=1}^{n_e} e_m(t) = e(t)_{measurement} + e(t)_{experimental} + \quad (56)$$

$$e(t)_{calculation} + e(t)_{manufacture} + e(t)_{error\ variability} \text{ etc.}$$

By separating the true response from the error terms, the chemical kinetics fidelity of the MSM parameters (a, b, M) may remain relatively high. The various terms may be positive, negative, or zero. It is noted that error terms may change over aging time, which may complicate the error analysis. The examples given herein are simplified in that the examples neglect the error terms, which may be appropriate for some embodiments. However, inclusion of the error expressions in equations (55) and (56) may be sufficient to establish a quantitative approach toward data uncertainty in cases where such treatment is desired. Assignment of error terms may introduce a weakness into the data analysis process, because some of the error terms may not be accurately determined for each unique data set, especially considering the error terms' change over time. In some embodiments, it may be desirable that conservative estimates of e(t) error terms be utilized only when the error terms may be substantiated through statistical analyses.

offsets for $C_1/1$ data that is due to the initial gap between $C_1/1$ and $C_1/25$ discharge capacities, as is attributed to transport limitations at the higher cycling rate.

Figure 4:
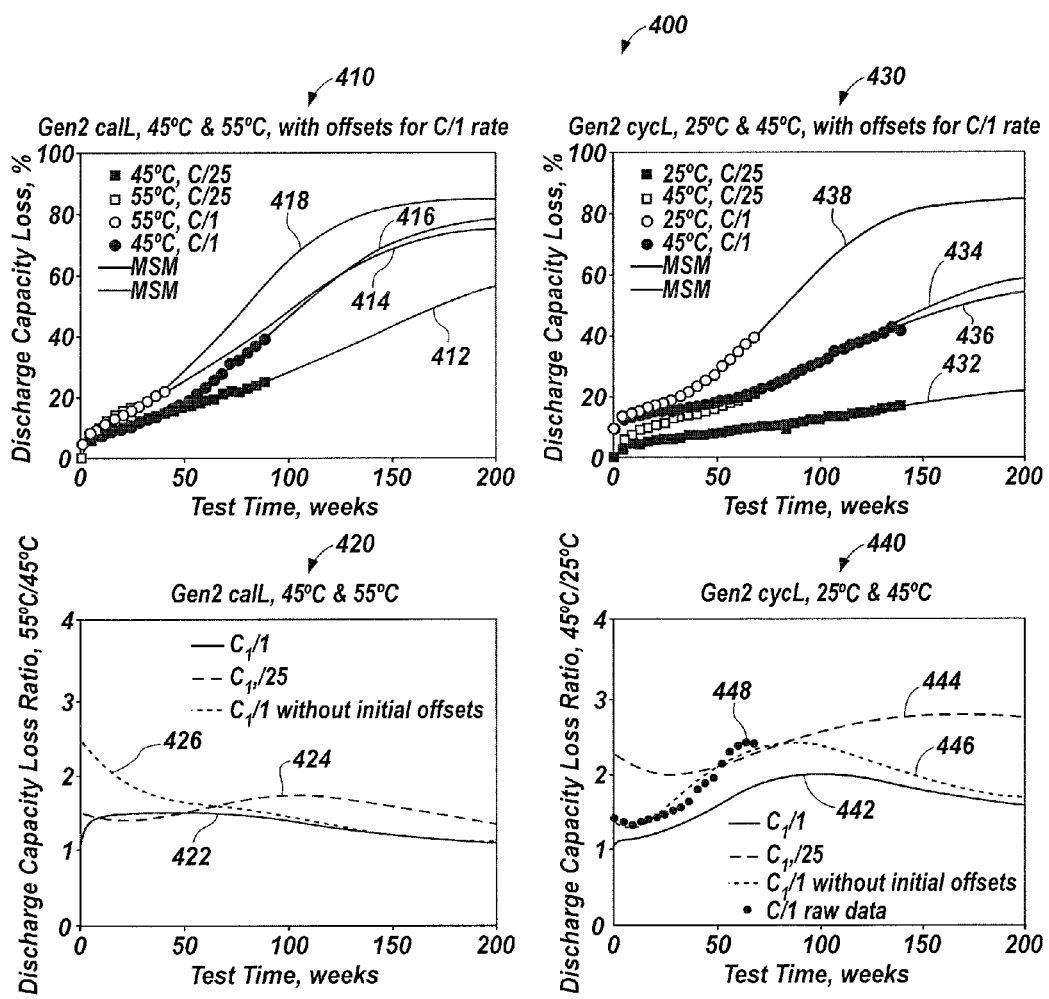
FIG. 4 is a set of graphs that show discharge capacity loss data and MSM results for calendar-life and cycle-life aging data for various temperatures over time, and for various cycling rates.

FIG. 4 is a set of graphs 400 that show discharge capacity loss data and MSM results for calendar-life (graphs 410, 420) and cycle-life (graphs 430, 440) aging data for various temperatures over time, and for various cycling rates.

Capacity fade ratios at different temperatures are seen to vary over time and magnitude of cycling rate. For example, with the calendar-life condition shown in graph 410, line 412 shows the MSM results associated with the first scenario (45° C., $C_1/25$), line 414 shows the MSM results associated with the second scenario (55° C., $C_1/25$), line 416 shows the MSM results associated with the third scenario (45° C., $C_1/1$), and line 418 shows the MSM results associated with the fourth scenario (55° C., $C_1/1$). For determining the discharge capacity loss ratios of 55/45° C. shown in graph 420, line 422 shows the loss ratio for the $C_1/1$ rate, line 424 shows the loss ratio for the $C_1/25$ rate, and the line 426 shows the loss ratio for the $C_1/1$ rate without initial offsets.

For comparison, for the cycle-life condition shown in graph 430, line 432 shows the MSM results associated with the first scenario (25° C., $C_1/25$), line 434 shows the MSM results associated with the second scenario (45° C., $C_1/25$), line 436 shows the MSM results associated with the third scenario (25° C., $C_1/1$), and line 438 shows the MSM results associated with the fourth scenario (45° C., $C_1/1$). For determining the discharge capacity loss ratio of 45/25° C. shown in graph 440, line 442 shows the loss ratio for the $C_1/1$ rate, line 444 shows the loss ratio for the $C_1/25$ rate, and the line 446 shows the loss ratio for the $C_1/1$ rate without initial offsets, and plot 448 shows the $C_1/1$ raw data used in the analysis.

TABLE 2

MSM parameters from raw regression of Gen2 lithium-ion cell data.

| Aging Test Condition | Cycling Rate | j | $a_j$ [weeks$^{-bj}$] | $b_j$ | $M_j$ [%] | Test data range (wks) |
|---|---|---|---|---|---|---|
| cycL at 25° C., 60% SOC (baseline cells) | $C_1/25$ | θ | 1.564 × 10$^{-4}$ | 1.6763 | 34.1035 | 140 |
| | | Li$^+$ | 0.3520 | 0.6211 | 5.8965 | 140 |
| cycL at 45° C., 60% SOC (baseline cells) | $C_1/25$ | θ | 4.535 × 10$^{-5}$ | 2.1787 | 36.363 | 68 |
| | | Li$^+$ | 0.4409 | 0.4993 | 13.000 | 68 |
| cycL at 45° C., 60% SOC (VARC cells) | $C_1/25$ | θ | 6.465 × 10$^{-5}$ | 1.9112 | 26.000 | 124 |
| | | Li$^+$ | 0.1381 | 0.6698 | 12.000 | 124 |
| | | source | 8.632 × 10$^{-7}$ | 3.960 | −2.4227 | 124 |
| cycL at 25° C., 60% SOC (baseline cells) | $C_1/1$ | θ | 1.856 × 10$^{-5}$ | 2.3662 | 31.9019* | 140 |
| | | Li$^+$ | 0.3750 | 0.6994 | 5.0981* | 140 |
| cycL at 45° C., 60% SOC (baseline cells) | $C_1/1$ | θ | 5.115 × 10$^{-6}$ | 3.0368 | 25.000* | 68 |
| | | Li$^+$ | 0.3507 | 0.4373 | 11.000* | 68 |
| cycL at 45° C., 60% SOC (VARC cells) | $C_1/1$ | θ | 4.220 × 10$^{-5}$ | 2.0833 | 22.0972* | 124 |
| | | Li$^+$ | 0.1011 | 0.7220 | 10.7722* | 124 |
| | | source | 1.745 × 10$^{-3}$ | 1.9282 | −5.7582 | 124 |

*plus applicable BOL offset unique to each aging test condition.

8. Simplifications Regarding MSM Parameters

In some embodiments, it may be desirable to know how to manage the MSM parameters (a, b, M) when temperature is an aging condition (i) of interest, because the MSM parameters (a, b, M) may exhibit an Arrhenius-type behavior over temperature. For example, two independent datasets may be considered. The first case may consider a hypothetical battery that is tested and aged under both calendar-life conditions and cycle-life conditions. Table 2 below summarizes raw MSM regression results of capacity fade data, listing MSM parameters (a, b, M) based on data given in FIG. 4. Note that the FIG. 4 results include capacity fade From Table 2 it is seen that $b_j$ are reasonably consistent for each of the degradation mechanisms (j) of Li$^+$ and θ. Excluding an occasional outlier, the averages of $b_j$ for Li$^+$ and θ-related degradation mechanisms are 0.608 and 2.024, respectively. This result suggests that the reaction-order terms may be assigned constant values over temperature and the aging condition (i). This approach was adopted to streamline management of MSM parameters (a, b, M) over arbitrary aging conditions (i*) as would exist under PD scenarios, where $b_{Li+}$=0.6 and $b_θ$=2.0 were chosen. Because $b_j$ reflect the type of degradation mechanism (j) at work, then $b_j$ should remain constant insomuch as the degradation mechanism types do not change between temperatures of interest. Based on these choices for $b_j$, the data represented in Table 2 may be re-analyzed under a second-tier regression, and MSM parameters were re-determined. The result of such a second-tier regression analysis is shown in Table 3, which contains a compilation of MSM parameters for both calendar-life and cycle-life aging data. Collectively, the experimental conditions shown in Table 3 may serve as a minimal PD matrix covering temperature and calendar-life vs. cycle-life aging, and as such, enable activation energies to be determined for the overall aging processes and related degradation mechanisms (j).

TABLE 3

MSM parameters from regression of Gen2 lithium-ion baseline cell data covering calL and cycL conditions, setting b = 0.6 for $Li^+$ consumption-related degradation mechanisms and b = 2.0 for θ-related degradation mechanisms. In all cases $R^2 \geq 0.9925$.

| Aging Test Condition | Cycling Rate | j | $a_j$ [weeks$^{-bj}$] | $b_j$ | $M_j$ [%] | Test data range (wks) |
|---|---|---|---|---|---|---|
| Cycle-life Aging Conditions | | | | | | |
| cycL at 25° C., 60% SOC | $C_1/25$ | θ | 6.670 × 10$^{-5}$ | 2.0 | 16.41 | 140 |
| | | $Li^+$ | 0.3211 | 0.6 | 6.641 | 140 |
| cycL at 45° C., 60% SOC | $C_1/25$ | θ | 8.007 × 10$^{-5}$ | 2.0 | 50.58 | 68 |
| | | $Li^+$ | 0.4347 | 0.6 | 11.14 | 68 |
| cycL at 25° C., 60% SOC | $C_1/1$ | θ | 8.559 × 10$^{-5}$ | 2.0 | 42.74* | 140 |
| | | $Li^+$ | 0.6885 | 0.6 | 4.496* | 140 |
| cycL at 45° C., 60% SOC | $C_1/1$ | θ | 1.604 × 10$^{-4}$ | 2.0 | 70.00* | 68 |
| | | $Li^+$ | 0.8414 | 0.6 | 5.111* | 68 |
| Calendar-life Aging Conditions | | | | | | |
| calL at 45° C., 60% SOC | $C_1/25$ | θ | 5.406 × 10$^{-5}$ | 2.0 | 52.27 | 88 |
| | | $Li^+$ | 0.3000 | 0.6 | 14.34 | 88 |
| calL at 55° C., 60% SOC | $C_1/25$ | θ | 1.171 × 10$^{-4}$ | 2.0 | 58.52 | 40 |
| | | $Li^+$ | 0.3819 | 0.6 | 16.99 | 40 |
| calL at 45° C., 60% SOC | $C_1/1$ | θ | 1.191 × 10$^{-4}$ | 2.0 | 70.00* | 88 |
| | | $Li^+$ | 0.3242 | 0.6 | 4.200* | 88 |
| calL at 55° C., 60% SOC | $C_1/1$ | θ | 1.806 × 10$^{-4}$ | 2.0 | 72.00* | 40 |
| | | $Li^+$ | 0.4342 | 0.6 | 7.750* | 40 |

*plus applicable BOL offset unique to each aging test condition.

From the second-tier regression analysis of the MSM data per Table 3, it is seen that both $a_j$ and $M_j$ parameters may exhibit a temperature dependence. That is, both the rate constants and theoretical extents of reaction may increase with increasing temperature. These trends may depend on which aging conditions (i) were used and which degradation mechanism (j) was being considered. The overall assumption that the $b_j$ parameters are invariant over temperature appears justified in light of the logical results in Table 3 and in light of the fact that regression remains very accurate, having $R^2 \geq 0.9925$ in all cases. Arrhenius plots of the $a'_j$ and $M_j$ parameters are given in FIG. 5, wherein the activation energies are listed for each unique aging condition and related degradation mechanism. The $a'_j$ values shown have been standardized to units of time$^{-1}$ through use of equation (40).

Figure 5:
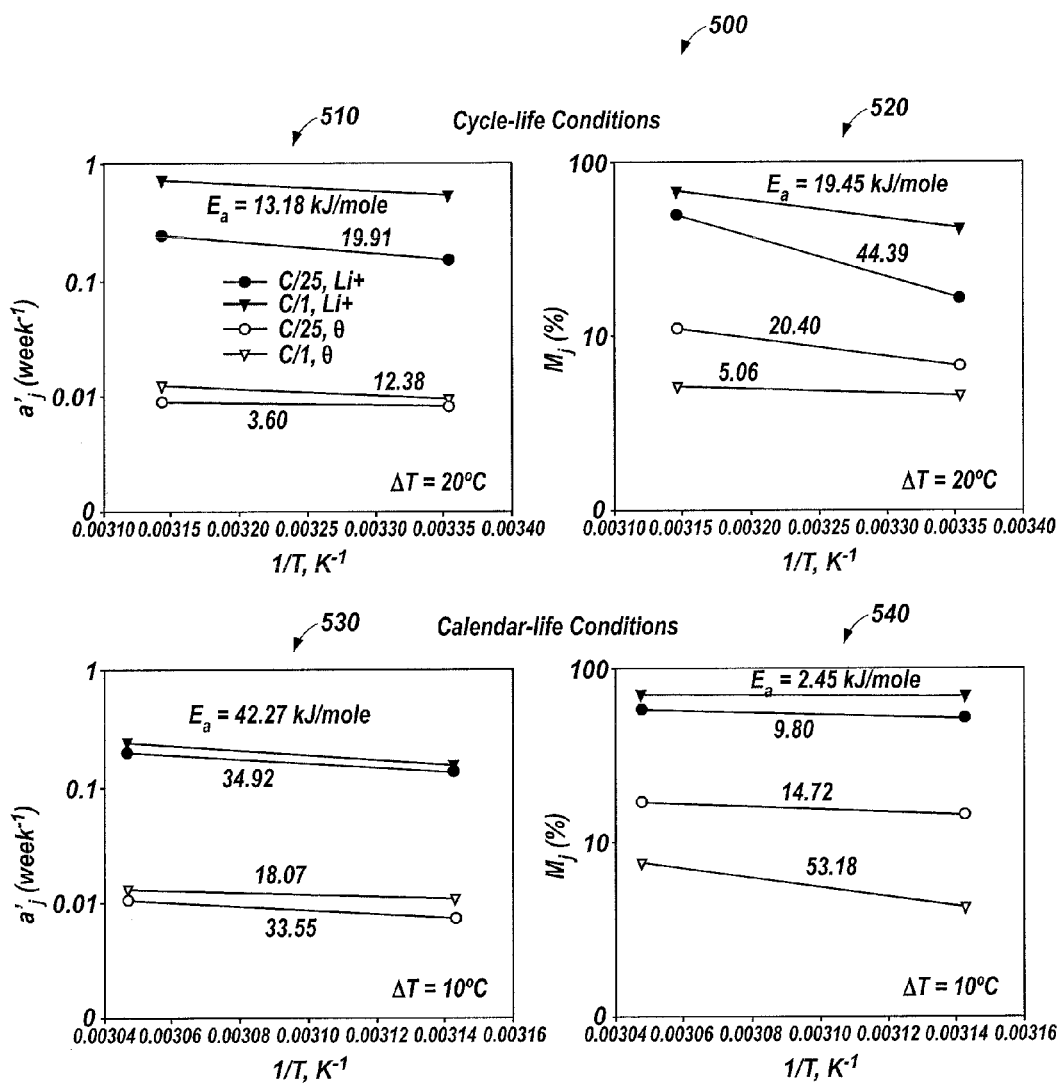
FIG. 5 is a set of graphs showing Arrhenius analyses of MSM parameters $a'_j$ and $M_j$ for the regression results obtained for the data from FIG. 4.

FIG. 5 is a set of graphs 500 showing Arrhenius analyses of MSM parameters $a'_j$ and $M_j$ for the regression results obtained for the data from FIG. 4. For example, a first graph 510 and a second graph 520 show the cycle-life conditions of the MSM parameters $a'_j$ and $M_j$, respectively. A third graph 530 and a fourth graph 540 show the calendar-life conditions of the MSM parameters $a'_j$ and $M_j$, respectively. The trends over temperature generally indicate that these MSM parameters $a'_j$ and $M_j$ are valid candidates for Arrhenius treatment and may be handled as such when determining MSM parameters for an arbitrary temperature of a given arbitrary aging condition (i*).

The general form of the Arrhenius expression for activation energy ($E_a$) of an arbitrary variable $\chi$ at two temperatures, given the universal gas constant R:

$$E_a(\chi) = -R\left[\frac{\ln\chi_2 - \ln\chi_1}{\frac{1}{T_2} - \frac{1}{T_1}}\right] \quad (57)$$

From this general form of the Arrhenius expression in equation (57), expressions may be provided for MSM parameters a' and M that are correct functions of temperature, without the need for linear interpolation as per equations (53) and (54):

$$a'_{j,T_i^*} = a'_{j,T_{BL}} \exp\left[\frac{E_{a,a'_j}}{R}\left(\frac{1}{T_{BL}} - \frac{1}{T_{i^*}}\right)\right] \quad (58a)$$

where:

$$\Delta a'_{j,i^*,T} \equiv \left(\frac{\partial a'_j}{\partial T} dT\right)_{i^*} \approx a'_{j,T_{i^*}} - a'_{j,T_{BL}} \quad (58b)$$

and, likewise for M:

$$M_{j,T_{i^*}} = M_{j,T_{BL}} \exp\left[\frac{E_{a,M_j}}{R}\left(\frac{1}{T_{BL}} - \frac{1}{T_{i^*}}\right)\right] \quad (59a)$$

$$\Delta M_{j,i^*,T} \equiv \left(\frac{\partial M_j}{\partial T} dT\right)_{i^*} \approx M_{j,T_{i^*}} - M_{j,T_{BL}} \quad (59b)$$

Figure 6:
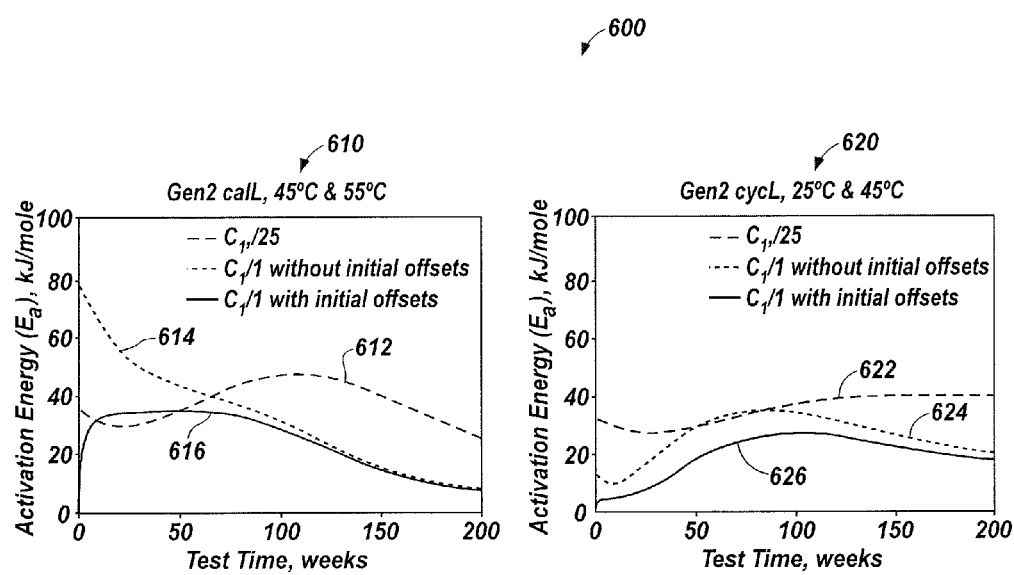
FIG. 6 is a set of graphs showing the activation energies related to capacity fade for the conditions given in FIG. 4, based on MSM representations of the data and predicted performance past the end of testing.

It may also be useful to characterize activation energies for actual performance fade data or related MSM trend lines. FIG. 6 is a set of graphs 600 showing the activation energies related to capacity fade for the conditions given in FIG. 4, based on MSM representations of the data and predicted performance past the end of testing. For example, a first graph 610 shows activation energies ($E_a$) from Arrhenius analysis of the calendar-life regression results obtained for the data of FIG. 4. A second graph 620 shows activation energies ($E_a$) from Arrhenius analysis of the cycle-life regression results obtained for the data of FIG. 4.

The trends over time generally infer that such changes in the activation energy ($E_a$) are due to how the various degradation mechanisms (j) progress within the batch reactor scenario of the heterogeneous electrochemical cell environment. The activation energy ($E_a$) values may change over time, which may occur due to how the various degradation mechanisms (j) emerge within the batch reactor scenario of the heterogeneous electrochemical cell environment, making the results directly tied to the cell chemistry and electrode design. Most values fall within the range of 10-45 kJ/mole.

From the first graph 610, the calendar-life conditions are shown to generally yield $C_1/1$-related activation energies (line 614) that are relatively high at an early time, then taper down markedly, while the $C_1/25$-related activation energies (line 612) show a maximum about midway through the shown unique aging period ($\Delta t_n$). Line 616 shows the activation energy related to $C_1/1$ without initial offsets. The second graph 620 shows opposite trends in some regards for the cycle life condition results, particularly for $C_1/1$-related activation energy conditions (line 624). The $C_1/25$-related activation energies (line 622) exhibit less variation for the second scenario (second graph 620) vs. the first scenario (first graph 610). Line 626 shows the activation energy related to $C_1/1$ without initial offsets.

Although the shown curves are for the overall or net capacity fade as a function of time, degradation mechanism-specific analyses may also be performed. Such collective information may be useful toward understanding the energetic impact of degradation mechanisms (j) over time and seeing how a change in battery chemistry, electrode particle design, and usage pattern (calL vs. cycL) may have a positive influence toward improving battery performance.

A miming average for activation energies ($E_a$) may be defined in a similar fashion as equations (24a and 24b). Such a running average for activation energies ($E_a$) may be defined as:

$$E_{a,ave,j,i^*}(t_{net}) = \frac{1}{t_{net}} \int_{t=0}^{t_{net}} E_{a,j,i^*}(t) \, dt_{i^*} = \frac{1}{t_{net}} \sum_{i^*=1}^{n_t} E_{a,j,i^*} \Delta t_{i^*} \quad (60)$$

and $$E_{a,ave,i^*}(t_{net}) = \sum_{j=1}^{n_j} E_{a,ave,j,i^*}(t_{net}) \quad (61)$$

The activation energies ($E_a$) may be improved over time ($t_{net}$) through intelligent choice of aging conditions (i) and the sequence thereof within the intended application. For example, the sequence of aging conditions (i) may be controlled at the primary application of the battery in order to extend the life of the battery during primary use of the battery. In addition, during use of the battery, thermal management systems may be designed to better handle aging conditions and the sequence of aging conditions (i) imposed upon the battery in order to further extend the primary life of the battery. In addition, the sequence of the aging conditions (i) may be monitored in order to extend the secondary usage life of a battery. For example, an automotive battery pack may be considered to have expired its usable life for its primary use in a vehicle; however, the battery pack may still have sufficient usable life remaining for secondary applications, such as using within a grid storage system. Knowledge regarding the sequence of the aging conditions (i) may be useful in determining the order of such secondary uses in order to further extend the life of the battery within the secondary market.

9. SNL Power Fade Data from Accelerated Life Testing

Figure 7:
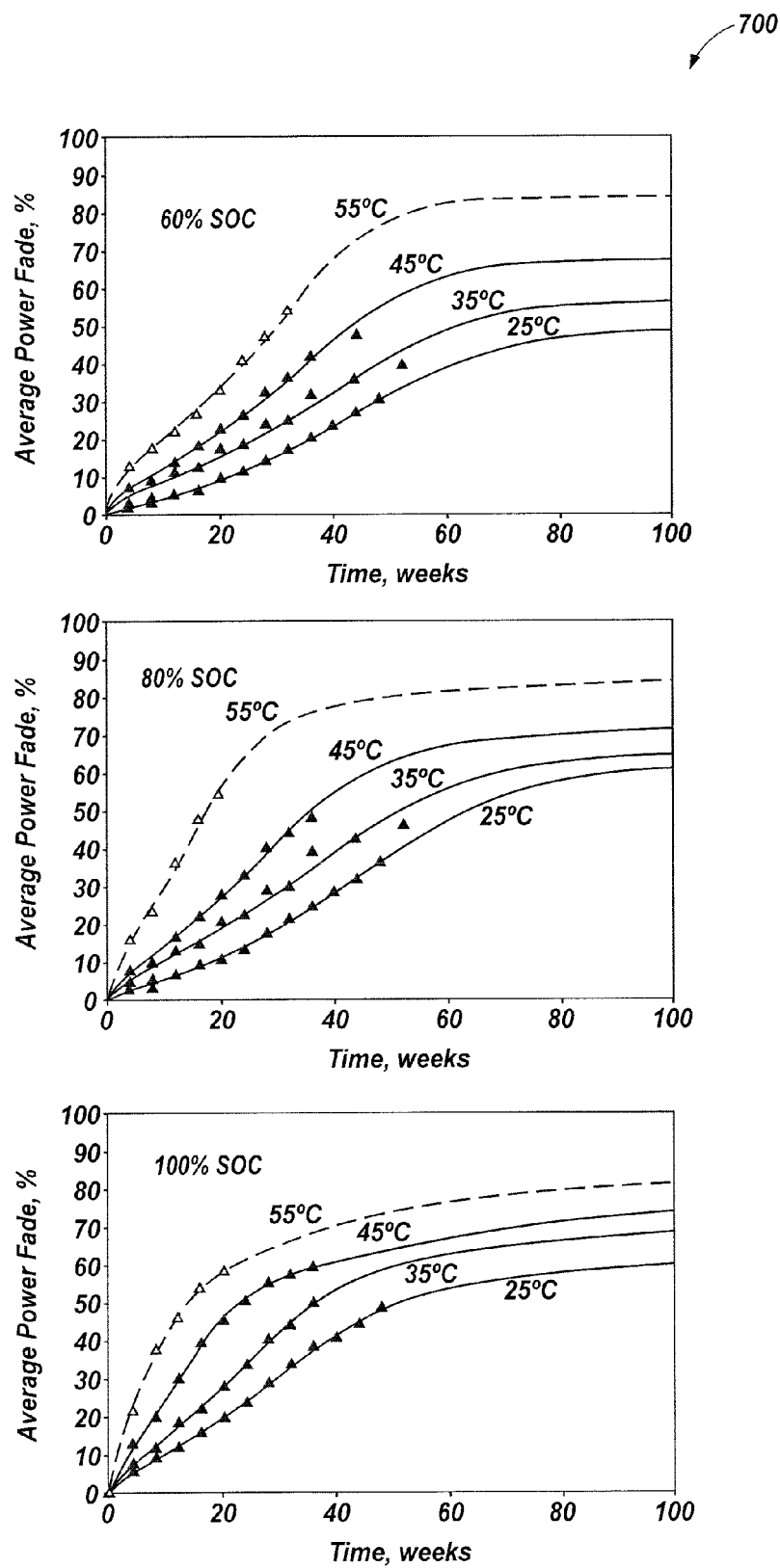
FIG. 7 is a summary of ALT data for power loss together with MSM regression results.
Figure 9:
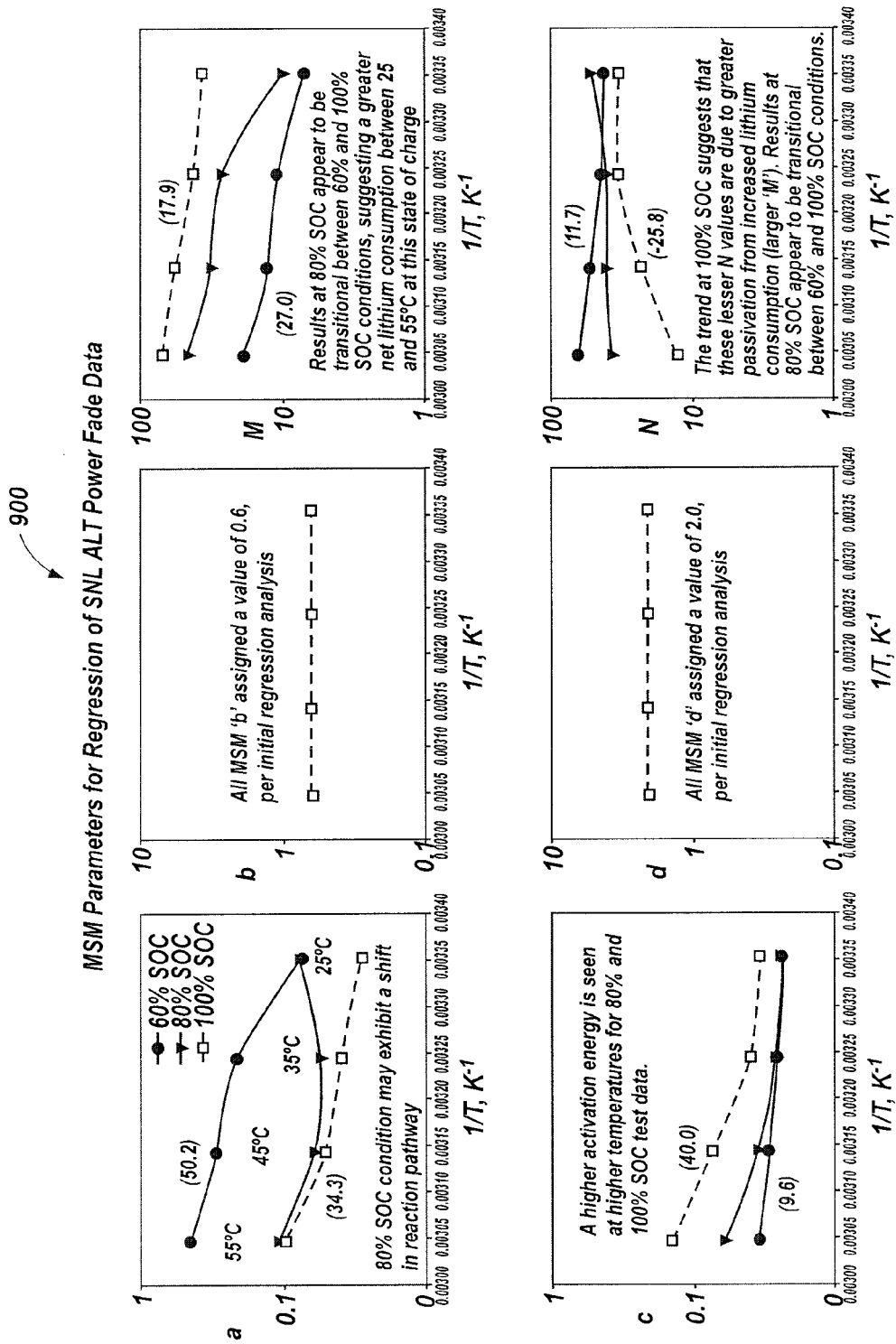
FIG. 9 shows a summary of Arrhenius plots performed for MSM parameters.

Another case for looking at temperature dependence of MSM parameters is based on power-fade data for accelerated-life tested (ALT) Gen2 lithium-ion batteries. This testing covered four temperatures (25° C., 35° C., 45° C., and 55° C.) and three SOCs (60%, 80%, 100%). The batteries were subjected to a single daily pulse profile based on a scaled 25 Wh Power Assist goal. As such, they were under calendar-life conditions for most of their testing. FIG. 7 is a summary 700 of ALT data for power loss together with MSM regression results, and FIG. 8 is a summary 800 of MSM parameters for regression of ALT power loss data. FIG. 9 shows a summary 900 of Arrhenius plots performed for MSM parameters. Note that some data at 35° C. may not exhibit many of the trends that the other temperatures do; thus, MSM parameter trends may reflect this deviation from the normal trends in some of the following figures.

For this SNL data, power fade was broken down into two basic degradation mechanisms, where MSM parameters (a, b, M) cover a first degradation mechanism and MSM parameters (c, d, N) cover a second degradation mechanism, giving the MSM overall expression (consistent with equation (39)):

$$\text{(Net Power Fade)} = \sum_j (\text{Power Fade})_{j,ALT} \quad (62)$$

$$= 2M_{ALT}\left[\frac{1}{2} - \frac{1}{1 + \exp((a'_{ALT}t)^{b_{ALT}})}\right] +$$

$$2N_{ALT}\left[\frac{1}{2} - \frac{1}{1 + \exp((c'_{ALT}t)^{d_{ALT}})}\right]$$

where the first degradation mechanism and the second degradation mechanism cover the effects on cell impedance from consumption of lithium-ion inventory and loss of active and available intercalation sites, respectively. These two primary degradation mechanisms were chosen based on analyses of other lithium-ion aging data such as the Gen2 capacity fade data discussed above. From the data in FIG. 8, initial regression analysis using the MSM approach revealed that the reaction order terms "b" and "d" were largely invariant over temperature and that average, representative values for "b" and "d" would be about 0.6 and 2.0, respectively. This is the same result as obtained for the Gen2 testing and MSM analysis described above, and lends credibility to the assertion that common degradation mechanisms affect both cell capacity and achievable power. From a chemical kinetics viewpoint it may be assumed that the reaction orders may be invariable over temperature and SOC, because they represent the type or classification of the net reactions contributing to a particular degradation mechanism. By assigning constants to (b, d), the determination of (a, c) and their activation energies may be more straightforward, and estimating (a, c) may be simplified at off-matrix temperatures.

From FIG. 9 it is seen that the rate constant terms (a, c) and extent terms (M, N) may be sensitive to temperature, with activation energies somewhat variant over SOC and specific temperature ranges. Of particular note in FIG. 9 is the apparent transitional nature of the 80% SOC test condition. Aging trends and related MSM parameters at this SOC tend to mimic those of 60% SOC at the lower temperatures, yet tend to reflect behavior of the 100% SOC condition at the higher temperatures. This transitional behavior is observed in plots of MSM parameters (a, b, M, and c, d, N) in FIG. 9, and may represent a temperature-driven shift of reaction pathways at 80% SOC. This type of result may be tied to the particular cell chemistry and electrode design factors.

From FIGS. 7 and 9, at 100% SOC the decreased rate of power fade at the highest temperatures at later time could infer that the accelerated kinetics underwent an "auto-quenching," or self-moderating degradation mechanism that resulted in a lesser maximum power fade of the cells. This is tied to the larger values of M, which relate to the lithium inventory. Perhaps an undue accelerated consumption of available lithium at 45° C. and 55° C. caused/enabled a greater protection of remaining active materials and thereby diminished further increases in impedance.

A purpose behind looking at temperature functionality is to support the MSM PD framework that may enable estimation of MSM parameters for an arbitrary aging condition (i*) at any temperature. Once the activation energy is obtained for a particular MSM parameter and test condition, equations (58) and (59) may then be directly used.

Figure 10:
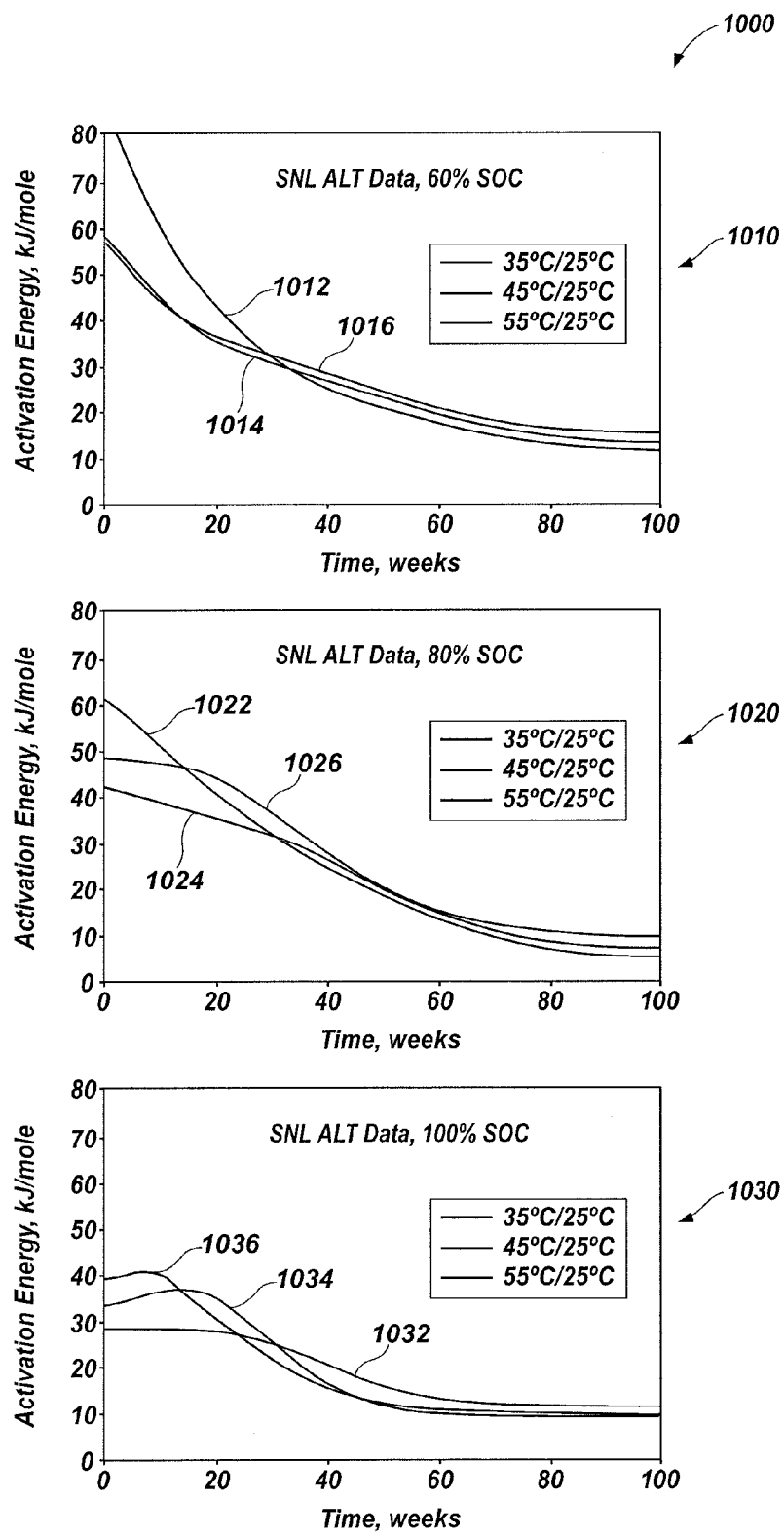
FIG. 10 shows activation energies for the SNL ALT power fade trends predicted by the MSM approach.

Finally, more analyses may be performed using the MSM-rendered power fade curves, such as analyzing the activation energy of power fade as a function of temperature range, test time, and SOC. FIG. 10 is a set of graphs 1000 that shows activation energies for the SNL ALT power fade trends predicted by the MSM approach, wherein the transitional nature of 80% SOC may be observed. A first graph 1010 shows activation energy for a first scenario (60% SOC) for a 35° C./25° C. range (line 1012), a 45° C./25° C. range (line 1014), and a 55° C./25° C. range (line 1016). A second graph 1020 shows activation energy for a first scenario (80% SOC) for a 35° C./25° C. range (line 1022), a 45° C./25° C. range (line 1024), and a 55° C./25° C. range (line 1026). A third graph 1030 shows activation energy for a first scenario (100% SOC) for a 35° C./25° C. range (line 1032), a 45° C./25° C. range (line 1034), and a 55° C./25° C. range (line 1036). Each distinct and unique trend over time bespeaks a PD basis, in this case related to temperature and SOC. Thus, FIG. 10 results are evidence that may suggest path dependence of aging is likely, especially in early life data. It is noted that for the SNL data, each curve for power fade and activation energy is represented by a single arbitrary aging condition (i*) aging condition. In cases where various arbitrary aging condition (i*) will be in effect for a given cell over time, such quantities may experience more variable profiles over time.

Figure 11:
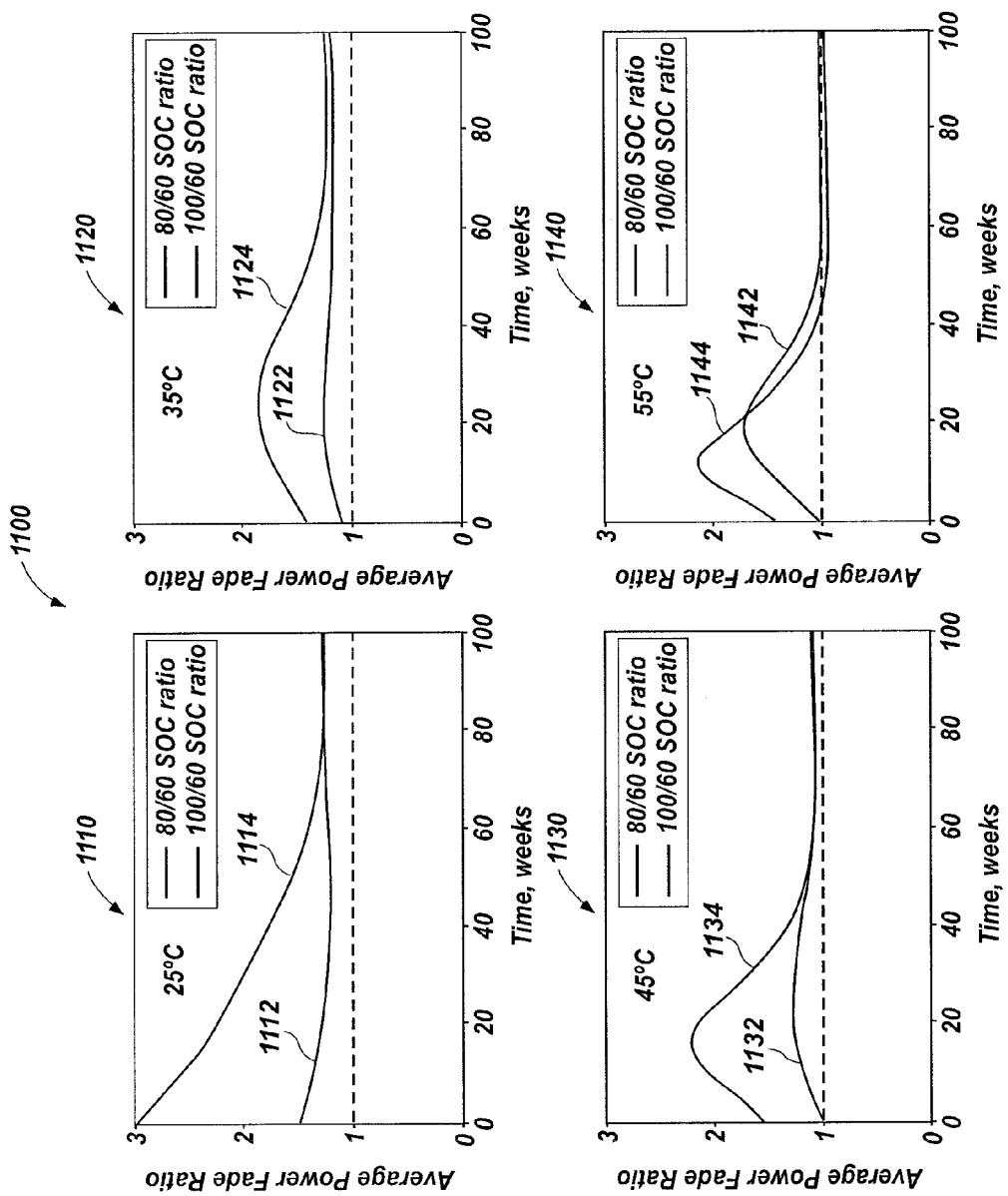
FIG. 11 is a set of graphs that shows power fade ratios based on MSM calculations.

Another rendering of the SNL ALT data is to consider the power fade as a function of SOC and plot corresponding power fade ratios at each distinct temperature. FIG. 11 is a set of graphs 1100 that shows these power fade ratios based on MSM calculations, using 60% SOC, using a plurality of different temperatures (e.g., 25° C. (graph 1110), 35° C. (graph 1120), 45° C. (graph 1130), 55° C. (graph 1140)). Lines 1112, 1122, 1132, 1142 represent the 80/60 SOC ratio for the various temperatures. Lines 1114, 1124, 1134, 1144 represent the 100/60 SOC ratio for the various temperatures. The results suggest that there is a shift of degradation mechanism(s) between 25° C. and 35° C., and that higher temperatures tend to accelerate and compress the peak ratios along test time. At 45° C. and 55° C., the effects of SOC are nearly completely diminished by about 50 weeks, implying that SOC-related degradation mechanisms (j) are relatively short-lived and likely tied to the inventory of available lithium ions. Such degradation mechanisms may transpire more quickly at higher SOC and temperature, correctly identifying these two conditions as stress factors for the batteries.

10. Overall General Approach

To summarize several points of the approach described herein, an aging timeline may be viewed as a series of arbitrary aging conditions (i*) of variable length, during which a given electrochemical cell (or other device) undergoes cumulative performance loss ($\Psi$) as tracked under each of the chosen SCCs. Given a unique aging period ($\Delta t_n$) there may be a unique set of MSM expressions applicable within this period that represent performance loss as gauged by the SCCs, considering the unique arbitrary aging conditions (i*$_n$) for all degradation mechanisms (j). That is, for a given SCC the specific impacts of aging conditions (i) on aging kinetics may be considered for each unique arbitrary aging conditions (i*$_n$) regarding all relevant degradation mechanisms (j):

$$\begin{pmatrix} \text{Aging Period } n \\ \Delta t_n \\ t_{n-1} \text{ to } t_n \\ t_{start,n} \\ \Psi_{n-1} \text{ to } \Psi_n(\Delta\Psi_n) \\ \Psi_{net,n} \\ \frac{d\Psi}{dt} \text{ over } \Delta t_n \\ (a, b, M)_n \\ (k_f, k_r)_n \\ K_{eq,n} \end{pmatrix}_{\forall j \text{ at } i_n^*} \quad (63)$$

The performance losses $\Psi_{j,n}$ may transition smoothly between consecutive arbitrary aging conditions (i*), but $$\frac{d\Psi_{j,n}}{dt} \text{ or } \frac{d\Psi_{j,n}}{di_n^*}$$

may exhibit stair-steps or jumps. Likewise, higher-order derivatives may exhibit noteworthy changes when transitioning between aging regimes that differ appreciably.

11. Usage Scenarios

Figure 12A:
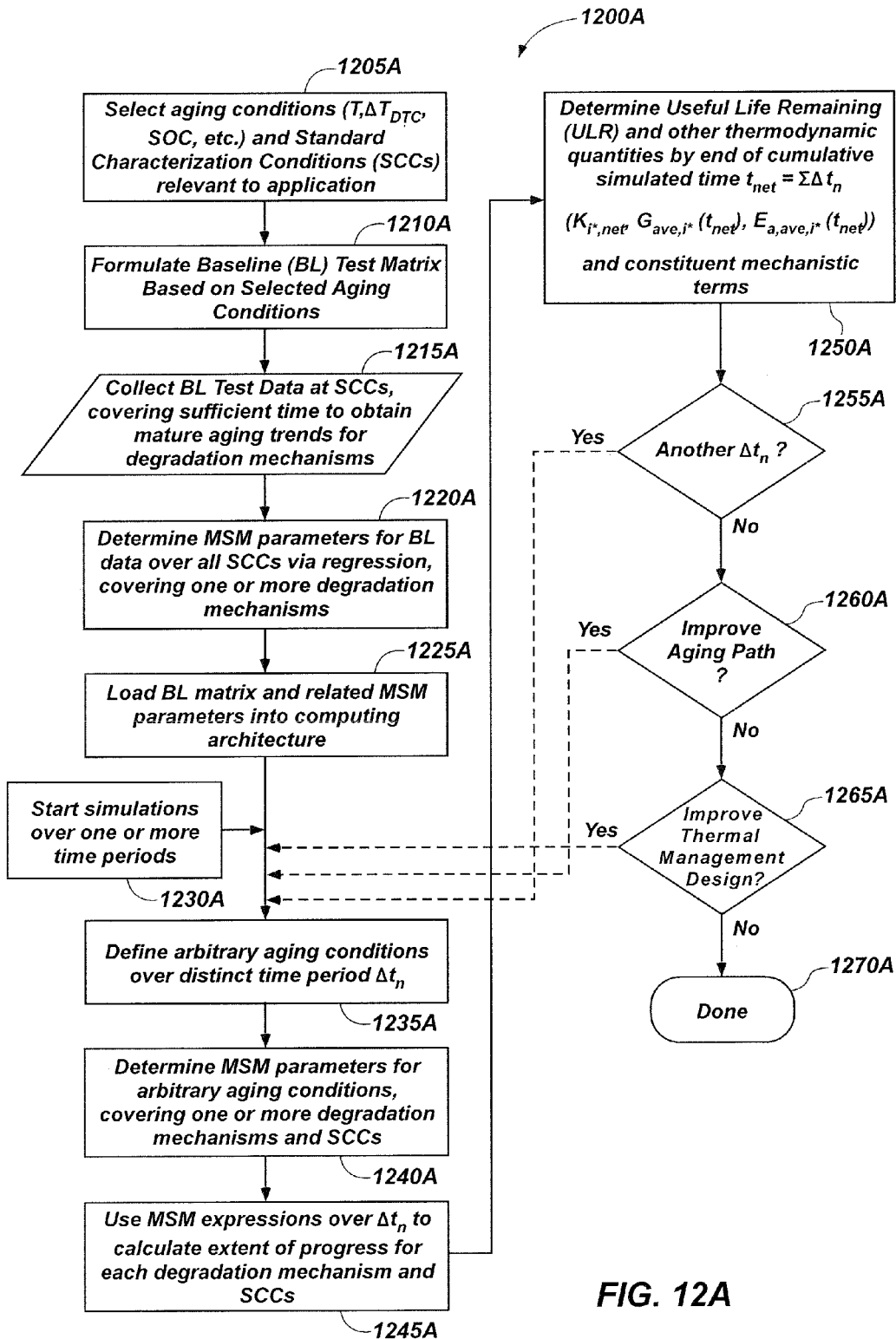
FIGS. 12A and 12B are flowcharts illustrating method for usage scenarios according to embodiments of the present disclosure.

FIG. 12A is a flowchart 1200A illustrating a method for a usage scenario according to an embodiment of the present disclosure. In particular, the usage scenario may be a stand-alone method for aging prognostics and diagnosis. Although embodiments of the present disclosure may be used for a variety of different aging objects, a battery is used in this example.

At operation 1205A, aging parameters and SCCs relevant to a particular application may be selected as desired. For example, for an application involving a battery, the selected aging parameters that may be standardized as SCCs for collecting baseline test data for diagnostic analysis may include temperature, cycling rate, state of charge, etc.

At operation 1210A, the baseline (BL) test matrix may be formulated based on the selected aging parameters for defining a test protocol. The baseline test matrix may be a subset of conditions that may be present in the actual application of the device. For example, for a battery, a baseline test matrix, such as that of Table 1 described above, may be generated to include a set of desired test protocols for testing the battery at a baseline temperature, SOC, energy throughput rate, charging rate, and other aging stress factors for a performance measure of interest. The battery may be tested for a particular mode, such as a cycle-life condition or a calendar-life condition for these baseline parameters. The test conditions may be based on the actual intended use scenario and anticipated ranges of the service application for the battery. Thus, the baseline test matrix may define how the battery is to be tested, such as by defining the SCCs and the related RPT protocol, including the RPT frequency (e.g., test data to be obtained, daily, weekly, monthly, etc.).

At operation 1215A, baseline test data may be collected from the battery for each SCC defined in the baseline test matrix. The baseline test data may be collected from the battery for a sufficient amount of time to obtain mature aging trends for the particular degradation mechanisms. For a battery, the baseline test data may include data such as the capacity of the battery, capacity loss of the battery over time, impedance variations of the battery over time, etc.

For example, the baseline test data may be collected from a test of the battery under the SCCs of the selected aging parameters in the baseline test matrix. In other words, the baseline test data may be collected from the battery being imposed upon by a known aging condition (i) used as a reference that has applicability to the eventual use of the battery in its intended format. The battery may also be periodically characterized for particular SCCs that may be relevant to type of application and usage conditions envisioned for the object according to the RPT protocols. As an example, a time zero RPT ($RPT_0$) may be performed to establish beginning-of-life characterization to serve as a basis for extent of losses for the performance measures of interest. The battery may further be aged according to the defined baseline test matrix. The baseline test data may be collected daily, such as through discharge pulse-per-day (PPD) tests may be performed on the battery, which may include using a standard basis for temperature, SOC, pulse magnitude (current or power basis), and pulse duration. Such PPD tests may be used to track daily impedance and conductance for the battery. In addition, periodic RPTs may be performed under the SCCs applicable to the chosen performance measure(s), and the performance loss (e.g., capacity fade, conductance loss, etc.) may be calculated over time.

At operation 1220A, the MSM parameters (a, b, M) for the baseline test data may be determined. For example, the test data may be evaluated via MSM regression analysis to determine MSM parameters (a, b, M) for baseline data, as well as for particular SCCs, which may further provide MSM parameters (a, b, M)$_j$ for particular degradation mechanisms (j) of interest to account for aging conditions that may be off-baseline (Δbaseline). For example, data regression may be performed to update MSM parameters (a', b, M)$_j$ for each aging condition (i) within the test matrix and at each SCC. The MSM parameters (a', b, M)$_j$ may be used to determine the performance losses for the test matrix ($\Psi_{i,matrix}$):

$$\Psi_{i,matrix} = \sum_j 2M_j \left[\frac{1}{2} - \frac{1}{1+\exp((a'_j t)^{b_j})}\right]_{i,matrix} \quad (64)$$

for j contributing mechanisms

The battery may continue to be aged, and the data collection and regression analysis may be repeated until mature trends are seen in the test data.

At operation 1225A, the baseline test matrix and related MSM parameters (a, b, M) may be loaded into a computing architecture. With this baseline test matrix and the related MSM parameters (a, b, M), simulations may be performed for a particular application to predict aging consequences of the object if the object were to be exposed to aging conditions (i) that differ from the baseline aging conditions (i) and SCCs from the baseline test matrix. In other words, a simulation may be performed for a battery chemistry under some anticipated conditions, and the aging consequences may be determined. As a result, the performance (e.g., lifespan) of the battery may be predicted, which may be useful in design of the battery, or in determining a warranty for a battery. Thus, operations 1205A, 1210A, 1215A, 1220A may be a thumb printing exercise to see how the battery responds to certain aging parameters (e.g., by determining MSM parameters for certain aging parameters). Knowing the response of the battery to certain aging parameters may enable the use of such MSM parameters (a, b, M) to predict unknown consequences to arbitrary aging conditions (i*) that may differ from the aging parameters used in the baseline.

At operation 1230A, such simulations may begin. For example, the simulations may be performed over multiple arbitrary aging conditions (i*) and time periods ($\Delta t_n$). At operation 1235A, arbitrary aging conditions (i*) may be defined over a distinct time period ($\Delta t_n$). At operation 1240A, MSM parameters (a, b, M) may be determined for arbitrary aging conditions (i*). The MSM parameter determination may be for each of the aging mechanisms and SCCs that were defined in the baseline test matrix (operation 1210A).

For example, the physical conditions (e.g., stress factors) that comprise an arbitrary aging condition (i*) may be defined, and the MSM parameters (a, b, M) may be estimated for an arbitrary aging condition (i*) for each relevant degradation mechanism (j) using the deviation-from-baseline approach for each stress factor A, B, C . . . :

$$\frac{da'}{dA} \cong \frac{\Delta a'_A}{A_{BL} - A} \quad (65), (66)$$

$$\frac{a'_{BL} - a'_{A^*}}{A_{BL} - A^*} \stackrel{!}{=} \left(\frac{da'}{dA} \cong \frac{\Delta a'_A}{A_{BL} - A}\right)$$

and thus $$a'_{A^*} \cong a'_{BL} - (a'_{BL} - a'_A)\left(\frac{A_{BL} - A^*}{A_{BL} - A}\right)$$

and likewise for b and M. The Arrhenius relationships may be used where desirable to establish proper interpolation or extrapolation of MSM parameters (a, b, M) over temperature.

The composite values of the MSM parameters (a, b, M) at arbitrary aging condition (i*) may be estimated for each degradation mechanism (j) of interest:

$$a'_{j,i^*} = a'_{j,BL} + \begin{bmatrix} \Delta a'_{j,T} + \Delta a'_{j,SOC} + \Delta a'_{j,cyc} + \ldots + \\ \{\Delta a'_{j,SOC \square T} + \Delta a'_{j,cyc \square T} + \ldots\} + \\ \{\text{higher order terms}\} \end{bmatrix}_{i^*} \quad (67)$$

$$b_{j,i^*} = b_{j,BL} + \begin{bmatrix} \Delta b_{j,T} + \Delta b_{j,SOC} + \Delta b_{j,cyc} + \ldots + \\ \{\Delta b_{j,SOC \square T} + \Delta b_{j,cyc,\square T} + \ldots\} + \\ \{\text{higher order terms}\} \end{bmatrix}_{i^*} \quad (68)$$

$$M_{j,i^*} = \frac{K_{j,i^*}}{1 + K_{j,i^*}}; \; M_{i^*} = \frac{K_{i^*,net}}{1 + K_{i^*,net}} \quad (69)$$

where:

$$K_{j,i^*} = \frac{M_{j,i^*}}{1 - M_{j,i^*}} = \frac{M_{j,BL} + \sum_{k=1}^{n_k} \Delta M_{j,i^*,k}}{1 - \left(M_{j,BL} + \sum_{k=1}^{n_k} \Delta M_{j,i^*,k}\right)} \quad (70)$$

and $$K_{i^*,net} = \frac{M_{i^*}}{1 - M_{i^*}} = \frac{\sum_j^{n_j} M_{j,i^*}}{1 - \sum_j^{n_j} M_{j,i^*}} = \frac{\sum_j^{n_j}\left(M_{j,BL} + \sum_k^{n_k} \Delta M_{j,k}\right)}{1 - \sum_j^{n_j}\left(M_{j,BL} + \sum_k^{n_k} \Delta M_{j,k}\right)} \quad (71)$$

Analogous relationships involving $M_j^o$ terms may also used to evaluate equilibrium constants related to the true extent of reaction for each isolated degradation mechanism (j). For the rate constant terms to have consistent units of inverse time, the constituent terms in the $a'_{j,i*}$ expression in equation (67) may be converted beforehand to time$^{-1}$ if they possess fractional units of time that differ according to the value of $b_{j,i*}$:

$$a'_{j,i*} = (a_{j,i*})^{\frac{1}{b_{j,i*}}} \quad (72)$$

which should be used in the MSM form:

$$\Psi_{i*} = \sum_j \Psi_{j,i*} = \sum_j 2M_j \left[\frac{1}{2} - \frac{1}{1+\exp((a'_j t)^{b_j})}\right]_{i*} \quad (73)$$

for $j$ contributing mechanisms

The appropriate start time for MSM under each degradation mechanism (j) may also be determined:

$$t_{start,n,j} = \left[\frac{1}{a_j}\ln\left(\frac{2M_j}{M_j - \Psi_{j,n-1}} - 1\right)\right]^{\frac{1}{b_j}} \quad (74), (75)$$

or preferably $$t_{start,n,j} = \frac{1}{a'_j}\left(\ln\left(\frac{2M_j}{M_j - \Psi_{j,n-1}} - 1\right)\right)^{\frac{1}{b_j}}$$

with $(a'_j, b_j, M_j)$ applicable to a unique aging period $(\Delta t_n)$ and arbitrary aging condition (i*) thereof.

At operation 1245A, MSM expressions may be used to calculate the predicted performance loss $(\Psi_n)$ of the battery for each degradation mechanism (j). For example, MSM formalism may be applied to arbitrary aging conditions (i*) to determine performance losses $(\Psi_n)$ for each degradation mechanisms (j) of interest covering a unique aging period $(\Delta t_n)$, starting at $t_{start,n,j}$ for each degradation mechanism (j):

$$\Psi_{i*} = \sum_j 2M_j \left[\frac{1}{2} - \frac{1}{1+\exp((a'_j t)^{b_j})}\right]_{i*} \quad (76)$$

for $j$ contributing mechanisms

Operations 1240A, 1245A (which may include evaluating the data with one or more of equations (65) through (75)) may be repeated for as many arbitrary aging conditions (i*) that are applicable.

Figure 12B:
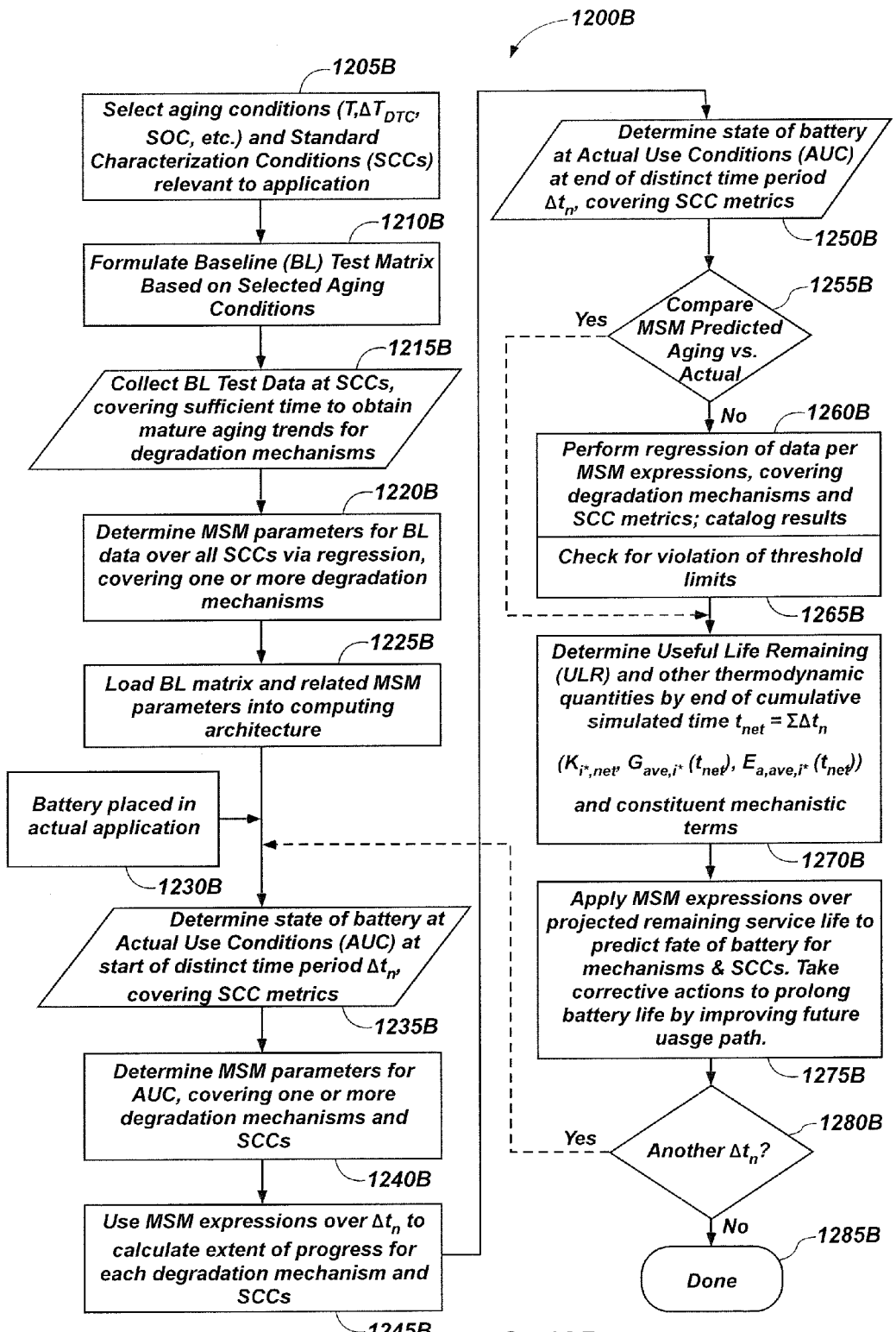

At operation 1250A, the useful life remaining (ULR) may be determined as well as other thermodynamic quantities for the cumulative time $(t_{net})$. The ULR may be a determination based on the performance losses $(\Psi_n)$ up to that point in time. At operation 1275B, as shown in FIG. 12B, the fate of the battery may be predicted using the MSM expressions for the various degradation mechanisms at desired SCCs. Predicting the fate of the battery over various use conditions may assist in prolonging battery life by optimizing a future usage path (e.g., by controlling certain aging parameters). At operation 1255A, it may be determined if another time period $(\Delta t_n)$ for measurement and analysis is desired. If so, then operations 1235A through 1255A may be repeated for the next time period $(\Delta t_{n+1})$. As a result, the simulation using the MSM parameters may be performed over a plurality of unique aging periods $(\Delta t_n)$ to determine how much further performance losses $(\Psi_n)$ for the degradation mechanisms progress as well as the ULR. As an example, a simulation may include a new time period $(\Delta t_n)$, such as two weeks, for a total time period of one year. Each unique time period may have different arbitrary aging conditions (i*), such as changing the temperature for different seasons throughout the year to determine predicted performance losses for an annual cycle of a given city. If not, then the method may be move on to operation 1260A.

At operation 1260A, the simulation may be repeated with different arbitrary aging conditions (i*) in an attempt to further improve the aging path. As a result, the simulation may be performed with different aging conditions (i*) to determine if the new aging path is an improvement over the previous simulated aging paths. In some embodiments, the sequence of the arbitrary aging conditions (i*) may be changed to determine whether a path dependence exists that would improve the aging path. By comparing the results of different aging paths, the decisions that may be made in the actual aging path may be chosen to prolong the life of the battery by minimizing the aging rate.

At operation 1265A, the simulation may be repeated with different arbitrary aging conditions (i*) in an attempt to further improve the battery life by simulating various thermal management designs. For example, each new simulation may determine temperature parameters (e.g., $T_{max}$, $T_{min}$) that may be used throughout the simulation. By comparing the results of different thermal management designs, the decisions related to the thermal management design may be chosen for an appropriate usage condition that may prolong the life of the battery by minimizing the aging rate as it relates to battery temperature. The simulation method may be completed at operation 1270A.

FIG. 12B is a flowchart 1200B illustrating a method for another usage scenario according to an embodiment of the present disclosure. In particular, the usage scenario may be a real-time dynamic system for determining unknown consequences of arbitrary aging conditions during actual use of the object (e.g., battery).

Operations 1205B, 1210B, 1215B and 1220B may be substantially the same as operations 1205A, 1210A, 1215A, 1220A discussed above with respect to FIG. 12A. In particular, 1205B, 1210B, 1215B, 1220B may be employed to collect baseline test data and associated MSM parameters for one or more degradation mechanisms at one or more SCCs. Thus, operations 1205B, 1210B, 1215B, 1220B may be a thumbprinting exercise to see how the battery responds to certain aging parameters (e.g., by determining MSM parameters for certain aging parameters). Knowing the response of the battery to certain aging parameters may enable the use of such MSM parameters (a, b, M) to predict unknown consequences to arbitrary aging conditions (i*) that may differ from the aging conditions (i) used in the baseline.

At operation 1225B, the baseline test matrix and related MSM parameters may be loaded into a computing architecture, such as being loaded onboard a monitoring and control system of a BDMC associated with a battery. The monitoring and control system may be included with the battery at the point of manufacture or as an "after-market" option. For example, the baseline matrix and other control logic may be included within an IC chip that may perform at least some of the methods described below during use of a battery. The IC chip may include a processor for executing instructions, and a computer-readable media for storing instructions, the baseline matrix, and other related data. Such an IC chip may be configured as a "plug-and-play" device that may be used with a vehicle or other apparatus where battery monitoring and control may be desired.

At operation 1230B, a battery may be placed in actual use. The battery may include a baseline test matrix and MSM parameters (a, b, M) associated therewith. The battery may have similar characteristics (e.g., cell chemistry) as the battery used to determine the baseline MSM parameters (a, b, M) from the baseline test data.

At operation 1235B, the state of the battery at actual use conditions may be determined at the start of a distinct time period ($\Delta t_n$). As will be described below, a number of iterations may be performed for individual time periods ($\Delta t_n$) (see operation 1280B). As a result, at the beginning of each individual time period ($\Delta t_n$), the state of the battery may be determined, as a starting point for that individual time period ($\Delta t_n$). At the first time period ($\Delta t_1$), the state of the battery may be similar to what the state of the battery was just as the battery was placed into service. As the method illustrated in FIG. 12B returns to that point for successive time period ($\Delta t_n$) monitored, the state of the battery is determined for the beginning of the next time period ($\Delta t_{n+1}$).

The state of the battery may include a desired measurement providing information regarding a current state of the battery. For example, the state of the battery may include impedance information of the battery taken at a snapshot at the beginning of the time period ($\Delta t_n$). In some embodiments, the state of the battery may include a more involved measurement and calculation, such as a determination of the capacity of the battery. Determining the state of battery at each time period ($\Delta t_n$) may enable tracking of certain parameters over time. For example, determining the state of the battery from one time period ($\Delta t_n$) to the next time period ($\Delta t_{n+1}$) may show that the battery experienced a certain capacity loss (e.g., 10% capacity loss) or an impedance rise (e.g., 20% impedance rise).

The duration of each time period ($\Delta t_n$) may vary from one time period ($\Delta t_n$) to the next time period ($\Delta t_{n+1}$), For example, one time period have a duration of a day while another may include a time period of two hours. For some iterations, the time period ($\Delta t_n$) may be a periodic, predetermined time period (e.g., daily, weekly, etc.), while in other iterations, the time period ($\Delta t_n$) may vary depending on the use of the battery (e.g., set to monitor at times of different levels of use). Likewise, the duration of performing individual operations (e.g., such as operation 1235B) may vary from one time period ($\Delta t_n$) to the next time period ($\Delta t_{n+1}$). For example, at the beginning of one time period ($\Delta t_n$), the state of battery may include a simple measurement of battery impedance, while in the next time period ($\Delta t_{n+1}$), the state of battery may include a battery capacity determination.

At operation 1240B, the MSM parameters for the actual use conditions may be determined. Such MSM parameters for the actual use conditions may be used to determine unknown consequences of arbitrary aging conditions (i*) that may differ from the aging conditions used for the baseline test matrix. The MSM parameters for the actual use conditions may be determined by a deviation-from-baseline approach using the data collected for the state of battery determination during actual use, along with the known arbitrary aging conditions (i*) (e.g., temperature, SOC, cycling rate, etc.) of the battery.

At operation 1245B, the progression of the performance losses ($\Psi_n$) may be determined using the MSM parameters over the time period ($\Delta t_n$). The performance losses ($\Psi_n$) may be determined similar to that described above with respect to operation 1245A of FIG. 12A. At operation 1250B, the state of the battery at actual use conditions may be determined at the end of the distinct time period ($\Delta t_n$). Thus, operation 1245B may be used to obtain a predicted aging (i.e., performance loss) for the battery based on the MSM parameters during the distinct time period ($\Delta t_n$), while operation 1250B may be used to obtain an actual aging (i.e., performance loss) during the distinct time period ($\Delta t_n$).

At operation 1255B, the MSM predicted aging may be compared with the actual aging. Comparing the MSM predicted aging with the actual aging may be used to determine the accuracy of the deviation-from-baseline approach used to obtain the MSM parameters for the actual use conditions in operation 1240B, and to recalibrate the model if desired. For example, some combinations of arbitrary aging conditions (i*) may not be linear, such that the deviation-from-baseline approach may impact the actual aging differently than predicted. If the comparison of the MSM predicted aging and the actual aging is not within a desired tolerance, regression of the data from the MSM expressions may be performed and the deviation thereof may be cataloged for future use at operation 1260B. In other words, the MSM parameters (a, b, M) may be recalibrated by inferring how the MSM parameters (a, b, M) might should have been obtained from the deviation-from-baseline approach for the arbitrary aging condition (i*). Thus, model predictions may be refined by tuning the model more closely to the actual data taken under consecutive arbitrary aging condition (i*). Second-tier MSM regression at this point may enable adaptation of the modeling approach to actual field conditions.

Such a comparison may be performed for each degradation mechanism (j) individually, as well as overall. Thus, the performance loss terms ($\Delta \Psi_{j,T}, \Delta \Psi_{j,SOC}, \Delta \Psi_{j,cyc} \ldots$) may be compared for each degradation mechanism (j) at an arbitrary aging condition (i*) to determine relative influence of aging parameters on the aging metrics.

Another comparison may include comparing the sign and magnitude of $\Delta M_k$ or $\Delta K_{j,i^*,k}$ terms, where sensitivity analyses of aging parameters for each degradation mechanism (j) may be performed using the $\Delta K_{j,i^*,k}$ based expression:

$$X_{j,i^*,k} \equiv \frac{\Delta K_{j,i^*,k}}{\sum_{k}^{n_k} \Delta K_{j,i^*,k}} = \tag{77}$$

$$\frac{\Delta M_{j,i^*,k}}{1-(M_{j,BL}+\Delta M_{j,i^*,k})} \left[ \sum_{k}^{n_k} \frac{\Delta M_{j,i^*,k}}{1-(M_{j,BL}+\Delta M_{j,i^*,k})} \right]^{-1}$$

Such a comparison of $\Delta M_k$ or $\Delta K_{j,i^*,k}$ may be used to determine relative influence of aging parameters on a given degradation mechanism (j).

One or more additional relationships may be flagged. For example, if $M_{n-1}$ and $M_n$ are defined as the MSM upper limits of degradation for a given degradation mechanism (j) (e.g., $Li^+$ or $\theta$) predominant at time periods n−1 and n, respectively, then if $\{M_{n-1}<M_n\}$, net performance loss ($\Psi_{net,n}$) may increase. Yet, if $\{M_{n-1} \geq M_n\}$ and $\{\Psi_{n-1} \geq \Psi_n\}$ zero growth in degradation at the beginning of the $n^{th}$ period may be experienced, because it may be infeasible from a thermodynamics and kinetics viewpoint that continued performance degradation would occur because the extent of reactions has already transpired to a limiting level (at least under net growth). Thus, under the latter case, net performance loss ($\Psi_{net,n}$) may plateau during part or all of the $n^{th}$ time period, or perhaps diminish slightly if there are reversible kinetic aspects to the degradation mechanisms (j).

At operation 1265B, threshold limits may be checked to determine if the difference between the MSM predicted aging and the actual aging is greater than an outer limit. In such situations, being outside of the level of tolerance by an overly large amount may be an indication that the battery is undergoing a critical failure. Detecting critical failure at an early stage may provide for safety precautions or corrective measures to be taken.

At operation 1270B, the ULR may be determined as well as other thermodynamic quantities for the cumulative time ($t_{net}$). The ULR may be a determination based on the performance losses ($\Psi_n$) up to that point in time. For example, thermodynamic analyses may be performed over consecutive arbitrary aging condition ($i^*$), looking at metrics such as Gibbs free energies, equilibrium constants, activation energies, etc. For example, the cumulative Gibbs energy of reaction may be determined for each degradation mechanism (j), and the total degradation over the elapsed time of interest:

$$G_{net,j,i^*} = \sum_{i^*=1}^{n_t} \Delta G_{j,i^*} \tag{78}$$

$$G_{net,i^*} = \sum_{i^*=1}^{n_t} \Delta G_{i^*} = \sum_{j=1}^{n_j} G_{net,j,i^*} \tag{79}$$

Gibbs energy ($G_{net}$) may be valid for equal-spaced arbitrary aging condition ($i^*$) in time. To overcome this constraint on time intervals, the usage conditions and duty sequence over battery life may be improved by increasing the cumulative $\Delta G_{j,i^*}$ and $\Delta G_{i^*}$, as defined by a running average:

$$G_{ave,j,i^*}(t_{net}) = \frac{1}{t_{net}} \int_{t=0}^{t_{net}} G_{j,i^*}(t) dt_{i^*} = \frac{1}{t_{net}} \sum_{i^*=1}^{n_t} \Delta G_{j,i^*} \Delta t_{i^*} \tag{80}$$

and $$G_{ave,i^*}(t_{net}) = \sum_{j=1}^{n_j} G_{ave,j,i^*}(t_{net}) \tag{81}$$

Improving the Gibbs energy terms (larger positive values) over various battery conditions relating to service life may denote lower extents of reaction of the related degradation mechanisms (j), and may enable development of usage scenarios based on path dependent conditions that prolong battery life.

The running average for activation energies may be calculated for data of multiple temperatures, in a similar fashion as per the Gibbs terms:

$$E_{a,ave,j,i^*}(t_{net}) = \frac{1}{t_{net}} \int_{t=0}^{t_{net}} E_{a,j,i^*}(t) dt_{i^*} = \frac{1}{t_{net}} \sum_{i^*=1}^{n_t} E_{a,j,i^*} \Delta t_{i^*} \tag{82}$$

and $$E_{a,ave,i^*}(t_{net}) = \sum_{j=1}^{n_j} E_{a,ave,j,i^*}(t_{net}) \tag{83}$$

One goal toward improving path dependence conditions is to increase the activation energy ($E_a$) terms over $t_{net}$ through intelligent choice of aging conditions and sequence thereof within the intended application.

At operation 1275B, the fate of the battery may be predicted using the MSM expressions for the various degradation mechanisms at desired SCCs. Predicting the fate of the battery over various use conditions may assist in prolonging battery life by optimizing a future usage path (e.g., by controlling certain aging parameters).

At operation 1280B, it may be determined if another time period ($\Delta t_n$) for measurement and analysis is desired. If so, then operations 1235B through 1280B may be repeated for the next time period ($\Delta t_{n+1}$). If not, then the method may be completed at operation 1285B.

These results for predictive aging trends from the methods described in FIGS. 12A and 12B may be used to plan future use of the battery to extend its lifetime, such as creating a plan for what progression of future arbitrary aging conditions ($i^*$) would increase battery life. For example, the use of the battery may be designed to experience a usage pattern (e.g., sequence of arbitrary aging condition ($i^*$)) for increasing the battery life, while meeting required battery performance. The results for predictive aging trends may also be used for controlling operation of the battery in real time for prolonging battery life. For example, the general methods herein may be used to help design advanced thermal management systems by designing time-at-temperature conditions for a given battery chemistry in order to meet or exceed the targeted warranty period.

13. Case Studies and Demonstration of Capability

Toward utilization of battery packs in electric-drive vehicles, accurate estimates of aging rates that depend on the usage conditions may be desirable. For example, an ambient condition of concern may be temperature, because the batteries may be more likely to experience calendar-life conditions (80% to 90% of the time) rather than actual cycle-life conditions. In addition to ambient temperature, another battery condition that may contribute to aging tendencies is the SOC of the battery. Thus, case studies are provided herein that discuss the predicted aging response of a battery to various aging conditions including temperature, SOC, and cycling type. The examples given here are intended for demonstration purposes, and represent only a small number of representative scenarios.

For the following case study, the aging process of a Gen2-type lithium-ion cell is simulated for a plurality of different aging conditions (i). Thus, the discussion herein concentrates on Gen2 Li-ion cells of the 18650 configuration, where these battery cells include a $LiNi_{0.8}Co_{0.15}Al_{0.05}O_2$ cathode (35 µm laminate), a MAG10 carbon anode (also 35 µm laminate), an electrolyte of a 3:7 mass ratio of EC to EMC with 1.2M $LiPF_6$, and a 2300 series Celgard separator. Of course, embodiments of the present disclosure may be practiced with many other battery cell configurations.

The SOC for the battery is assumed to be 60% unless otherwise indicated. The aging analysis covered a simulated four-year period, as shown in FIG. 12. Both calendar-life conditions and cycle-life conditions were investigated over this time period so that a combined effect of these modes could be inferred.

Figure 13:
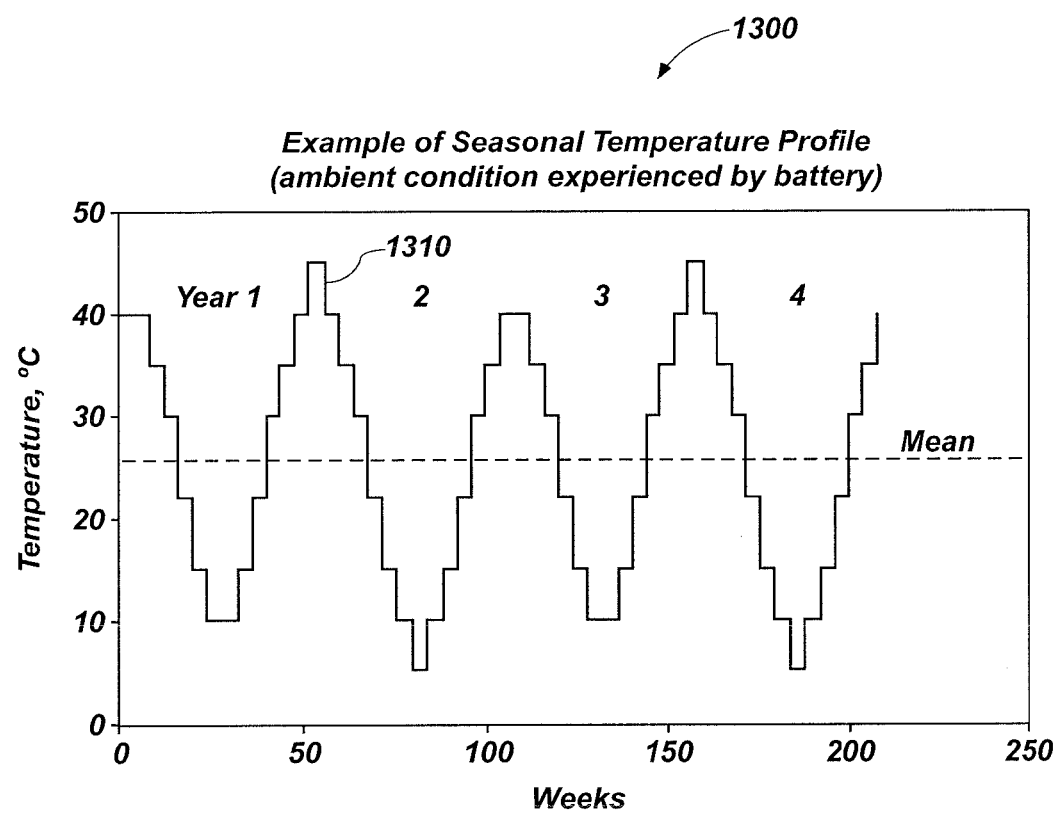
FIG. 13 is a graph of an example temperature profile that a battery may experience over a period of time.

FIG. 13 is a graph 1300 of an example temperature profile 1310 that a battery may experience over a period of time. In this example, the time period for the simulation is four years. The temperature profile 1310 shown in FIG. 13 may be similar to a typical temperature profile for a location (e.g., Phoenix, Ariz.) that experiences a change in monthly average temperatures due to the different seasons, but having a mean temperature of about 25° C. Thus, references to "Phoenix" refer to the concept that the battery may be simulated according to the annual temperature profile similar to that of Phoenix.

Figure 14:
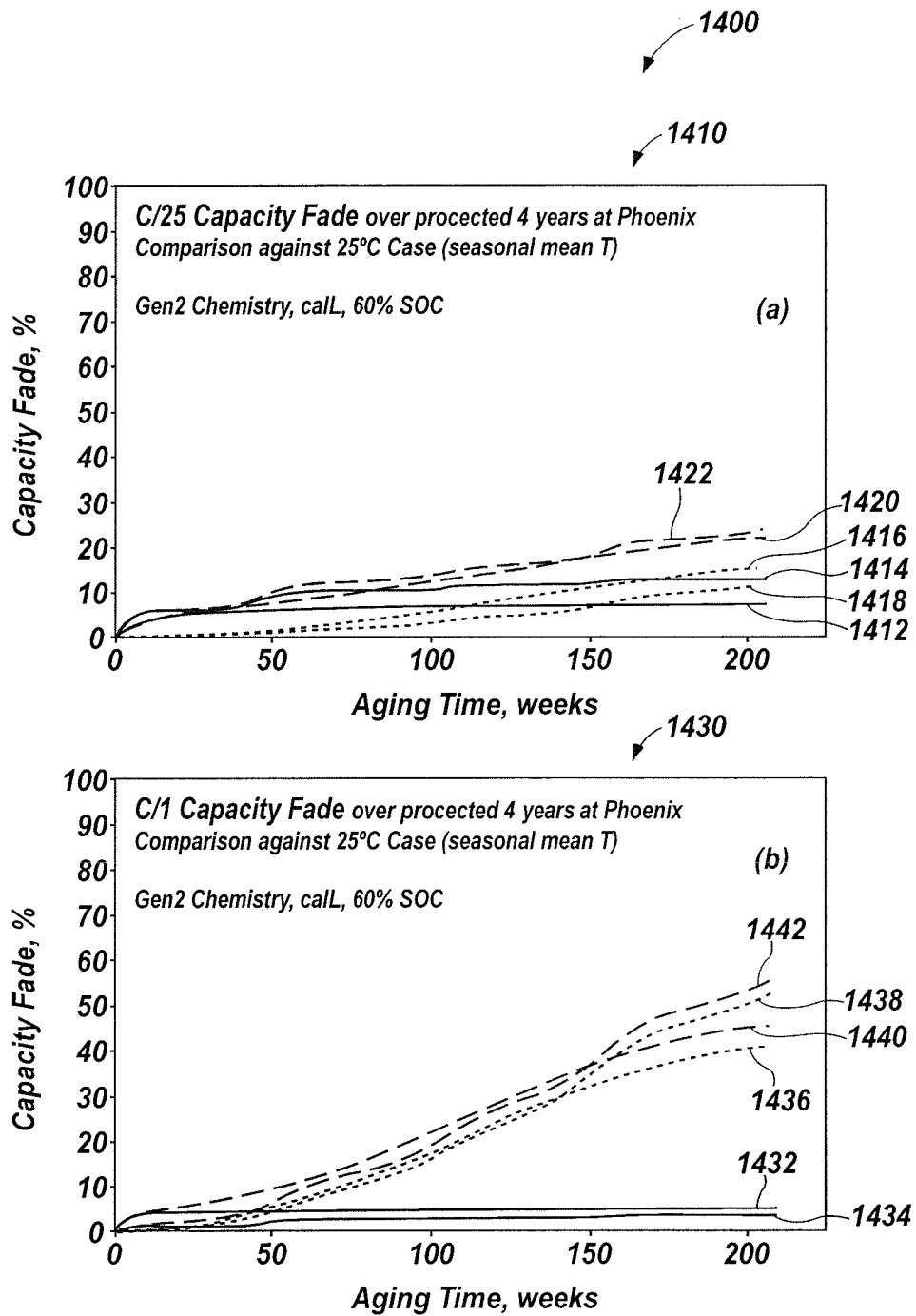
FIG. 14 is a set of graphs that show capacity fade profiles for a $C_1/25$ rate and a $C_1/1$ rate under calendar-life conditions.

FIG. 14 is a set of graphs 1400 that show capacity fade profiles for a $C_1/25$ rate and a $C_1/1$ rate under calendar-life conditions, as the battery is exposed to the aging conditions (i) of a Gen2 chemistry, calendar-life, 60% SOC, and different temperature profiles. A first graph 1410 shows capacity fade profiles for degradation mechanisms for the $C_1/25$ rate. Lines 1412 and 1414 show the capacity fade profile related to the loss of Li+ over time from the baseline matrix and the matrix created from the arbitrary aging condition (from the simulation of FIG. 13). Lines 1416, 1418 show the capacity fade profiles related to the loss of active sites θ from the two matrices. Lines 1420, 1422 show the total capacity fade profile (e.g., combination of the loss of Li+ and active sites θ) from the two matrices. In particular, lines 1412, 1416, and 1420 correspond to the capacity fade profiles of the baseline matrix created (e.g., corresponding to a constant temperature of 25° C. over time), while lines 1414, 1418, and 1422 correspond to the capacity fade profiles of the arbitrary aging condition (i*) matrix (e.g., corresponding to a variable temperature shown in FIG. 13).

A second graph 1430 shows capacity fade profiles for the degradation mechanisms for the $C_1/1$ rate. Lines 1432 and 1434 show the capacity fade profile related to the loss of Li+ over time from the baseline matrix and the matrix created from the arbitrary aging condition (from the simulation of FIG. 13). Lines 1436, 1438 show the capacity fade profiles related to the loss of active sites θ from the two matrices. Lines 1440, 1442 show the total capacity fade profile (e.g., combination of the loss of Li+ and active sites) from the two matrices. In particular, lines 1432, 1436, and 1440 correspond to the capacity fade profiles according to the baseline matrix created (e.g., corresponding to a constant temperature of 25° C. over time), while lines 1434, 1438, and 1442 correspond to the capacity fade profiles of the arbitrary aging condition (i*) matrix (e.g., corresponding to a variable temperature shown in FIG. 13).

Figure 15:
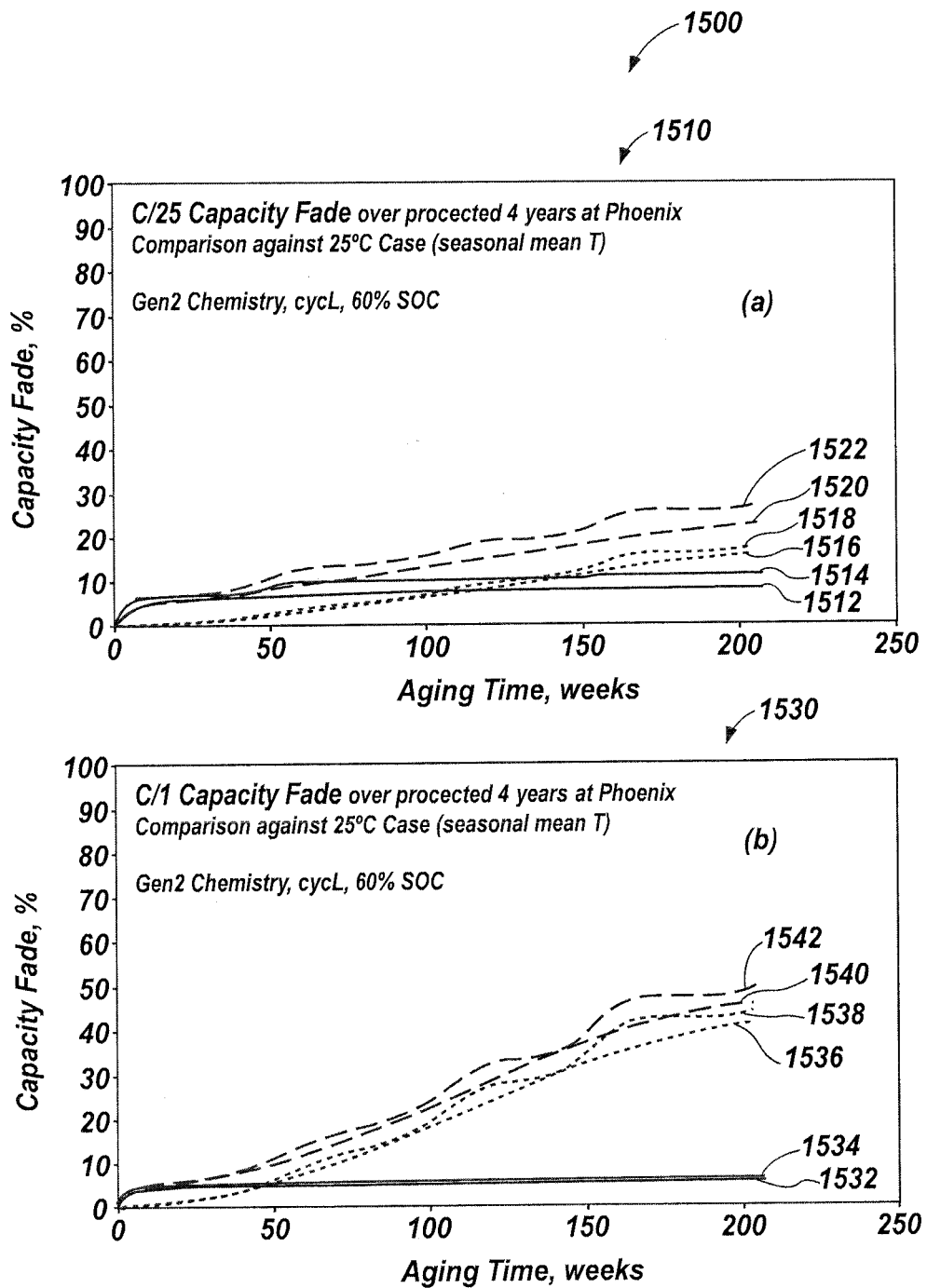
FIG. 15 is a set of graphs that show the capacity fade profiles for a $C_1/25$ rate and a $C_1/1$ rate under cycle-life conditions.

FIG. 15 is a set of graphs 1500 that show the capacity fade profiles for a $C_1/25$ rate and a $C_1/1$ rate under cycle-life conditions, as the battery is exposed to the aging conditions of a Gen2 chemistry, calendar-life, 60% SOC, and different temperature profiles. A first graph 1510 shows capacity fade profiles for degradation mechanisms for the $C_1/25$ rate. Lines 1512 and 1514 show the capacity fade profile related to the loss of Li+ over time from a baseline matrix and a matrix created from the arbitrary aging condition (from the simulation of FIG. 13). Lines 1516, 1518 show the capacity fade profiles related to the loss of active sites θ from the two matrices. Lines 1520, 1522 show the total capacity fade profile (e.g., combination of the loss of Li+ and active sites) from the two matrices. In particular, lines 1512, 1516, and 1520 correspond to the capacity fade profiles of the baseline matrix created (e.g., corresponding to a constant temperature of 25° C. over time), while lines 1514, 1518, and 1522 correspond to the capacity fade profiles of the arbitrary aging condition (i*) matrix (e.g., corresponding to a variable temperature of FIG. 13).

A second graph 1530 shows capacity fade profiles for the degradation mechanisms for the $C_1/1$ rate. Lines 1532 and 1534 show the capacity fade profile related to the loss of Li+ over time from a baseline matrix and a matrix created from the arbitrary aging condition (from the simulation of FIG. 13). Lines 1536, 1538 show the capacity fade profiles related to the loss of active sites θ from the two matrices. Lines 1540, 1542 show the total capacity fade profile (e.g., combination of the loss of Li+ and active sites) from the two matrices. In particular, lines 1532, 1536, and 1540 correspond to the capacity fade profiles according to the baseline matrix created (e.g., corresponding to a constant temperature of 25° C. over time), while lines 1534, 1538, and 1542 correspond to the capacity fade profiles of the arbitrary aging condition (i*) matrix (e.g., corresponding to a variable temperature of FIG. 13).

The results for capacity fade from the case study, as shown in FIGS. 14 and 15 show that there may be a temperature path dependence to battery aging. Most conditions under variable temperature show that the rate of aging exceeds that of the mean or baseline condition of 25° C. Therefore, merely using average temperatures to assess prolonged aging tied to real conditions may be insufficient to determine an accurate estimate of aging. The data in FIGS. 14 and 15 also indicate that aging rates may increase over warmer months and diminish (e.g., plateau) during cooler months. This plateau-type behavior may occur when the thermodynamic extent of reaction reached at a higher temperature is in excess of that attainable under a lower temperature. Because the calendar-life condition may predominate under most usage scenarios (e.g., most customers drive round-trip per day at two-hour total duration), the aging rates seen in FIG. 14 may be more applicable for HEV/PHEV battery packs in such locations. An actual aging rate may further be determined as a weighted average of cycle and calendar-life conditions.

Figure 16:
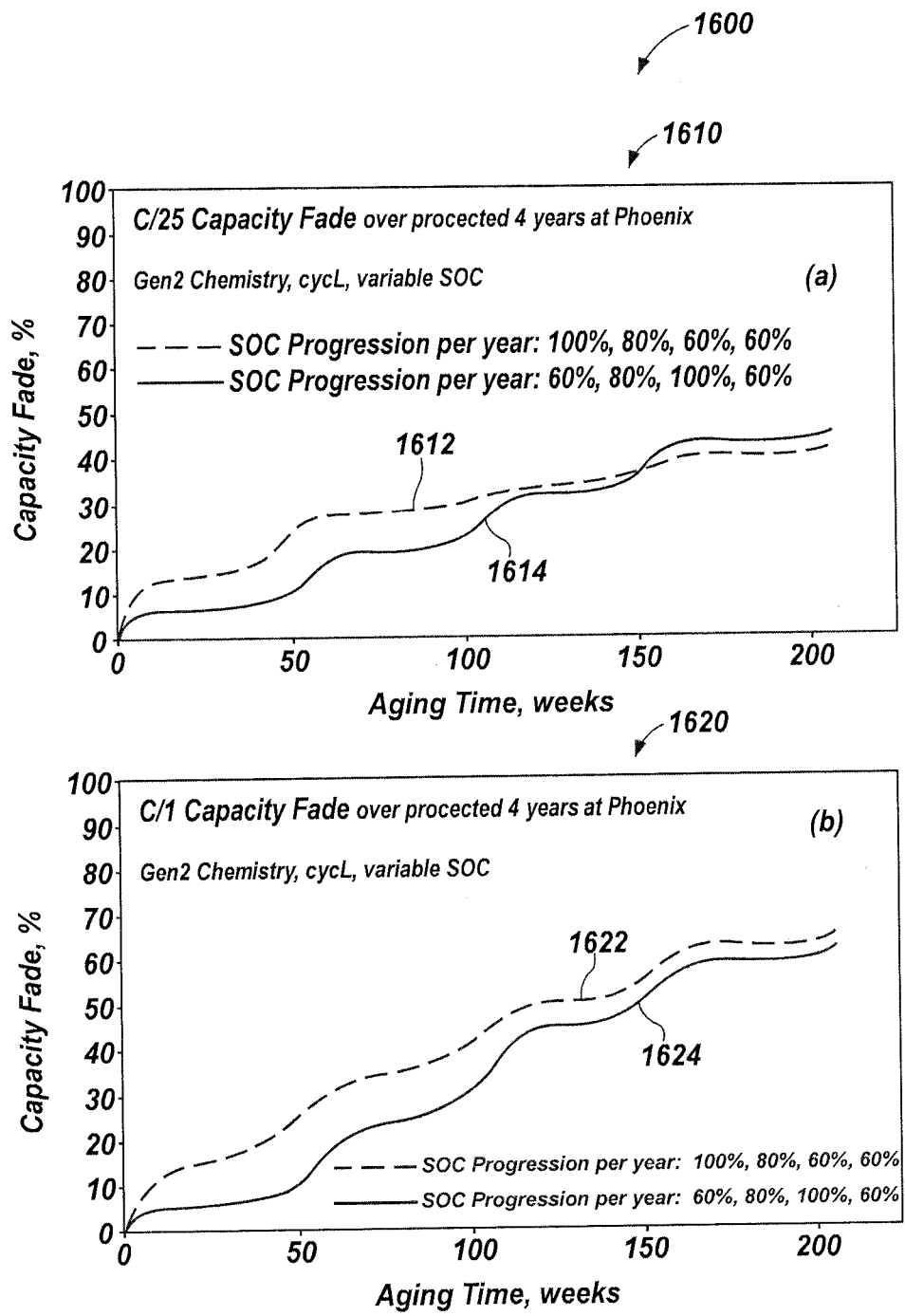
FIG. 16 is a set of graphs that show the total capacity fade profiles for a $C_1/25$ rate and a $C_1/1$ rate.

FIG. 16 is a set of graphs 1600 that show the total capacity fade profiles for a $C_1/25$ rate and a $C_1/1$ rate, as the battery is exposed to the aging conditions of a Gen2 chemistry, cycle-life usage condition, a seasonal temperature profile, and a variable battery SOC over time. The capacity fade profiles shown in FIG. 16 may be viewed as the total cumulative capacity fade for the individual degradation mechanisms as opposed to having them isolated as was shown in FIGS. 14 and 15.

A first graph 1610 shows the capacity fade profiles for the $C_1/25$ rate, and a second graph 1620 shows the capacity fade profiles for the $C_1/1$ rate. Such scenarios may be in place if the battery is required to meet various power goals during its service life, wherein commensurate voltages (i.e., SOCs) would need to be maintained. Lines 1612, 1622 show the capacity fade profiles for a first scenario, in which the SOC values are 100%, 80%, 60%, and 60% for years one through four, respectively. Lines 1614, 1624 show the capacity fade profiles for a second scenario, in which the SOC values are 60%, 80%, 100%, and 60% for years one through four, respectively. Thus, in each scenario, the same capacity fade profiles are used, but in a different sequence. As shown in FIG. 16, there may be an aging path dependence associated with the aging condition of SOC. For example, the capacity fade profiles for lines 1612, 1614 do not end at the same level after the four year simulation even though the same aging conditions were applied (but in a different sequence). Similarly, the capacity fade profiles for lines 1622, 1624 do not end at the same level after the four year simulation. In addition, it should be noted that the first scenario (e.g., 100%, 80%, 60%, 60%) resulted in the more desirable path (i.e., less capacity fade) for the $C_1/25$ rate, but not the $C_1/1$ rate.

Figure 17:
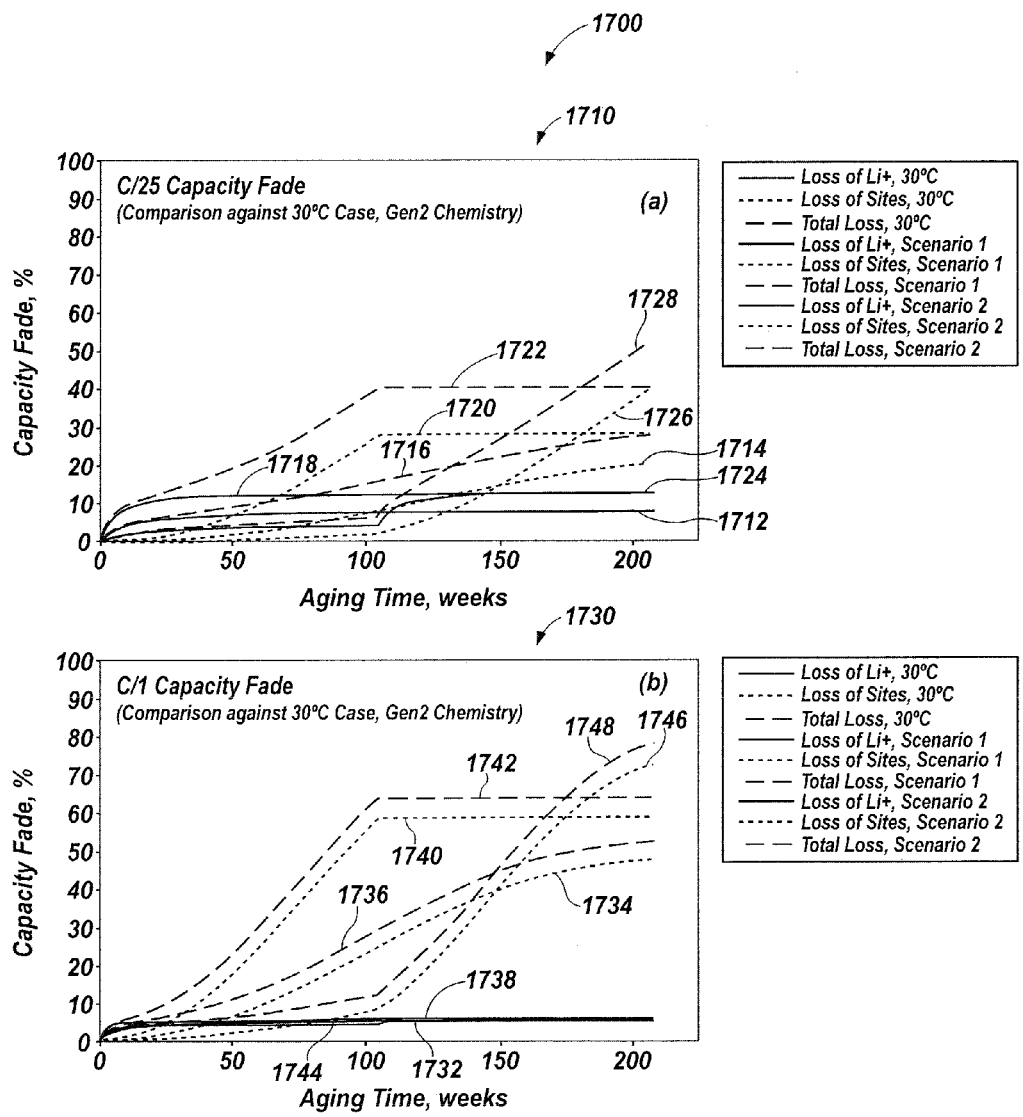
FIGS. 17, 18, and 19 are sets of graphs showing the results of capacity fade profiles associated with another case study and demonstration.
Figure 18:
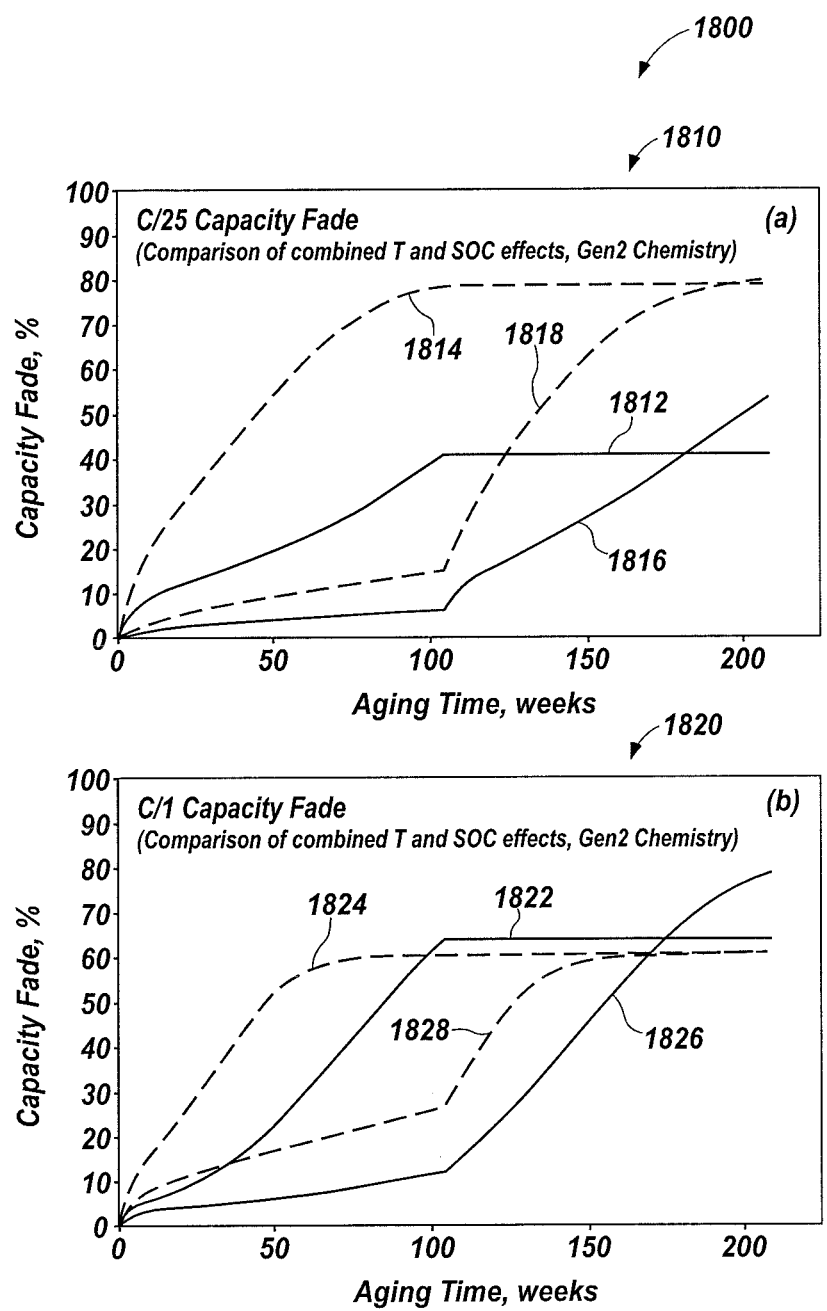
Figure 19:
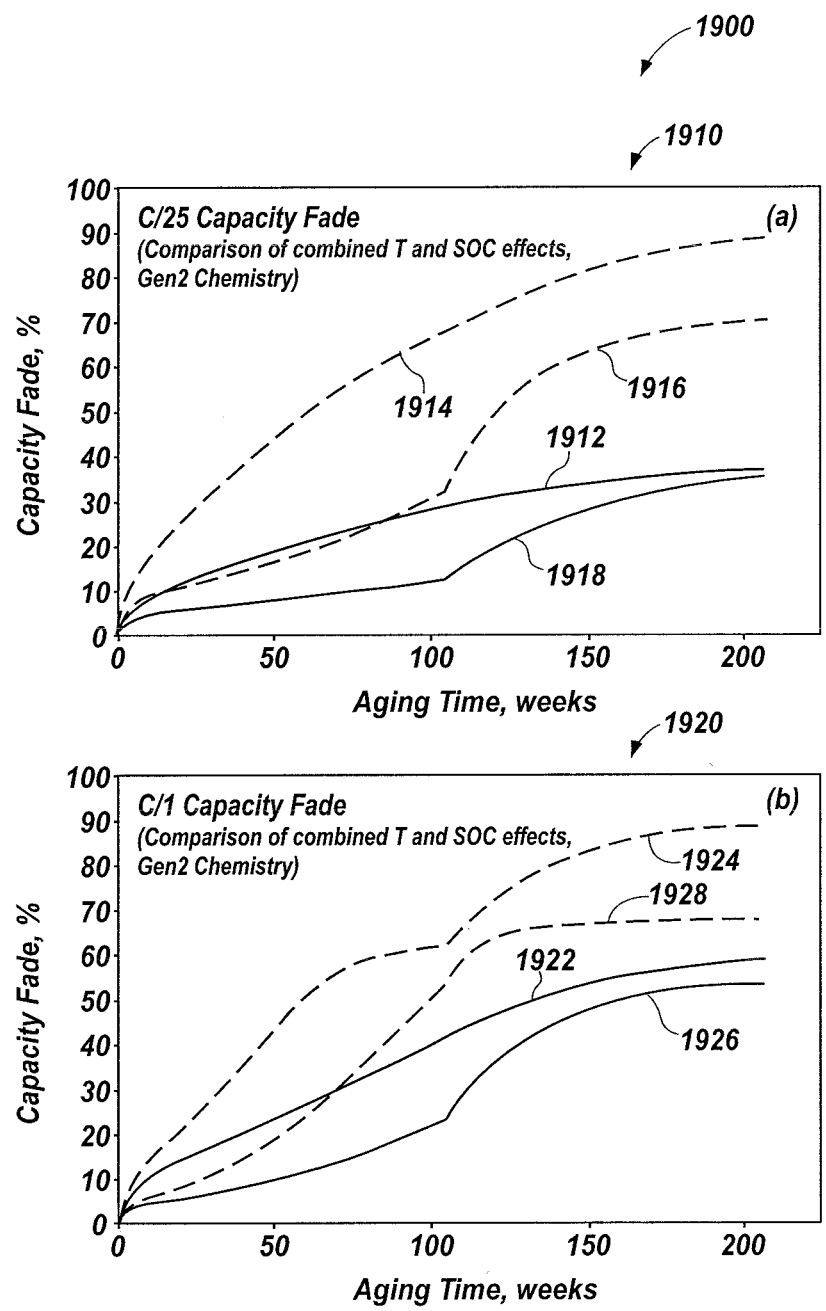

FIGS. 17, 18, and 19 are results associated with another case study and demonstration, in which the temperature and SOC values are again used within the Gen2 lithium-ion cell context, but in terms of simpler combinations and total number of conditions over the timeline. In the simulation associated with FIGS. 17, 18, and 19, the batteries had experienced the same cumulative aging conditions (i) over time; however, different combinations and sequences were used. In each simulation, cycle-life conditions were assumed.

FIG. 17 is a set of graphs 1700 that shows the capacity fade profiles of another case study demonstration having a variable temperature. A first graph 1710 shows the results for a C/25 rate. Lines 1712, 1714, and 1716 represent the results of a baseline scenario of 30° C. throughout the simulation period. In particular, line 1712 shows the loss of Li+, line 1714 shows the loss of active sites θ, and line 1716 shows the total capacity fade for the baseline scenario. Lines 1718, 1720, 1722 represent the results of scenario 1 of 50° C. for 104 weeks, and then 10° C. for 104 weeks. In particular, line 1718 shows the loss of Li+, line 1720 shows the loss of active sites θ, and line 1722 shows the total capacity fade for the baseline scenario. Lines 1724, 1726, 1728 represent the results of scenario 2 of 10° C. for 104 weeks, and then 50° C. for 104 weeks. In particular, line 1724 shows the loss of Li+, line 1726 shows the loss of active sites θ, and line 1728 shows the total capacity fade for the baseline scenario. A second graph 1730 shows the results for a C/1 rate. Lines 1732, 1734, and 1736 represent the results of a baseline scenario of 30° C. throughout the simulation period. In particular, line 1732 shows the loss of Li+, line 1734 shows the loss of active sites θ, and line 1736 shows the total capacity fade for the baseline scenario. Lines 1738, 1740, 1742 represent the results of scenario 1 of 50° C. for 104 weeks, and then 10° C. for 104 weeks. In particular, line 1738 shows the loss of Li+, line 1740 shows the loss of active sites θ, and line 1742 shows the total capacity fade for the baseline scenario. Lines 1744, 1746, 1748 represent the results of scenario 2 of 10° C. for 104 weeks, and then 50° C. for 104 weeks. In particular, line 1744 shows the loss of Li+, line 1746 shows the loss of active sites θ, and line 1748 shows the total capacity fade for the baseline scenario. FIG. 17 shows that by changing to a higher temperature condition later in the sequence, overall capacity fade may increase compared to the other cases. At the end of four years there may be a substantial path dependence of aging.

FIG. 18 is a set of graphs 1800 that shows the capacity fade profiles for a battery having both variable temperature and SOC aging conditions. A first graph 1810 shows results for a C/25 rate. In particular, lines 1812 and 1814 are the results of scenario 1, in which aging occurs by experiencing 50° C. for 104 weeks and then 10° C. for 104 weeks. Lines 1816 and 1818 are the results of scenario 2, in which aging occurs by experiencing 10° C. for 104 weeks and then 50° C. for 104 weeks. Lines 1812, 1816 represent the battery aging results for 60% SOC, while lines 1814, 1818 represent the battery aging results for 100% SOC. A second graph 1820 shows results for a C/1 rate. In particular, lines 1822 and 1824 are the results of scenario 1, in which aging occurs by experiencing 50° C. for 104 weeks and then 10° C. for 104 weeks. Lines 1826 and 1828 are the results of scenario 2, in which aging occurs by experiencing 10° C. for 104 weeks and then 50° C. for 104 weeks. Lines 1822, 1826 represent the battery aging results for 60% SOC, while lines 1824, 1828 represent the battery aging results for 100% SOC. FIG. 18 shows that aging at 100% SOC may exhibit little or no aging path dependence by the end of four years, while the 60% SOC conditions exhibits greater aging variance after four years.

FIG. 19 is a set of graphs 1900 that shows the capacity fade profiles that demonstrate that the greatest path dependence of aging is seen as the SOC is varied over time at the higher temperature. A first graph 1910 shows results for a C/25 rate. In particular, lines 1912 and 1914 are the results of scenario 1, in which aging occurs by experiencing 100% SOC for 104 weeks and then 60% SOC for 104 weeks. Lines 1916 and 1918 are the results of scenario 2, in which aging occurs by experiencing 60% SOC for 104 weeks and then 100% SOC for 104 weeks. Lines 1912, 1916 represent the battery aging results for 25° C., while lines 1914, 1918 represent the battery aging results for 45° C. A second graph 1920 shows results for a C/1 rate. In particular, lines 1922 and 1924 are the results of scenario 1, in which aging occurs by experiencing 100% SOC for 104 weeks and then 60% SOC for 104 weeks. Lines 1926 and 1928 are the results of scenario 2, in which aging occurs by experiencing 60% SOC for 104 weeks and then 100% SOC for 104 weeks. Lines 1922, 1926 represent the battery aging results for 25° C., while lines 1924, 1928 represent the battery aging results for 45° C. The level of path dependence in may serve as a basis for proper management of charging levels to those just needed to meet the energy and power demands. In this case, the Gen2 cells may age less if they start their service life operating at a lower SOC.

FIG. 20 is a set of graphs 2000 that shows capacity loss curves over time as a result of varying maximum temperature ($T_{MAX}$) of the battery. A first graph 2010 shows predicted results of capacity loss for a Gen2 battery for a C/25 rate. In particular, line 2012 shows the combination of a maximum temperature and a corresponding aging time (in number of weeks) that are predicted for a battery to experience a 10% capacity loss. Lines 2014, 2016, 2018 show predicted results for a maximum temperature and aging time that may achieve 20%, 30%, and 40% capacity loss, respectively. In other words, each of the lines 2014, 2016, 2018 show the combination of the maximum temperature and aging time that are predicted for a battery to experience a respective 20%, 30%, 40% capacity loss, respectively. Lines 2022, 2024, 2026, 2028 in the second graph 2020 show the results for the C/1 rate. As a result, these examples show predictions resulting from the summation of two degradation mechanisms (e.g., maximum temperature, and time).

As is apparent from FIG. 20, a lower maximum temperature results in less capacity loss and prolonged battery life. Also, the time to reach low levels of capacity loss (e.g., less than 20%) may be relatively invariant to the maximum temperature ($T_{MAX}$) and may be governed by loss of lithium inventory (LLI). The time to reach higher levels of capacity loss may be more variant to the maximum temperature ($T_{MAX}$). As a result, thermal management of a battery may be more effective past the LLI stage where capacity is lost more to loss of active host materials. Cell polarization effects may influence the results from a C/1 rate, as compared to the C/25 rate, effectively making capacity loss from the C1 rate less variant over temperature, as compared with the behavior from the C/25 rate. Such results may be useful for designing thermal management systems, considering life trends in relation to the geographic location and anticipated usage. Toward thermal management, there may be a trade-off between the gain in battery life versus the extra expense in making the thermal management system more robust.

Figure 21:
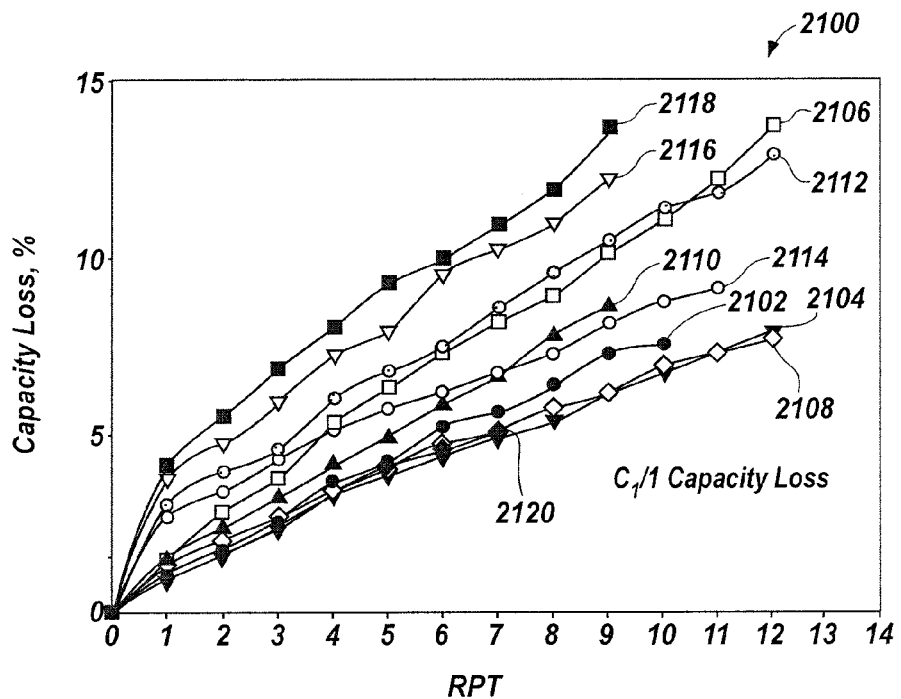
FIGS. 21 and 22 show graphs illustrating conditions of a battery experiencing daily thermal cycling (DTC)
Figure 22:
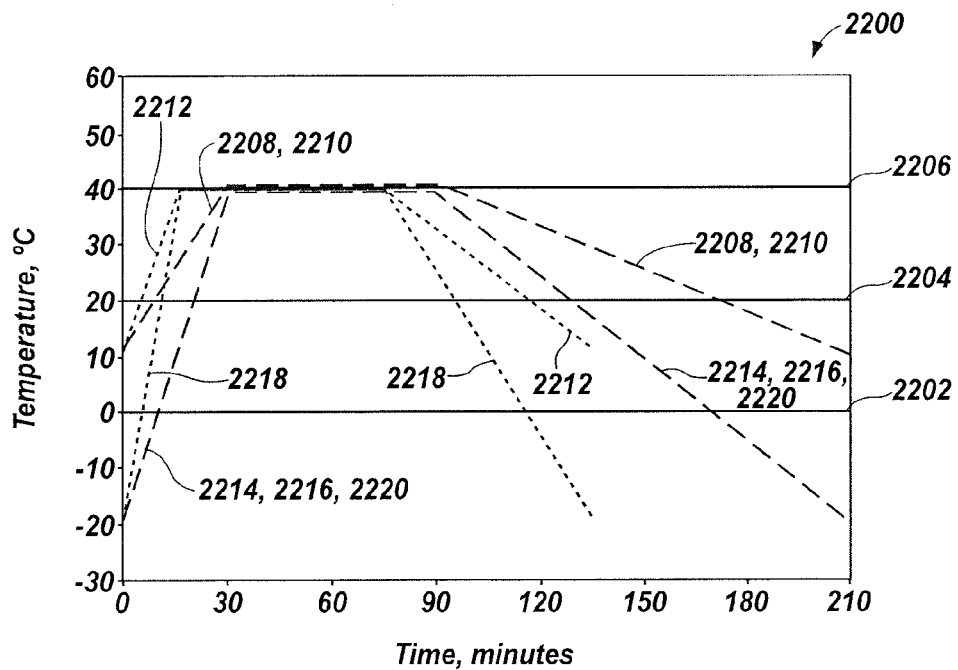

FIGS. 21 and 22 show graphs 2100, 2200 illustrating conditions of a battery experiencing daily thermal cycling (DTC). DTC may contribute to battery aging, which may shorten battery life. Aging related to DTC conditions may be rooted in an increased mechanical stress of electrode materials under combined thermal and electrochemical gradients. Larger local stress over the spatial and time domains can result in particle break-up and separation, leading to further SEI formation, which may result in accelerated capacity loss and a rise in impedance. DTC effects may be more acute for cold-climate locations. As a result, it may be desirable for thermal management schemes to cover both cooling batteries at elevated temperatures and warming batteries under cold-start conditions.

In FIG. 21, capacity loss data is shown for a battery having C/1 discharge rate, for daily thermal cycling according to various DTC test conditions. In FIG. 22, the various DTC test conditions are shown. The test conditions are further described in Table 4 below. In Table 4, the corresponding lines to FIGS. 21 and 22 are shown for each test condition.

TABLE 4

Test Conditions for Daily Thermal Cycling for FIGS. 21 and 22

| Test Condition | Thermal Cycling Regime | Duty Cycle Frequency |
| --- | --- | --- |
| 1 (Lines 2102, 2202) | Isothermal, 0° C. | Continuous |
| 2 (Lines 2104, 2204) | Isothermal, 20° C. | Continuous |
| 3 (Lines 2106, 2206) | Isothermal, 40° C. | Continuous |
| 4 (Lines 2108, 2208) | Mild, 10° C. to 40° C. in 30 min. | 1 Round Trip/Day |
| 5 (Lines 2110, 2210) | Mild, 10° C. to 40° C. in 30 min. | Continuous |
| 6 (Lines 2112, 2212) | Mild, 10° C. to 40° C. in 15 min. | Continuous |
| 7 (Lines 2114, 2214) | Severe, −20° C. to 40° C. in 30 min. | 1 Round Trip/Day |
| 8 (Lines 2116, 2216) | Severe, −20° C. to 40° C. in 30 min. | Continuous |
| 9 (Lines 2118, 2218) | Severe, −20° C. to 40° C. in 15 min. | Continuous |
| 10 (Lines 2120, 2220) | Severe, −20° C. to 40° C. in 30 min. | None (calL) |

The battery chemistry used in this example, tends to show a relatively strong sensitivity to DTC, with the capacity loss resulting from some of the test conditions more than doubling compared with the isothermal baseline condition at 20° C. DTC effects on capacity loss may also be more evident for those cells actively undergoing duty cycles. In contrast, cells under calendar-life conditions (no electrochemical cycling) and thermal cycling experience slower aging (Condition 10).

Based on the observed sensitivity to DTC in the battery used in this example, the sensitivity of aging to DTC for a Gen2 lithium ion cell may be translated using the MSM formalism described herein. In particular, DTC may be assigned as another independent stress factor under an arbitrary aging condition (i*) and the MSM parameters for the arbitrary aging conditions (i*) may be determined as discussed above. For example, this may include including a term:

$$\left(\frac{\partial \Psi_j}{\partial DTC} dDTC\right)_{SOC, T, cyc}$$

in equation (5) and similar expressions written for the MSM parameters under the deviation-from-baseline approach described above.

Figure 23:
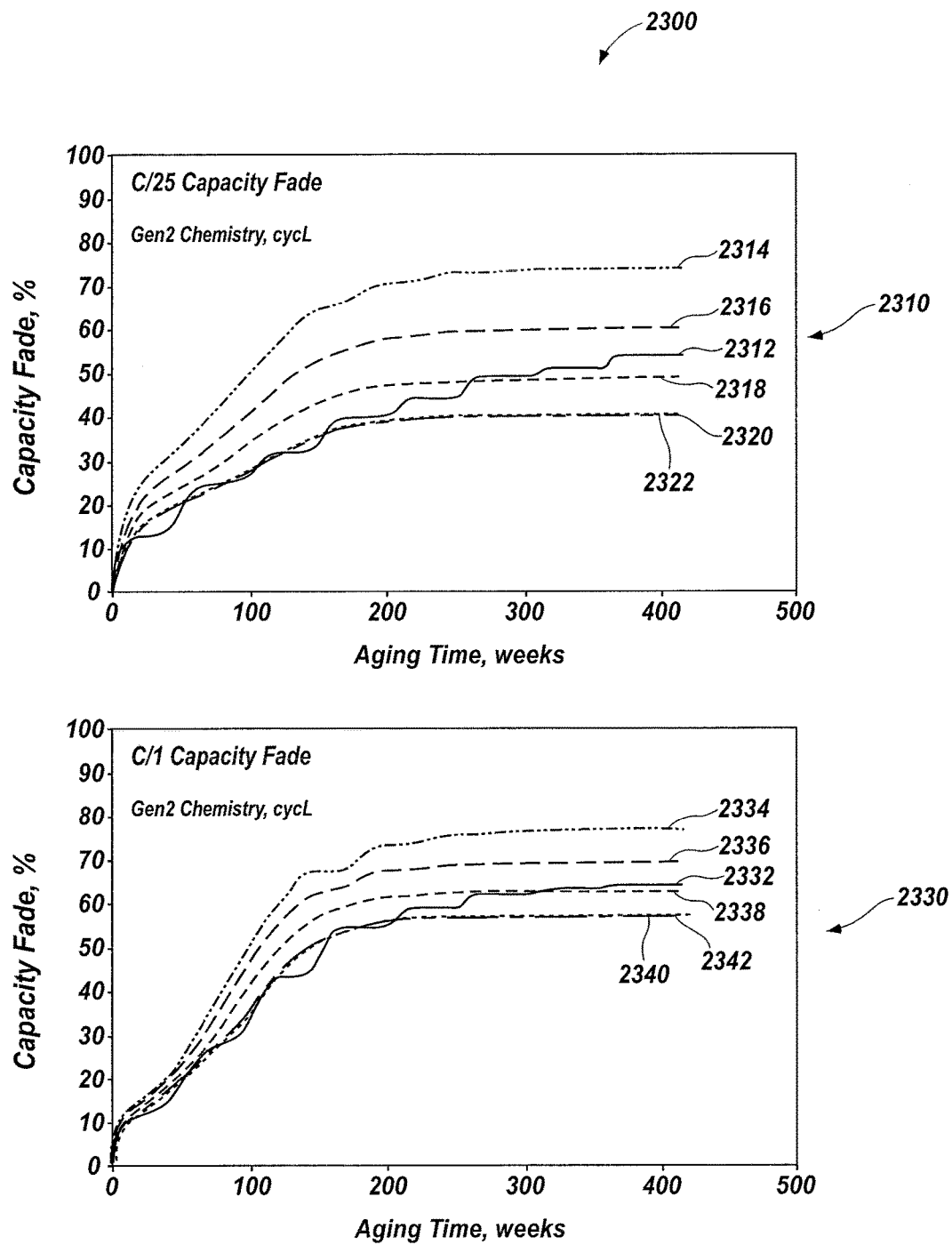
FIG. 23 is a set of graphs illustrating capacity fade of a battery over an aging time according to various simulations.

FIG. 23 is a set of graphs 2300 illustrating capacity fade of a battery over an aging time according to various simulations. In particular, a first graph 2310 shows capacity fade for a C/25 discharge rate. A second graph 2330 shows capacity fade for a C/1 discharge rate. The following conditions were assigned for the computer simulations: DTC was varied per the monthly average temperatures in Phoenix, Ariz. (see FIG. 13); ambient temperature ramping=4° C./minute; and $T_{max}$ represents the normal operating temperature achieved following DTC, which was varied under presumed thermal management scenarios, ranging from 45° C. to 30° C. It was also assumed that $T_{max}$ would be at least 30° C., due to factors such as typical warming of cells under usage (joule heating effect) and the need to have battery cells operate at a temperature high enough to promote efficient duty cycling. Additional conditions assigned for the computer simulation included: continuous duty and thermal cycling for most of each day (e.g., four to six complete cycles per day over approximately 18 hours); cells cycled from 80% SOC; and a simulation spanned eight years. The specific simulation conditions are shown below in Table 5.

TABLE 5

Simulation Conditions for FIG. 23

| Simulation Condition | Description |
| --- | --- |
| 1 (Lines 2312, 2332) | No DTC, $T_{MAX}$ = 45° C. |
| 2 (Lines 2314, 2334) | With DTC, $T_{MAX}$ = 45° C. |
| 3 (Lines 2316, 2336) | With DTC, $T_{MAX}$ = 40° C. |
| 4 (Lines 2318, 2338) | With DTC, $T_{MAX}$ = 35° C. |
| 5 (Lines 2320, 2340) | With DTC, $T_{MAX}$ = 30° C. |
| 6 (Lines 2322, 2342) | With DTC, $T_{MAX}$ = 30° C., $T_{MIN}$ = 15° C. |

As apparent from FIG. 23, DTC may have a substantial impact on accelerating capacity loss for Gen2 if little or no thermal management is employed. If TM is employed to reduce the maximum temperature ($T_{MAX}$), such as by 15 degrees (e.g., 45° C. to 30° C.), the net capacity loss at extended time may decrease by nearly half (for C/25 rate) or nearly a third (for C/1 rate) compared to the case with the maximum temperature ($T_{max}$) remaining at 45° C. For shorter timeframes (e.g., less than 100 weeks) the relative capacity losses may increase further. Thus, the embodiments of the disclosure disclosed herein may assist thermal management design by enabling a scientific basis for correlating DTC with aging trends as the upper bound of DTC is parameterized. The embodiments of the disclosure may further support a rational evaluation of the trade-off between the gain in battery life versus the extra expense in making the thermal management system more robust, while avoiding costly overdesign.

CONCLUSION

Embodiments of the present disclosure include a method for characterizing performance loss of an object undergoing an arbitrary aging condition. The method comprises collecting baseline aging data from an object having an aging profile for at least one known baseline aging condition over time, determining baseline multiple sigmoid model parameters from the baseline data, and determining performance loss data of the object over time through multiple sigmoid model parameters associated with the object undergoing at least one arbitrary aging condition having an unknown consequence over time using a differential deviation-from-baseline approach from the baseline multiple sigmoid model parameters.

Another embodiment includes a system for determining performance characteristics of an object. The system comprises an object having an aging profile, monitoring hardware configured to sample performance characteristics of the object, and a processor coupled to the monitoring hardware. The processor is configured to determine performance loss data for an arbitrary aging condition having an unknown consequence from a comparison of the performance characteristics of the object deviating from baseline performance characteristics associated with a baseline aging condition.

Another embodiment includes a computer-readable medium. The computer-readable medium may include computer-executable instructions, which when executed on one or more processors, perform a method. The method comprises generating aging characteristics for an object imposed upon by an arbitrary aging condition having unknown consequences, and predicting future performance loss of the object based upon deviations of the aging characteristics of the object imposed upon by the arbitrary aging condition and baseline aging characteristics associated with a baseline aging condition.

While the disclosure is susceptible to various modifications and implementation in alternative forms, specific embodiments have been shown by way of non-limiting example in the drawings and have been described in detail herein. However, it should be understood that the invention is not intended to be limited to the particular forms disclosed. Rather, the invention includes all modifications, equivalents, and alternatives falling within the scope of the invention as defined by the following appended claims and their legal equivalents.

What is claimed is:

1. A method for characterizing performance loss of a battery or battery cell undergoing at least one arbitrary aging condition, the method comprising:
    loading, with a processor, known baseline aging data for a battery or battery cell having an aging profile for at least one known baseline aging condition over time;
    determining, with the processor, baseline rate expression model parameters from the baseline aging data for the battery or battery cell;
    receiving, at the processor, additional aging data associated with the battery or battery cell undergoing different arbitrary aging conditions over successive time periods, each of the different arbitrary aging conditions having an unknown consequence that differs from the at least one known baseline aging condition used for the known baseline aging data;
    determining, with the processor, rate expression model parameters for each of the different arbitrary aging conditions and related time interval within the additional aging data;
    determining, with the processor, previously unknown performance loss due to aging of the battery or battery cell over time utilizing the rate expression model parameters associated with the battery or battery cell undergoing the different arbitrary aging conditions using a differential deviation-from-baseline approach from the baseline rate expression model parameters;
    predicting an aging progression based on the determined previously unknown performance loss; and
    controlling operation of the battery or battery cell dynamically in real time responsive to the predicted aging progression.

2. The method of claim 1, wherein determining performance loss due to aging of the battery or battery cell over time includes determining the rate expression model parameters associated with the battery or battery cell undergoing the different arbitrary aging conditions through performing a computer simulation of the battery or battery cell undergoing the different arbitrary aging conditions.

3. The method of claim 2, wherein performing the computer simulation of the battery or battery cell undergoing the different arbitrary aging conditions includes performing a plurality of computer simulations, each computer simulation having common time periods with different arbitrary aging conditions.

4. The method of claim 3, wherein the different arbitrary aging conditions include at least one different aging path over time.

5. The method of claim 3, wherein the different arbitrary aging conditions include at least one different thermal management parameter for the battery or battery cell.

6. The method of claim 1, wherein determining the rate expression model parameters includes performing a regression analysis through multiple sigmoid model rate expressions to establish sensitivity of multiple sigmoid model parameters to a plurality of baseline aging conditions.

7. The method of claim 1, wherein using a differential deviation-from-baseline approach from the baseline rate expression model parameters includes adapting each of the rate expression model parameters associated with each different arbitrary aging condition within each distinct aging period for a plurality of degradation mechanisms over a plurality of unique aging periods, wherein the rate expression model parameters are variable over the plurality of unique aging periods.

8. The method of claim 1, further comprising selecting, with the processor, the at least one known baseline aging condition to include at least one of a known temperature, a cycling rate, state of charge, and a condition of daily thermal cycling for a battery or battery cell.

9. The method of claim 1, further comprising loading the baseline rate expression model parameters onboard a monitoring and control system associated with the battery or battery cell.

10. The method of claim 1, wherein performance loss includes at least one of a capacity loss, a conductance loss, and a power loss of a battery.

11. The method of claim 10, wherein each of the capacity loss, the conductance loss, and the power loss of a battery or battery cell is defined in terms of fractional or percent reduction or remaining in each metric from a reference value.

12. The method of claim 10, wherein performance loss includes at least the capacity loss, and the capacity loss includes at least one of a loss of active host sites and a loss of free lithium ions in a lithium-ion battery or battery cell.

13. The method of claim 1, wherein determining performance loss of the battery or battery cell further includes identifying the performance loss crossing a predetermined threshold indicating potential for critical failure of a battery or battery cell.

14. The method of claim 1, wherein determining previously unknown performance loss of the battery or battery cell over time includes determining previously unknown chronological path-dependent performance loss of the battery or battery cell over a succession of selected time periods.

15. The method of claim 14, wherein the selected time periods have different lengths.

16. The method of claim 1, wherein controlling the operation of the battery or battery cell includes at least one of adjusting a temperature or pressure around the battery or battery cell, adjusting a voltage output of the battery or battery cell, adjusting a power supplied to a load of the battery or battery cell, adjusting a state of charge level, and adjusting an operating condition of the load.

17. A system for determining performance characteristics of a battery or battery cell, the system comprising:
a battery or battery cell having an aging profile;
monitoring hardware configured to sample aging-dependent performance characteristics of the battery or battery cell; and
a processor coupled to the monitoring hardware, and configured to:
determine unknown performance loss for different arbitrary aging conditions over different successive time intervals, the different arbitrary aging conditions having unknown consequences, from a comparison of the performance characteristics of the battery or battery cell deviating from baseline performance characteristics associated with a baseline aging condition, wherein the different arbitrary aging conditions are different from the baseline aging condition associated with the baseline performance characteristics;
predict an aging progression based on the determined previously unknown performance loss; and
control operation of the battery or battery cell dynamically in real time responsive to the predicted aging progression.

18. The system of claim 17, wherein the battery or battery cell includes at least one electrochemical cell, and wherein the monitoring hardware includes at least one of a temperature sensor, a voltage sensor, and a current sensor configured to monitor the at least one electrochemical cell over time.

19. The system of claim 17, further comprising a memory operably coupled on-board with the processor, wherein the baseline performance characteristics associated with the baseline aging condition are stored in the memory.

20. The system of claim 17, wherein the sampled performance characteristics are represented as multiple sigmoid model rate expressions and their parameters, wherein each multiple sigmoid model rate expression covers an aging mechanism within each distinct aging condition over time.

21. The system of claim 17, wherein the processor is further configured to perform thermodynamic analysis on the sampled performance characteristics.

22. The system of claim 21, wherein the thermodynamic analysis includes determining at least one of a Gibbs free energy, an equilibrium constant, and activation energy for the sampled performance characteristics over each unique aging period as well as cumulatively over a plurality of unique aging periods.

23. The system of claim 17, wherein the processor is configured to control operation of the battery or battery cell by performing an action selected from the group consisting of adjusting a temperature or pressure around the battery or battery cell, adjusting a voltage output of the battery or battery cell, adjusting a power supplied to a load of the battery or battery cell, adjusting a state of charge level, and adjusting an operating condition of the load.

24. A non-transitory computer-readable medium including computer-executable instructions, which when executed on one or more processors, perform a method, the method comprising:
generating aging characteristics for a battery or battery cell imposed upon by different arbitrary aging conditions having unknown consequences over a plurality of different successive time intervals;
predicting future unknown performance loss of the battery or battery cell based upon deviations of the aging characteristics of the battery or battery cell imposed upon by the arbitrary aging condition and baseline aging characteristics associated with a baseline aging condition, wherein the arbitrary aging condition is different from the baseline aging condition associated with the baseline aging characteristics;
predicting an aging progression based on the determined previously unknown performance loss; and
control operation of the battery or battery cell dynamically in real time responsive to the predicted aging progression.

25. The non-transitory computer-readable medium of claim 24, wherein predicting future unknown performance loss of the battery or battery cell includes obtaining the aging characteristics of the battery or battery cell imposed upon by the different arbitrary aging conditions from simulating in a computer the arbitrary baseline aging condition being imposed upon the battery or battery cell.

26. The non-transitory computer-readable medium of claim 24, wherein predicting future unknown performance loss of the battery or battery cell includes obtaining the aging characteristics of the battery or battery cell imposed upon by the different arbitrary aging conditions from physical measurements of the battery or battery cell imposed upon by the arbitrary aging condition.

27. The non-transitory computer-readable medium of claim 24, wherein the executed method further includes modifying operation of a temperature management system of the battery or battery cell in response to predicting the future unknown performance loss of the battery or battery cell.

28. The non-transitory computer-readable medium of claim 24, wherein the baseline aging characteristics are associated with a similarly-configured battery or battery cell as the battery or battery cell imposed upon by the arbitrary aging condition.

29. The non-transitory computer-readable medium of claim 24, wherein the baseline aging characteristics include multiple sigmoid model rate expressions and their parameters.

* * * * *

UNITED STATES PATENT AND TRADEMARK OFFICE
CERTIFICATE OF CORRECTION

PATENT NO.        : 9,625,532 B2
APPLICATION NO.   : 13/598290
DATED             : April 18, 2017
INVENTOR(S)       : Kevin L. Gering It is certified that error appears in the above-identified patent and that said Letters Patent is hereby corrected as shown below:

In the Specification

| | | |
|---|---|---|
| Column 14, | Line 47, | change "perform lance loss" to --performance loss-- |
| Column 24, | Line 33, | change "to ensure 'a'" to --to ensure "a"-- |
| Column 35, | Line 14, | change "A miming average" to --A running average-- |

Signed and Sealed this
Twenty-sixth Day of December, 2017

Joseph Matal
*Performing the Functions and Duties of the*
*Under Secretary of Commerce for Intellectual Property and*
*Director of the United States Patent and Trademark Office*